United States Patent
Kobayashi et al.

(10) Patent No.: US 8,420,462 B2
(45) Date of Patent: Apr. 16, 2013

(54) DISPLAY DEVICE AND MANUFACTURING METHOD THEREOF

(75) Inventors: Satoshi Kobayashi, Kanagawa (JP); Ikuko Kawamata, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 361 days.

(21) Appl. No.: 12/842,067

(22) Filed: Jul. 23, 2010

(65) Prior Publication Data

US 2010/0304515 A1    Dec. 2, 2010

Related U.S. Application Data

(62) Division of application No. 12/201,130, filed on Aug. 29, 2008, now Pat. No. 7,791,075.

(30) Foreign Application Priority Data

Sep. 7, 2007  (JP) .................................. 2007-232667

(51) Int. Cl.
*H01L 21/00*    (2006.01)

(52) U.S. Cl.
USPC ............ 438/151; 438/159; 438/162; 438/163

(58) Field of Classification Search ................... 438/152, 438/151, 159, 162, 163
See application file for complete search history.

(56) References Cited

U.S. PATENT DOCUMENTS

| | | |
|---|---|---|
| 4,409,134 A | 10/1983 | Yamazaki |
| 5,084,777 A | 1/1992 | Slobodin |
| 5,453,858 A | 9/1995 | Yamazaki |
| 5,591,987 A | 1/1997 | Yamazaki et al. |
| 5,614,732 A | 3/1997 | Yamazaki |
| 5,648,662 A | 7/1997 | Zhang et al. |

(Continued)

FOREIGN PATENT DOCUMENTS

| | | |
|---|---|---|
| EP | 0 473 988 A1 | 3/1992 |
| JP | 60-098680 | 6/1985 |

(Continued)

OTHER PUBLICATIONS

Lee C et al., "How to Achieve High Mobility Thin Film Transistors by Direct Deposition of Silicon Using 13.56 MHZ RF PECVD?,", IEDM 06; Technical Digest of International Electron Devices Meetingm Dec. 11, 2006, pp. 295-298.

(Continued)

*Primary Examiner* — Long Pham
(74) *Attorney, Agent, or Firm* — Nixon Peabody LLP; Jeffrey L. Costellia

(57) ABSTRACT

A display device including a thin film transistor with high electric characteristics and high reliability, and a method for manufacturing the display device in high yield are proposed. In a display device including a channel stop thin film transistor with an inverted-staggered structure, the channel stop thin film transistor with the inverted-staggered structure includes a microcrystalline semiconductor film including a channel formation region. An impurity region including an impurity element imparting one conductivity type is formed as selected in a region in the channel formation region of the microcrystalline semiconductor film which does not overlap with a source electrode or a drain electrode. In the channel formation region, a non-doped region, to which the impurity element imparting one conductivity type is not added, is formed between the impurity region, which is a doped region to which the impurity element is added, and the source region or the drain region.

15 Claims, 31 Drawing Sheets

U.S. PATENT DOCUMENTS

| | | |
|---|---|---|
| 5,701,167 A | 12/1997 | Yamazaki |
| 5,766,989 A | 6/1998 | Maegawa et al. |
| 5,796,116 A | 8/1998 | Nakata et al. |
| 5,811,328 A | 9/1998 | Zhang et al. |
| 5,849,601 A | 12/1998 | Yamazaki |
| 5,859,445 A | 1/1999 | Yamazaki |
| 6,011,277 A | 1/2000 | Yamazaki |
| 6,023,075 A | 2/2000 | Yamazaki |
| 6,124,155 A | 9/2000 | Zhang et al. |
| 6,166,399 A | 12/2000 | Zhang et al. |
| 6,252,249 B1 | 6/2001 | Yamazaki |
| 6,271,062 B1 | 8/2001 | Nakata et al. |
| 6,281,520 B1 | 8/2001 | Yamazaki |
| 6,306,213 B1 | 10/2001 | Yamazaki |
| 6,335,213 B1 | 1/2002 | Zhang et al. |
| 6,444,506 B1 | 9/2002 | Kusumoto et al. |
| 6,462,723 B1 | 10/2002 | Yamazaki et al. |
| 6,756,258 B2 | 6/2004 | Zhang et al. |
| 6,797,548 B2 | 9/2004 | Zhang et al. |
| 6,847,064 B2 | 1/2005 | Zhang et al. |
| 7,067,844 B2 | 6/2006 | Yamazaki |
| 7,098,479 B1 | 8/2006 | Yamazaki |
| 7,115,902 B1 | 10/2006 | Yamazaki |
| 7,247,529 B2 | 7/2007 | Shoji et al. |
| 7,564,058 B2 | 7/2009 | Yamazaki et al. |
| 7,718,463 B2 | 5/2010 | Yamazaki et al. |
| 7,732,818 B2 | 6/2010 | Maekawa et al. |
| 7,738,050 B2 | 6/2010 | Yamazaki et al. |
| 2002/0008819 A1 | 1/2002 | Yoshida |
| 2004/0137146 A1 | 7/2004 | Tsujimura et al. |
| 2004/0188685 A1 | 9/2004 | Lin et al. |
| 2005/0017243 A1 | 1/2005 | Zhang et al. |
| 2005/0087769 A1 | 4/2005 | Yamazaki et al. |
| 2006/0027804 A1 | 2/2006 | Yamazaki et al. |
| 2006/0046336 A1 | 3/2006 | Shoji et al. |
| 2007/0018165 A1 | 1/2007 | Yamazaki |
| 2008/0044962 A1 | 2/2008 | Zhang et al. |
| 2008/0099826 A1 | 5/2008 | Lai et al. |
| 2008/0105877 A1 | 5/2008 | Yamazaki et al. |
| 2009/0001375 A1 | 1/2009 | Yamazaki et al. |
| 2009/0002591 A1 | 1/2009 | Yamazaki et al. |
| 2009/0011551 A1 | 1/2009 | Yamazaki |
| 2009/0020759 A1 | 1/2009 | Yamazaki |
| 2009/0021664 A1 | 1/2009 | Yamazaki |
| 2009/0039351 A1 | 2/2009 | Kobayashi et al. |
| 2009/0039352 A1 | 2/2009 | Kobayashi et al. |
| 2009/0045401 A1 | 2/2009 | Yamazaki et al. |
| 2009/0047759 A1 | 2/2009 | Yamazaki et al. |
| 2009/0057672 A1 | 3/2009 | Kobayashi et al. |
| 2009/0152553 A1 | 6/2009 | Yoon et al. |
| 2009/0224245 A1 | 9/2009 | Umezaki |
| 2009/0239335 A1 | 9/2009 | Akimoto et al. |
| 2009/0305461 A1 | 12/2009 | Akimoto et al. |

FOREIGN PATENT DOCUMENTS

| | | |
|---|---|---|
| JP | 61-087371 | 5/1986 |
| JP | 04-242724 | 8/1992 |
| JP | 06-045354 | 2/1994 |
| JP | 06-275524 | 9/1994 |
| JP | 08-195492 | 7/1996 |
| JP | 09-186342 | 7/1997 |
| JP | 11-121761 | 4/1999 |
| JP | 2001-007024 | 1/2001 |
| JP | 2001-051292 | 2/2001 |
| JP | 2002-246605 | 8/2002 |
| JP | 2005-049832 | 2/2005 |
| JP | 2005-167051 | 6/2005 |
| JP | 2007-005508 | 1/2007 |
| JP | 2007-035964 | 2/2007 |

OTHER PUBLICATIONS

Lee.C et al., "Directly Deposited Nanocrystalline Silicon Thin-Film Transistors With Ultra High Mobilities,", Appl. Phys. Lett.(Applied Physics Letters), Dec. 18, 2006, vol. 89, No. 25, pp. 252101-1-252101-3.

Lee.C et al., "High-Mobility Nanocrystalline Silicon Thin-Film Transistors Fabricated by Plasma-Enhanced Chemical Vapor Deposition,", App. Phys. Lett.(Applied Physics Letters), May 24, 2005, vol. 86, pp. 222106-1-222106-3.

Lee.C et al., "High-Mobility N-Channel and P-Channel Nanocrystalline Silicon Thin-Film Transistors,", IEDM 05: Technical Digest of International Electron Devices Meeting, 2005. pp. 937-940.

Esmaeili-Rad.M et al., "High Stability, Low Leakage Nanocrystalline Silicon Bottom Gate Thin Film Transistors for Amoled Displays,", IEDM 06: Technical Digest of International Electron Devices Meeting, 2006, pp. 303-306.

Lee.H at al., "Leakage Current Mechanisms in Top-Gate Nanocrystalline Silicon Thin-Film Transistors,", Appl. Phys. Lett. (Applied Physics Letters), Feb. 28, 2008, vol. 98, pp. 083509-1-083509-3.

Esmaeili-Rad.M et al., "Absence of Defect State Creation in Nanocrystalline Silicon Thin-Film Transistors Deduced From Constant Current Stress Measurements,", Appl. Phys. Lett. (Applied Physics Letters), Sep. 12, 2007, vol. 91, No. 11, pp. 113511-1-113511-3.

Lee.C et al., "Stability of NC-SI:H TFTS With Silicon Nitride Gate Dielectric,", IEEE Transactions on Electron Devices, 2007, vol. 54, No. 1, pp. 45-51.

Sazanov.A et al., "Low Temperature Materials and Thin Film Transistors for Flexible Electronics,", Proceedings of the IEEE, Aug. 1, 2005, vol. 93, No. 8, pp. 1420-1428.

Esmaeili-Rad.M et al., "Stability of Nanocrystalline Silicon Bottom-Gate Thin-Film Transistors With Silicon Nitride Gate Dielectric,", J. Appl. Phys. (Journal of Applied Physics), Sep. 28, 2007, vol. 102, No. 6, pp. 064512-1-064512-7.

Lee.C et al., "Top-Gate TFTS Using 13.58MHZ PECVD Microcrystalline Silicon,", IEEE Electron Device Letters, Sep. 5, 2005, vol. 25, No. 9, pp. 637-639.

Lee.C et al., "Postdeposition Thermal Annealing and Material Stability of 75□ Hydrogenated Silicon Plasma-Enhanced Chemical Vapor Deposition Films,", J. Appl. Phys. (Journal of Applied Physics), Aug. 4, 2005, vol. 98, No. 3, pp. 034305-1-034305-7.

Toshiaki Arai, et al., "41.2: Micro Silicon Technology for Active Matrix Oled Display", SID, 2007, Digest, vol. XXXVIII, pp. 1370-1373.

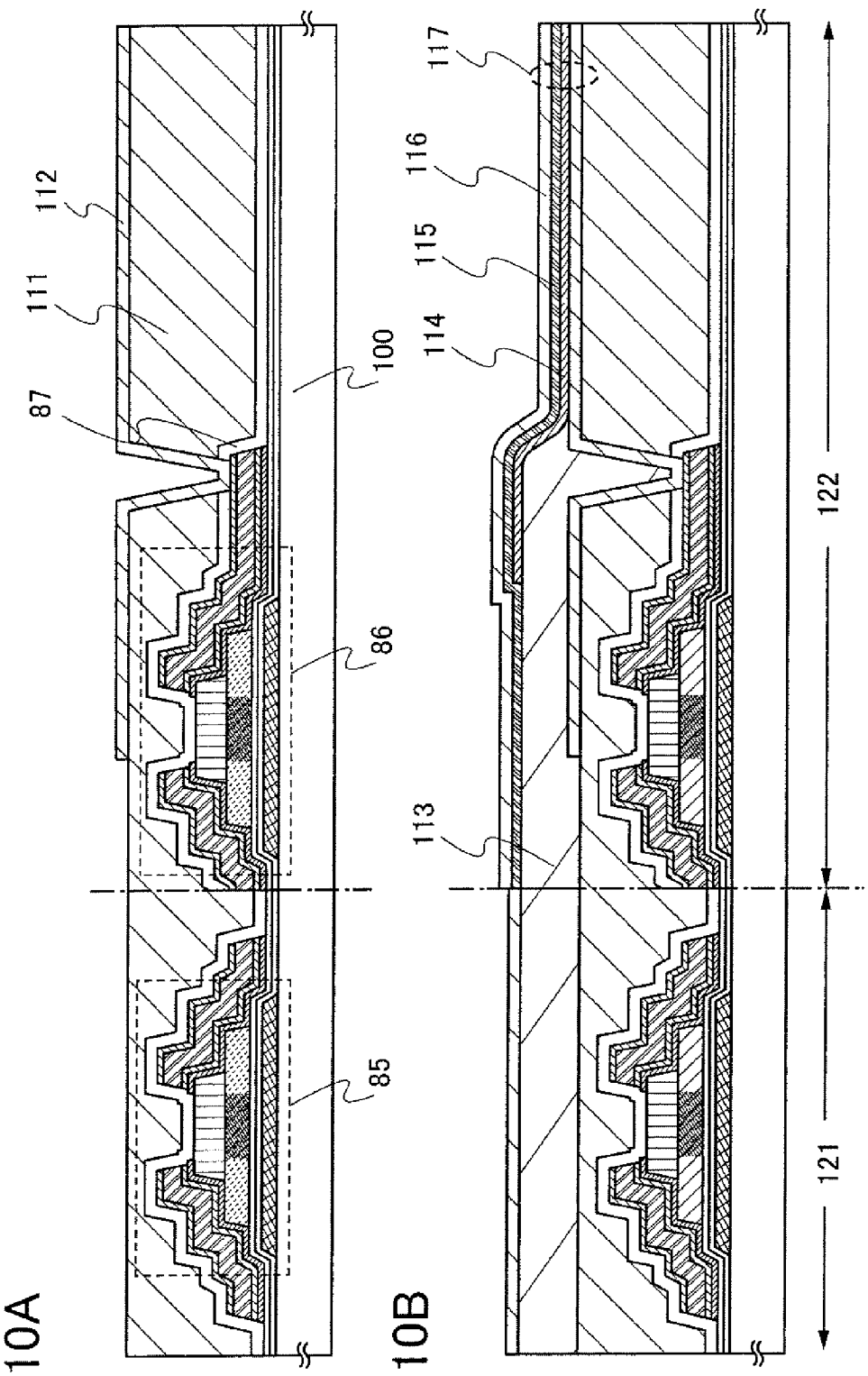

DISPLAY DEVICE AND MANUFACTURING METHOD THEREOF

BACKGROUND OF THE INVENTION

1. Field of the Invention

The present invention relates to a display device in which a thin film transistor is used at least in a pixel portion, and to a method for manufacturing the display device.

2. Description of the Related Art

In recent years, technology for fanning thin film transistors using thin semiconductor films (with thicknesses of from several nanometers to several hundreds of nanometers, approximately) formed over a substrate having an insulating surface has been attracting attention. Thin film transistors are applied to a wide range of electronic devices such as ICs or electro-optical devices, and prompt development of thin film transistors that are to be used as switching elements in image display devices, in particular, is being pushed.

As a switching element in an image display device, a thin film transistor including an amorphous semiconductor film, a thin film transistor including a polycrystalline semiconductor film, or the like is used. As a method for forming a polycrystalline semiconductor film, a technique is known in which a pulsed excimer laser beam is processed into a linear shape with an optical system, and an amorphous semiconductor film is scanned with the linear beam, thereby being crystallized.

As a switching element in an image display device, further, a thin film transistor including a microcrystalline semiconductor film is used (see Reference 1: Japanese Published Patent Application No. H4-242724; and Reference 2: Japanese Published Patent Application No. 2005-49832).

As a method for manufacturing a thin film transistor including a microcrystalline semiconductor film, a method is known in which after forming an amorphous silicon film over a gate insulating film, a metal film is formed thereover, and the metal film is irradiated with diode laser, whereby the amorphous silicon film is changed in quality to be a microcrystalline silicon film (for example, see Reference 3: Toshiaki Arai et al., "SID 07 DIGEST" 2007, pp. 1370-1373). According to this method, the metal film formed over the amorphous silicon film is formed to convert optical energy of the diode laser into thermal energy, and needs to be removed later in order to complete a thin film transistor. That is to say, in the above method, an amorphous semiconductor film is heated only with heat conduction from a metal film, thereby fanning a microcrystalline semiconductor film.

SUMMARY OF THE INVENTION

A thin film transistor including a polycrystalline semiconductor film has advantages that mobility is higher than that of a thin film transistor including an amorphous semiconductor film by two or more orders of magnitude, and a pixel portion and a peripheral driver circuit of a display device can be formed over the same substrate. However, the thin film transistor including a polycrystalline semiconductor film requires a more complicated process than the thin film transistor including an amorphous semiconductor film because of crystallization of the semiconductor film. Thus, there are problems such as a reduction in yield and an increase in cost.

In view of the above problem, it is an object of the present invention to provide a display device including a thin film transistor with high electric characteristics and high reliability.

An aspect of the present invention is a display device including an inverted-staggered (bottom gate) transistor in which a channel protective layer is formed over a microcrystalline semiconductor film (also referred to as a semiamorphous semiconductor film) constituting a channel formation region; in the transistor, an impurity element imparting one conductivity type is included in a region of the channel formation region of the microcrystalline semiconductor film which does not overlap with a source electrode or a drain electrode and overlaps with the channel protective layer, at a lower concentration than in a source region and a drain region. In the channel formation region, a non-doped region, to which the impurity element imparting one conductivity type is not added, is provided between an impurity region, which is a doped region to which the impurity element imparting one conductivity type is added, and the source or drain region.

In a case where interface electric charge has an influence, a threshold voltage of an n-channel transistor, in which electrons serve as carriers, tends to shift to the minus side, and a threshold voltage of a p-channel transistor, in which holes serve as carriers, tends to shift to the plus side. In such a case, the impurity element imparting one conductivity type which is added to the channel formation region in order to control the threshold voltage of the transistor may assume a conductivity type which is opposite to that of the source and drain regions of the transistor. For example, in an n-channel thin film transistor in which a threshold voltage has shifted to the minus side, an impurity element imparting p-type conductivity can be used as the impurity element included in the impurity region formed in the channel formation region; in a p-channel thin film transistor in which a threshold voltage has shifted to the plus side, an impurity element imparting n-type conductivity can be used as the impurity element included in the impurity region formed in the channel formatting region.

An aspect of the present invention is that a channel formation region in a microcrystalline semiconductor film includes a non-doped region, to which an impurity element imparting one conductivity type is not added, between a source or drain region and an impurity region to which the impurity element imparting one conductivity type, which is an opposite conductivity type to that of the source and drain regions, is added.

In an abrupt junction in which an impurity region to which an impurity element imparting a conductivity type opposite to that of source and drain regions is added is in direct contact with the source or drain region, a density of carriers changes abruptly from one property to the other property in a junction portion, and thus a high electric field tends to be formed. Therefore, hot carriers are generated easily.

Consequently, when a non-doped region is formed in a junction portion in order to prevent generation of a high electric field, a change in carrier densities in the junction portion can be gradual and an electric field can be suppressed. Thus, generation of hot carriers can be reduced, thereby preventing characteristic deterioration. The formation of the non-doped region in the junction portion is more effective as the thickness of the microcrystalline semiconductor film is smaller and the channel formation region is minuter (as the channel length is shorter).

An aspect of the present invention is a display device including a transistor. The transistor includes a gate electrode, a gate insulating film over the gate electrode, a microcrystalline semiconductor film including a channel formation region over the gate insulating film, a channel protective layer over and in contact with the channel formation region of the microcrystalline semiconductor film, a source region and a drain region over the microcrystalline semiconductor film and the channel protective layer, and a source electrode over the source region and a drain electrode over the drain region. An impurity region including an impurity element imparting one conductivity type is formed in a region in the channel formation region of the microcrystalline semiconductor film which does not overlap with the source electrode or the drain electrode.

An aspect of the present invention is a display device including a transistor. The transistor includes a gate electrode, a gate insulating film over the gate electrode, a microcrystalline semiconductor film including a channel formation region over the gate insulating film, a channel protective layer over and in contact with the channel formation region of the microcrystalline semiconductor film, a source region and a drain region over the microcrystalline semiconductor film and the channel protective layer, and a source electrode over the source region and a drain electrode over the drain region. The channel formation region of the microcrystalline semiconductor film includes an impurity region, which is a doped region to which an impurity element imparting one conductivity type is added, and a non-doped region. The non-doped region is formed between the impurity region and the source region or the drain region.

An aspect of a method for manufacturing a display device of the present invention is to form a gate electrode, a gate insulating film, and a microcrystalline semiconductor film. A channel protective layer is formed over and to be in contact with a channel formation region of the microcrystalline semiconductor film; a source region and a drain region are formed over the microcrystalline semiconductor film and the channel protective layer; and a source electrode and a drain electrode are formed over the source region and the drain region, respectively. An impurity element imparting one conductivity type is added as selected in the channel formation region of the microcrystalline semiconductor film through the channel protective layer, using the source electrode and the drain electrode as masks.

An aspect of a method for manufacturing a display device of the present invention is to form a gate electrode, a gate insulating film, and a microcrystalline semiconductor film. A channel protective layer is formed over and to be in contact with a channel formation region of the microcrystalline semiconductor film; a source region and a drain region are formed over the microcrystalline semiconductor film and the channel protective layer; and a source electrode and a drain electrode are formed over the source region and the drain region, respectively. An impurity element imparting one conductivity type is added as selected in the channel formation region of the microcrystalline semiconductor film through the channel protective layer, using the source electrode and the drain electrode as masks, so that an impurity region is formed. The impurity region in the microcrystalline semiconductor film is irradiated with laser light through the channel protective layer, using the source electrode and the drain electrode as masks.

According to the present invention, a display device including a thin film transistor with high electric characteristics and high reliability can be provided.

BRIEF DESCRIPTION OF DRAWINGS

In the accompanying drawings:
FIGS. 10A and 10B are drawings illustrating a display device of an embodiment mode of the present invention.

DETAILED DESCRIPTION OF THE INVENTION

Embodiment Modes

Figure 1:
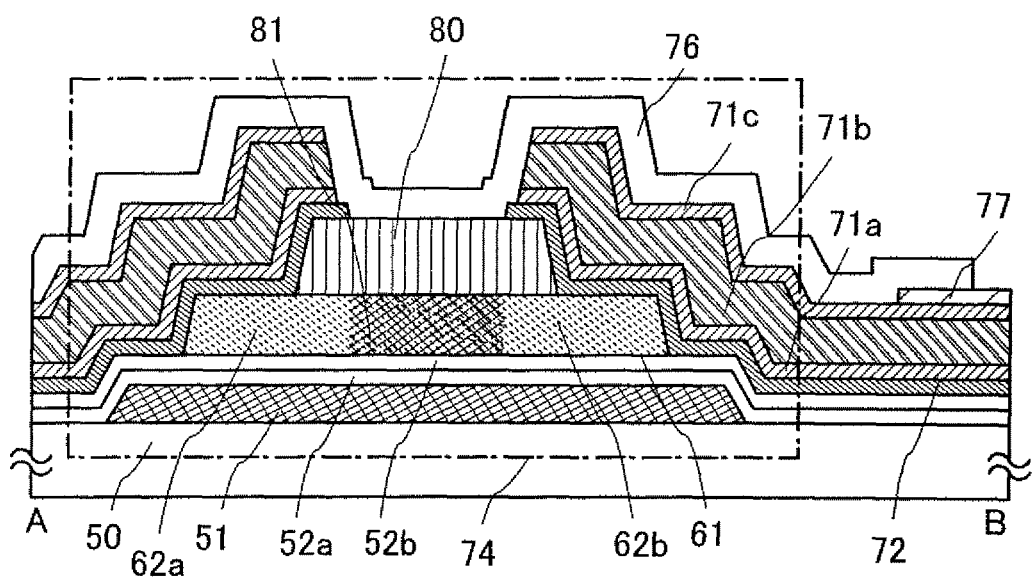
FIG. 1 is a drawing illustrating a display device of an embodiment mode of the present invention.

Hereinafter, embodiment modes of the present invention are described in detail with reference to the drawings. Note that the present invention is not limited to the following description, and it is easily understood by those skilled in the art that the modes and details disclosed herein can be modified in various ways without departing from the spirit and scope of the present invention. Therefore, the present invention should not be interpreted as being limited to the description of the embodiment modes to be given below. In the structures of the present invention to be described hereinafter, same parts or parts having similar functions are denoted by same reference numerals in different drawings, and repeated description thereof is omitted.

Embodiment Mode 1

This embodiment mode describes a thin film transistor used in a display device and a method for manufacturing the thin film transistor, with reference to FIG. 1, FIGS. 2A to 2E, FIGS. 3A to 3C, and FIGS. 4A to 4D. FIG. 1, FIGS. 2A to 2E, and FIGS. 3A to 3C are cross-sectional views showing a thin film transistor and a manufacturing method thereof, and FIGS. 4A to 4D are plan views of a region in which a thin film transistor and a pixel electrode are connected to each other in a pixel. FIG. 1, FIGS. 2A to 2E, and FIGS. 3A to 3C are cross-sectional views showing the thin film transistor taken along a line A-B in FIGS. 4A to 4D and a manufacturing method thereof.

With regard to a thin film transistor including a microcrystalline semiconductor film, an n-channel thin film transistor has higher mobility than a p-channel thin film transistor, and thus the former is more suitable for a driver circuit. However, either an n-channel or p-channel thin film transistor may be used in the present invention. With any polarity of a thin film transistor, it is preferable that all the thin film transistors formed over one substrate have the same polarity so that the number of manufacturing steps can be reduced. However, the present invention is not limited to one polarity, and a complementary metal oxide semiconductor (CMOS), which includes an n-channel thin film transistor and a p-channel thin film transistor, can be provided. Here, an n-channel thin film transistor is described.

A channel stop (also referred to as "channel protective") thin film transistor 74 with a bottom gate structure of this embodiment mode is shown in FIG. 1.

In FIG. 1, the channel stop thin film transistor 74 including a gate electrode 51, gate insulating films 52a and 52b, a microcrystalline semiconductor film 61, a channel protective layer 80, source and drain regions 72, and source and drain electrodes 71a, 71b, and 71c is formed over a substrate 50. Further, a pixel electrode 77 is formed to be in contact with the source or drain electrode 71c. Furthermore, an insulating film 76 is formed so as to cover the thin film transistor 74 and a part of the pixel electrode 77. FIG. 1 corresponds to FIG. 4D.

Furthermore, an impurity region 81 including an impurity element imparting one conductivity type is formed as selected in a region of a channel formation region of the microcrystalline semiconductor film 61 which does not overlap with the source and drain electrodes 71a, 71b, and 7k. Non-doped regions 62a and 62b, to which the impurity element imparting one conductivity type is not added, are formed between the impurity region 81 including the impurity element imparting one conductivity type and the source and drain regions 72.

A thin film transistor is a switching element that is turned on when a certain level of voltage (referred to as a threshold value or a threshold voltage) is applied to a gate electrode, and is turned off when a voltage of less than or equal to the certain level is applied. Therefore, it is very important to control the threshold voltage precisely in terms of accurate operation of a circuit.

However, the threshold voltage of a TH may be moved (shifted) toward the minus side or the plus side by an indefinite factor such as an effect of a movable ion which is due to contamination or an effect of difference in work function or interface electric charge in a periphery of a gate of the TFT.

As a technique proposed to solve such a phenomenon, a channel doping method is given. The channel doping method is a technique in which an impurity element imparting one conductivity type (typically, P, As, B, or the like) is added to a channel formation region of a TFT to shift the threshold voltage intentionally, thereby controlling the threshold voltage.

In this embodiment mode, the channel formation region of the microcrystalline semiconductor film 61 is selectively (partly) doped with an impurity element. In this specification, the impurity region which is formed in the channel formation region by a channel doping process is also referred to as a channel doped region. After forming the source and drain electrodes 71a, 71b, and 71c, the impurity element imparting one conductivity type is added to the microcrystalline semiconductor film 61 through the channel protective layer 80 that is exposed between the source and drain electrodes 71a, 71b, and 71c, using the source and drain electrodes 71a, 71b, and 71c (and a mask layer) as masks, whereby the impurity region 81, which is a doped region to which the impurity element imparting one conductivity type is added, and the non-doped regions 62a and 62b can be formed in a self-aligned manner in the channel formation region of the microcrystalline semiconductor film 61 that is covered with the channel protective layer 80.

In a case where interface electric charge has an influence, a threshold voltage of an n-channel transistor, in which electrons serve as carriers, tends to shift to the minus side, and a threshold voltage of a p-channel transistor, in which holes serve as carriers, tends to shift to the plus side. In such a case, the impurity element imparting one conductivity type which is added to the channel formatting region in order to control the threshold voltage of the transistor may assume a conductivity type which is opposite to that of the source and drain regions of the transistor. For example, the thin film transistor 74 of this embodiment mode is an n-channel thin film transistor, and thus an impurity element imparting p-type conductivity is used as the impurity element included in the impurity region 81. In a case of a p-channel thin film transistor, an impurity element imparting n-type conductivity (typically, phosphorus (P), arsenic (A), or the like) can be used as an impurity element included in an impurity region which is formed in a channel formation region.

Further, in this embodiment mode, the channel formation region in the microcrystalline semiconductor film includes the non-doped region, to which the impurity element imparting one conductivity type is not added, between the source or drain region and the impurity region to which the impurity element imparting one conductivity type, which is an opposite conductivity type to that of the source and drain regions, is added.

In an abrupt junction in which an impurity region to which an impurity element imparting a conductivity type opposite to that of source and drain regions is added is in direct contact with the source or drain region, a density of carriers changes abruptly from one property to the other property in a junction portion, and thus a high electric field tends to be formed. Therefore, hot carriers are generated easily.

Consequently, when a non-doped region is formed in a junction portion in order to prevent generation of a high electric field, a change in carrier densities in the junction portion can be gradual and an electric field can be suppressed. Thus, generation of hot carriers can be reduced, thereby preventing characteristic deterioration. The formation of the non-doped region in the junction portion is more effective as the thickness of the microcrystalline semiconductor film is smaller and the channel formation region is minuter (as the channel length is shorter).

A microcrystalline semiconductor film has low n-type conductivity when an impurity element for controlling valence electrons is not added thereto intentionally. Therefore, an impurity element imparting p-type conductivity may be added to a microcrystalline semiconductor film which functions as a channel formation region of a thin film transistor, so that the threshold voltage can be controlled. A typical example of the impurity element imparting p-type conductivity is boron, and an impurity gas such as $B_2H_6$ or $BF_3$ may be mixed into silicon hydride at a concentration of from 1 to 1000 ppm, preferably from 1 to 100 ppm. A concentration of boron is preferably set to be $1\times10^{14}$ to $6\times10^{16}$ atoms/cm$^3$, for example.

In the present invention, damage (e.g., a rough surface) caused in a step of adding an impurity element to a microcrystalline semiconductor film can be alleviated because the impurity element is added to the microcrystalline semiconductor film through the channel protective layer.

Control of the threshold voltage by a channel doping method is carried out by the concentration of an impurity element. In this embodiment mode, channel doping is performed so as to form a channel doped region as selected, not on the entire channel formation region. Therefore, in the present invention, the threshold voltage can be controlled more precisely by controlling the area of the channel formation region. In the case where the impurity element is added to the microcrystalline semiconductor film through the channel protective layer, it is difficult to control the concentration of the impurity element in the microcrystalline semiconductor film which is implanted deeply in a film-thickness direction and the concentration tends to vary, and there is a fear of damage to the film because the addition of the impurity element needs to be performed with energy high enough to allow the impurity element to pass through the channel protective layer. According to the present invention, film damage to the microcrystalline semiconductor film can be prevented and the threshold value can be controlled more accurately and uniformly. Consequently, high reliability and high performance can be achieved in a thin film transistor and a display device including the thin film transistor.

The structure in which the channel protective layer (also simply referred as a protective layer) is provided over the channel formation region of the microcrystalline semiconductor film can prevent damage to the channel formation region of the microcrystalline semiconductor film (e.g., reduction in film thickness which is due to plasma or an etching agent in etching, or oxidation) which is caused in the manufacturing process. Thus, the thin film transistor can have improved reliability. Further, since the channel formation region of the microcrystalline semiconductor film is not etched, the microcrystalline semiconductor film does not need to be formed thickly and thus film deposition time of the microcrystalline semiconductor film can be shortened. The channel protective layer functions as an etching stopper in an etching step for forming the source and drain regions, and thus can also be referred to as a channel stopper layer.

A microcrystalline semiconductor film can be directly formed as a microcrystalline semiconductor film over a substrate, which is different from a polycrystalline semiconductor film. Specifically, the microcrystalline semiconductor film can be formed using silicon hydride as a source gas with the use of a microwave plasma CVD apparatus with a frequency of higher than or equal to 1 GHz. Therefore, a crystallization process is not necessary after forming the semiconductor film, which is different from a case of a polycrystalline semiconductor film; thus, the number of steps in manufacturing a thin film transistor can be reduced, and the yield of the display device can be improved, and the cost can be suppressed. In addition, plasma generated with the use of microwaves with a frequency of higher than or equal to 1 GHz has a high electron density; thus, silicon hydride, which is a source gas, can be easily dissociated. Accordingly, compared to a case of using a microwave plasma CVD apparatus with a frequency of several tens of MHz to several hundreds of MHz, the microcrystalline semiconductor film can be easily formed and a deposition rate can be increased with the use of a microwave plasma CVD apparatus with a frequency of higher than or equal to 1 GHz. Thus, mass productivity of the display device can be enhanced.

Further, thin film transistors (TFT) are manufactured using the microcrystalline semiconductor film, and a display device is manufactured using the thin film transistors for a pixel portion and further for a driver circuit. A thin film transistor including a microcrystalline semiconductor film has a mobility of from 1 to 20 cm$^2$/V·sec, which is 2 to 20 times higher than that of a thin film transistor including an amorphous semiconductor film; thus, a part of the driver circuit or the entire driver circuit can be formed over the same substrate as that of the pixel portion, so that a system-on-panel can be manufactured.

The gate insulating film, the microcrystalline semiconductor film, the channel protective layer, and the semiconductor film which forms the source and drain regions and to which the impurity element imparting one conductivity type is added may be formed in the same reaction chamber, or each kind of film (or layer) may be formed in its respective reaction chamber. Further, a conductive film used as the source and drain electrodes may also be formed successively. Furthermore, a following step such as a step of adding the impurity element or a step of irradiating the microcrystalline semiconductor film with laser light may also be carried out without exposure to the atmosphere.

Before a substrate is placed in a reaction chamber and a film is formed thereover, it is preferable that cleaning or flushing (washing) treatment (e.g., hydrogen flush in which hydrogen is used as a flushing substance, or silane flush in which silane is used as a flushing substance) be carried out and the inner wall of each reaction chamber be coated with a protective film (the coating is also referred to as precoating treatment). In the precoating treatment, a film formation gas is fed into a reaction chamber and plasma treatment is performed, thereby coating the inside of the reaction chamber with a thin protective film to be formed, in advance. The flushing treatment and/or the precoating treatment can prevent a film to be formed from being contaminated with an impurity such as oxygen, nitrogen, or fluorine in the reaction chamber.

Figure 2A:
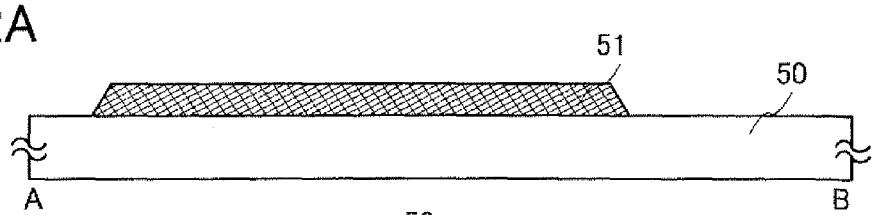
FIGS. 2A to 2E are drawings illustrating a method for manufacturing a display device of an embodiment mode of the present invention.

Hereinafter, a manufacturing method is described in detail. The gate electrode 51 is formed over the substrate 50 (see FIGS. 2A and 4A). FIG. 2A is a cross-sectional view taken along A-B in FIG. 4A. As the substrate 50, a plastic substrate having sufficient heat resistance to withstand a processing temperature of this manufacturing process as well as a non-alkaline glass substrate manufactured by a fusion method or a float method, such as a substrate of barium borosilicate glass, aluminoborosilicate glass, or aluminosilicate glass, a ceramic substrate, or the like can be used. Alternatively, a metal substrate such as a stainless steel alloy substrate whose surface is provided with an insulating film may also be used. As the substrate 50, a substrate having a size of 320 mm×400 mm, 370 mm×470 mm, 550 mm×650 mm, 600 mm×720 mm, 680 mm×880 mm, 730 mm×920 mm, 1000 mm×1200 mm, 1100 mm×1250 mm, 1150 mm×1300 mm, 1500 mm×1800 mm, 1900 mm×2200 mm, 2160 mm×2460 mm, 2400 mm×2800 mm, 2850 mm×3050 mm, or the like can be used.

The gate electrode 51 is formed of a metal material such as titanium, molybdenum, chromium, tantalum, tungsten, or aluminum, or an alloy material thereof. The gate electrode 51 can be formed as follows: a conductive film is formed over the substrate 50 by a sputtering method or a vacuum evaporation method; a mask is formed over the conductive film by a photolithography technique or an inkjet method; and the conductive film is etched using the mask. Alternatively, the gate electrode 51 can be formed by discharging a conductive nanopaste of silver, gold, copper, or the like by an inkjet method and baking it. A nitride film formed of the above metal material may be provided between the substrate 50 and the gate electrode 51 to improve adherence of the gate electrode 51 to the substrate 50. Further, the gate electrode 51 may have a stacked-layer structure. From the substrate 50 side, a stacked layer of an aluminum film and a molybdenum film, a stacked layer of a copper film and a molybdenum film, a stacked layer of a copper film and a titanium nitride film, a stacked layer of a copper film and a tantalum nitride film, or the like can be employed. In the above stacked-layer structure, the molybdenum film or the nitride film such as the titanium nitride film or the tantalum nitride film, which is formed as an upper layer, has an effect of a barrier metal.

Since the semiconductor film and a wiring are formed over the gate electrode 51, the gate electrode 51 is preferably processed to have a tapered end portion so that the semiconductor film and the wiring thereover are not disconnected. Further, although not illustrated, a wiring connected to the gate electrode can also be formed at the same time when the gate electrode is formed.

Figure 2B:
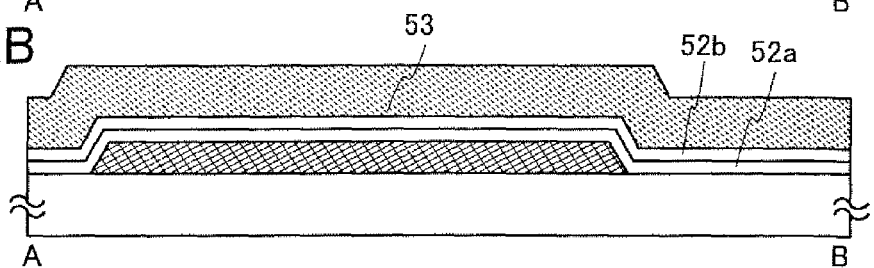

Subsequently, the gate insulating films 52a and 52b and a microcrystalline semiconductor film 53 are formed in order over the gate electrode 51 (see FIG. 2B).

The microcrystalline semiconductor film 53 may be formed on the surface of the gate insulating film 52b either while being subjected to hydrogen plasma or after the gate insulating film 52b is subjected to hydrogen plasma. Forming the microcrystalline semiconductor film on the gate insulating film 52b which has been subjected to hydrogen plasma can promote growth of microcrystals. Further, lattice distortion at an interface between the gate insulating film and the microcrystalline semiconductor film can be reduced, and thus interface characteristics of the gate insulating film and the microcrystalline semiconductor film can be improved. Consequently, a microcrystalline semiconductor film with excellent electric characteristics and high reliability can be obtained.

The gate insulating films 52a and 52b and the microcrystalline semiconductor film 53 may be formed successively without being exposed to the atmosphere. When the gate insulating films 52a and 52b and the microcrystalline semiconductor film 53 are formed successively without being exposed to the atmosphere, the films can be fanned without any contamination of interfaces between stacked films with an atmospheric component or an impurity element in the atmosphere. Thus, variation in characteristics of a thin film transistor can be reduced.

The gate insulating films 52a and 52b can each be formed by a CVD method, a sputtering method, or the like using a silicon oxide film, a silicon nitride film, a silicon oxynitride film, or a silicon nitride oxide film. This example shows a mode in which a silicon nitride film or a silicon nitride oxide film, and a silicon oxide film or a silicon oxynitride film are stacked in this order as the gate insulating films 52a and 52b. Instead of the two-layer structure, the gate insulating film may have a three-layer structure in which a silicon nitride film or a silicon nitride oxide film, a silicon oxide film or a silicon oxynitride film, and a silicon nitride film and a silicon nitride oxide film are stacked in this order from the substrate side. Further, the gate insulating film can have a single-layer structure of a silicon oxide film, a silicon nitride film, a silicon oxynitride film, or a silicon nitride oxide film. Furthermore, it is preferable to use a microwave CVD apparatus with a frequency of higher than or equal to 1 GHz to form the gate insulating film. A silicon oxynitride film or a silicon nitride oxide film which is formed with the use of a microwave plasma CVD apparatus has high dielectric strength, and a thin film transistor which is completed later can have higher reliability.

As an example of a three-layer structure of the gate insulating film, a silicon nitride film or a silicon nitride oxide film may be formed as a first layer over the gate electrode; a silicon oxynitride film may be formed as a second layer; a silicon nitride film may be formed as a third layer; and the microcrystalline semiconductor film may be formed over the silicon nitride film, which is a top layer. In that case, the silicon nitride film or the silicon nitride oxide film of the first layer preferably has a thickness of greater than 50 nm, and has effects of a barrier for blocking impurities such as sodium, prevention of hillocks of the gate electrode, prevention of oxidation of the gate electrode, and the like. The silicon nitride film, which is the third layer, has effects of improving adherence of the microcrystalline semiconductor film and preventing oxidation in an LP in which the microcrystalline semiconductor film is irradiated with laser.

When an ultrathin nitride film such as a silicon nitride film is formed at a surface of the gate insulating film in such a manner, the microcrystalline semiconductor film can have improved adherence. The nitride film may be formed by a plasma CVD method, or by nitridation treatment by treatment with plasma which has a high density and a low temperature and is generated by microwaves. Further, a silicon nitride film or a silicon nitride oxide film may be formed in carrying out flushing treatment in a reaction chamber.

Note that a silicon oxynitride film means a film that includes more oxygen than nitrogen, and includes oxygen, nitrogen, silicon, and hydrogen at concentrations ranging from 55 to 65 at. %, 1 to 20 at. %, 25 to 35 at. %, and 0.1 to 10 at. %, respectively. Further, a silicon nitride oxide film means a film that includes more nitrogen than oxygen, and includes oxygen, nitrogen, silicon, and hydrogen at concentrations ranging from 15 to 30 at. %, 20 to 35 at. %, 25 to 35 at. %, and 15 to 25 at. %, respectively.

The microcrystalline semiconductor film 53 belongs to a metastable state of an intermediate between amorphous and single-crystalline when Gibbs free energy is considered. That is to say, the microcrystalline semiconductor film 53 is in a third state, in which the semiconductor is stable in free energy, and has short-range order and lattice distortion. Further, columnar or needle-like crystals grow in a direction of the normal to the surface of the substrate. The Raman spectrum of microcrystalline silicon, which is a typical example of a microcrystalline semiconductor, is located in lower wave numbers than 520 cm$^{-1}$, which represents a peak of the Raman spectrum of single-crystalline silicon. That is to say, a peak of the Raman spectrum of microcrystalline silicon lies between 520 cm$^{-1}$, which represents a peak of the Raman spectrum of single-crystalline silicon, and 480 cm$^{-1}$, which represents a peak of the Raman spectrum of amorphous silicon. Furthermore, the microcrystalline semiconductor film 53 includes hydrogen or halogen at 1 at. % or more in order to terminate a dangling bond. The microcrystalline semiconductor film 53 may further include a rare gas element such as helium, argon, krypton, or neon to further promote lattice distortion, so that the stability is enhanced and a favorable microcrystalline semiconductor film can be obtained.

The microcrystalline semiconductor film can be formed with the use of a high frequency plasma CVD apparatus with a frequency of several tens of MHz to several hundreds of MHz, or a microwave plasma CVD apparatus with a frequency of higher than or equal to 1 GHz. Typically, the microcrystalline semiconductor film can be formed using silicon hydride (e.g., $SiH_4$, $Si_2H_6$, $SiH_2Cl_2$, $SiHCl_3$, $SiCl_4$, or $SiF_4$) which is diluted with hydrogen. Further, the microcrystalline semiconductor film can be formed using silicon hydride, hydrogen, and one or plural kinds of rare gas elements selected from helium, argon, krypton, and neon. In such a case, a flow rate of hydrogen is 5 to 200 times, preferably 50 to 150 times, more preferably 100 times as high as that of silicon hydride.

It is preferable that an oxygen concentration in the microcrystalline semiconductor film be less than or equal to $5 \times 10^{19}$ atoms/cm$^3$, more preferably less than or equal to $1 \times 10^{19}$ atoms/cm$^3$. Further, it is preferable that each of a nitrogen concentration and a carbon concentration in the microcrystalline semiconductor film be less than or equal to $1 \times 10^{18}$ atoms/cm$^3$. Reducing concentrations of oxygen, nitrogen, and carbon in the microcrystalline semiconductor film can prevent the microcrystalline semiconductor film from assuming an n-type.

The thickness of the microcrystalline semiconductor film 53 may be from 25 to 300 nm (preferably from 30 to 150 nm) approximately.

The microcrystalline semiconductor film 53 may have a thickness of greater than 0 nm and less than or equal to 50 nm, preferably greater than 0 nm and less than or equal to 20 nm. The microcrystalline semiconductor film 53 functions as the channel formation region of the thin film transistor which is completed later. When the microcrystalline semiconductor film 53 has a thickness in the above range, the thin film transistor which is completed later is a complete depletion type.

A microcrystalline semiconductor film has lower resistance than an amorphous semiconductor film because a microcrystalline semiconductor film includes a microcrystal. Therefore, a thin film transistor including a microcrystalline semiconductor film has such a current-voltage property that a curve showing the current-voltage property has a rising portion with a steep slope, and is excellent in response speed as a switching element; and thus can operate at high speed. Further, if a microcrystalline semiconductor film is used for a channel formation region of a thin film transistor, variation in a threshold value of the thin film transistor can be suppressed. Thus, a display device with little variation in electric characteristics can be manufactured.

Further, a microcrystalline semiconductor film has higher mobility than an amorphous semiconductor film. Therefore, if a thin film transistor in which a channel formation region is formed of a microcrystalline semiconductor film is used as a switching element of a display element, the area of the channel formation region can be reduced; in other words, the area of the thin film transistor can be reduced. Thus, the area of a thin film transistor in each pixel is reduced, whereby the aperture rate of the pixel can be increased. Accordingly, a device with high definition can be manufactured.

Further, the microcrystalline semiconductor film has a needle-like crystal which has grown longitudinally from the lower side. In the microcrystalline semiconductor film, an amorphous structure and a crystalline structure are mixed and local stress tends to generate a crack to cause a gap between a crystalline region and an amorphous region. A radical can enter this gap and cause crystal growth. The crystal tends to grow upward in a needle shape because the upper face of the crystal grows larger. Even when the microcrystalline semiconductor film grows longitudinally in the above manner, the deposition rate thereof is from 1/10 to 1/100 as high as that of an amorphous semiconductor film.

Figure 2C:
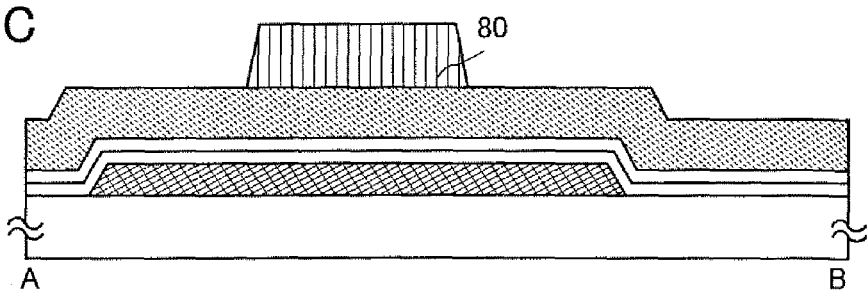

Next, the channel protective layer 80 is formed in a region overlapping with the channel formation region of the microcrystalline semiconductor film 53 (see FIG. 2C). The channel protective layer 80 as well as the gate insulating films 52a and 52b and the microcrystalline semiconductor film 53 may be formed successively without being exposed to the atmosphere. Successive formation of stacked thin films improves productivity.

The channel-protective layer 80 can be formed using a film of an inorganic material (e.g., silicon oxide, silicon nitride, silicon oxynitride, or silicon nitride oxide), a photosensitive or non-photosensitive organic material (an organic resin material such as polyimide, acrylic, polyamide, polyimide amide, resist, or benzocyclobutene); a film including a plurality of materials; stacked layers of such films; or the like. Alternatively, siloxane may also be used. As a method for forming the channel protective layer 80, a vapor deposition method such as a plasma CVD method or a thermal CVD method, or a sputtering method can be used. Further, a coating method (e.g., a spin coating method), a droplet discharging method, or a printing method (e.g., a method of forming a pattern such as screen printing or offset printing), which are wet methods, can also be used. The channel protective layer 80 may be etched to have a processed shape after forming a layer, or may be formed as selected by a droplet discharging method or the like.

Figure 2D:
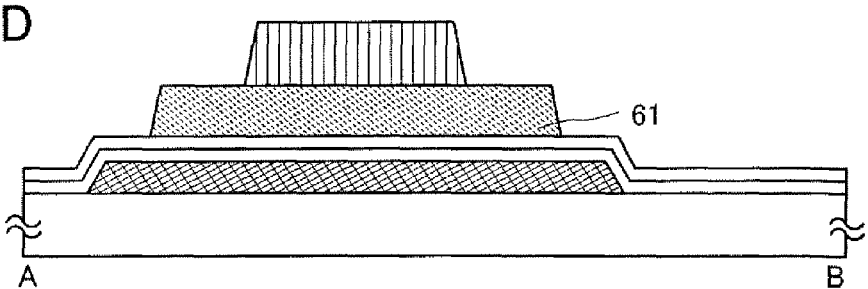

Next, the microcrystalline semiconductor film 53 is processed by etching to form the microcrystalline semiconductor film 61 (see FIG. 2D). The microcrystalline semiconductor film 61 can be formed by forming a mask by a photolithography technique or a droplet discharging method and then etching the microcrystalline semiconductor film 53 using the mask. FIG. 2D is a cross-sectional view taken along A-B in FIG. 4B.

The microcrystalline semiconductor film 61 and the channel protective layer 80 are etched to have tapered end portions (for example, with a taper angle of from 30° to 90°, preferably from 45° to 80°), thereby preventing disconnection of a wiring which is due to a step form.

Figure 2E:
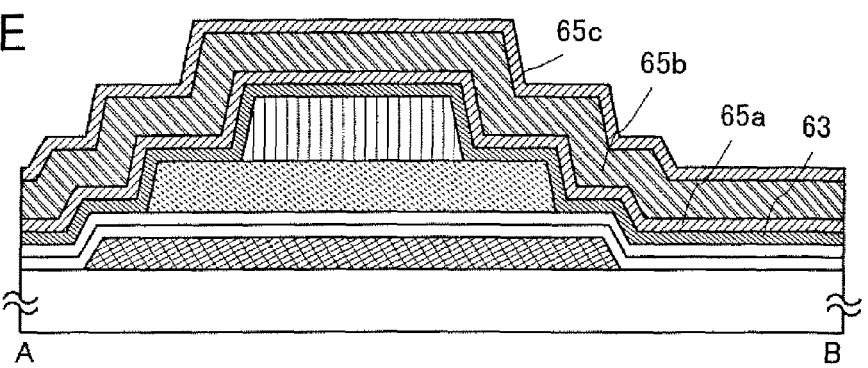

Subsequently, a semiconductor film 63 to which an impurity element imparting one conductivity type is added and conductive films 65a to 65c are formed over the gate insulating film 52b, the microcrystalline semiconductor film 61, and the channel protective layer 80 (see FIG. 2E). Then, a mask 66 is formed over the semiconductor film 63 to which the impurity element imparting one conductivity type is added and the conductive films 65a to 65c. The mask 66 is formed by a photolithography technique or an inkjet method.

If an n-channel thin film transistor is fanned, the semiconductor film 63 to which the impurity element imparting one conductivity type is added may be doped with phosphorus, which is a typical impurity element; for example, an impurity gas such as $PH_3$ may be added to silicon hydride. If a p-channel thin film transistor is formed, the semiconductor film 63 to which the impurity element imparting one conductivity type is added may be doped with boron, which is a typical impurity element; for example, an impurity gas such as $B_2H_6$ may be added to silicon hydride. The semiconductor film 63 to which the impurity element imparting one conductivity is added can be formed using a microcrystalline semiconductor or an amorphous semiconductor. The semiconductor film 63 to which the impurity element imparting one conductivity type is added may have a thickness of from 2 to 50 nm (preferably from 10 to 30 nm).

The conductive films 65a to 65c are preferably formed with a single layer or stacked layers using aluminum; copper; or an aluminum alloy to which an element for preventing hillocks or an element for improving heat resistance property, such as silicon, titanium, neodymium, scandium, or molybdenum, is added. Alternatively, a film in contact with the semiconductor film to which the impurity element imparting one conductivity type is added may be formed of titanium, tantalum, molybdenum, or tungsten, or nitride of such an element; and aluminum or an aluminum alloy may be formed thereover to form a stacked-layer structure. Further alternatively, top and bottom surfaces of aluminum or an aluminum alloy may be each covered with titanium, tantalum, molybdenum, tungsten, or nitride thereof to form a stacked-layer structure. This embodiment mode shows the conductive film having a three-layer structure of the conductive films 65a to 65c; a stacked-layer structure in which the conductive films 65a and 65c are formed using molybdenum films and the conductive film 65b is formed using an aluminum film, or a stacked-layer structure in which the conductive films 65a and 65c are formed using titanium films and the conductive film 65b is formed using an aluminum film is formed.

The conductive films 65a to 65c are formed by a sputtering method or a vacuum evaporation method. Alternatively, the conductive films 65a to 65c may also be formed by discharging a conductive nanopaste of silver, gold, copper, or the like by a screen printing method, an inkjet method, or the like and baking it.

Figure 3A:
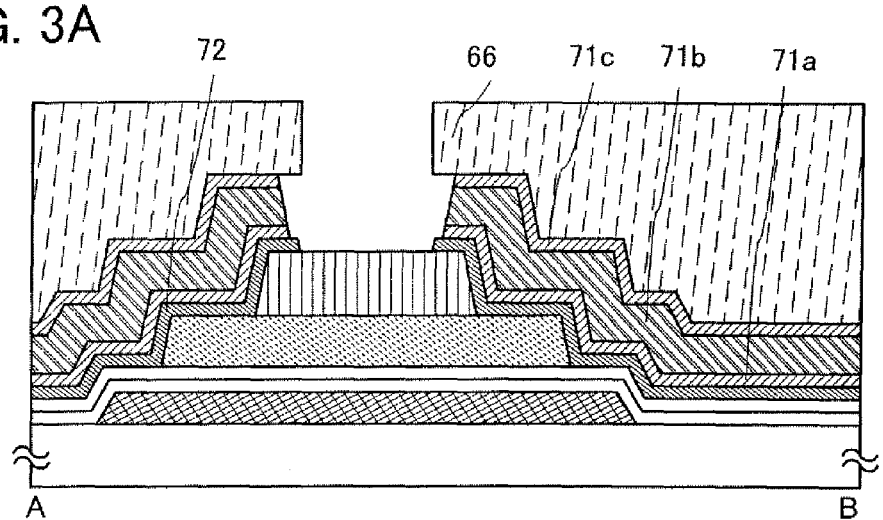
FIGS. 3A to 3C are drawings illustrating a method for manufacturing a display device of an embodiment mode of the present invention.

Next, the conductive films 65a to 65c are etched to be separated using the mask 66, so that the source and drain electrodes 71a to 71c are formed. If the conductive films 65a to 65c are subjected to wet etching as shown in FIG. 3A in this embodiment mode, the conductive films 65a to 65c are etched isotropically. Thus, end portions of the mask 66 and those of the source and drain electrodes 71a to 71c are not aligned, and the end portions of the source and drain electrodes 71a to 71c further recede. Subsequently, the semiconductor film 63 to which the impurity element imparting one conductivity type is added is etched using the mask 66 to form the source and drain regions 72 (see FIG. 3A). The microcrystalline semiconductor film 61 is not etched because the channel protective layer 80 functions as a channel stopper.

The end portions of the source and drain electrodes 71a to 71c are not aligned with those of the source and drain regions 72, and the end portions of the source and drain regions 72 are located at outer side than those of the source and drain electrodes 71a to 71c.

The mask 66 used as a mask, an impurity element 82 is added to the microcrystalline semiconductor film 61 through the channel protective layer 80. As a result, the impurity region 81, which is a doped region, and the non-doped regions 62a and 62b are formed as selected in the channel formation region of the microcrystalline semiconductor film 61. The impurity region 81, which is a channel doped region, is formed as selected in the channel formation region because the channel formation region of the microcrystalline semiconductor film 61 is a region of the impurity region 81 and the non-doped regions 62a and 62b which is covered with the channel protective layer 80. The impurity element 82 can be added (introduced) to the microcrystalline semiconductor film 61 by an ion implantation method or an ion doping method.

The impurity element 82 may be added to the microcrystalline semiconductor film 61 using the source and drain electrodes 71a to 71c as masks after removing the mask 66; in such a case, the channel doped region can be formed as selected in the channel formation region of the microcrystalline semiconductor film 61 in a self-aligned manner. Further, the impurity region 81 may be formed using a mask such as a resist mask before forming the source and drain electrodes 71a to 71c.

In this embodiment mode, the impurity element is added to the microcrystalline semiconductor film 61 through the channel protective layer 80; thus, damage (e.g., a rough surface) caused in a step of adding the impurity element to the microcrystalline semiconductor film 61 can be alleviated.

Figure 3C:
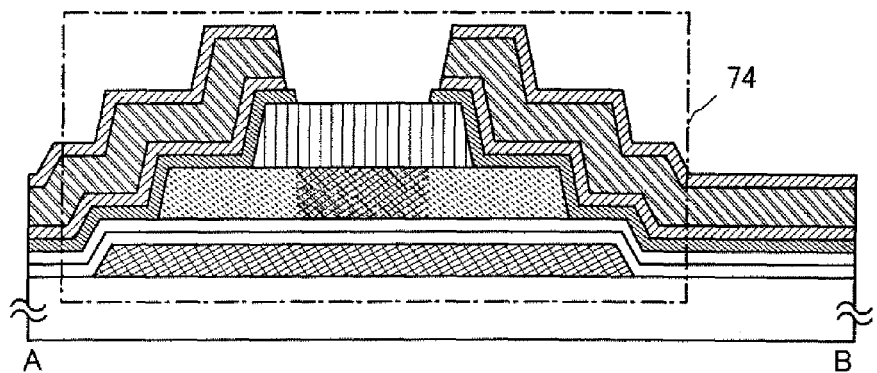
Figure 4A:
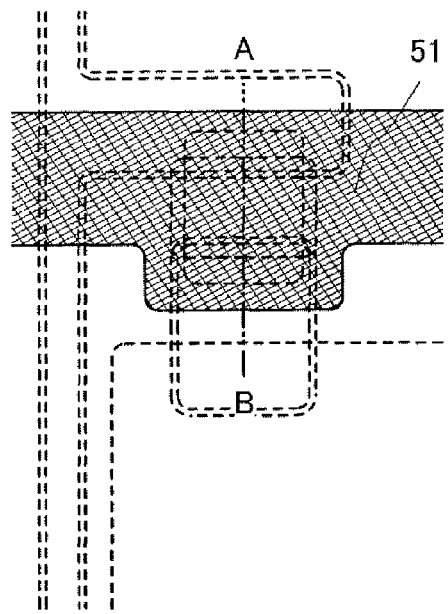
FIGS. 4A to 4D are drawings illustrating a method for manufacturing a display device of an embodiment mode of the present invention.
Figure 4B:
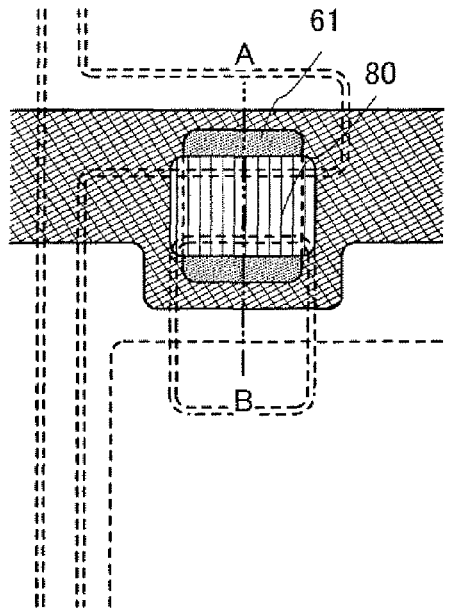
Figure 4C:
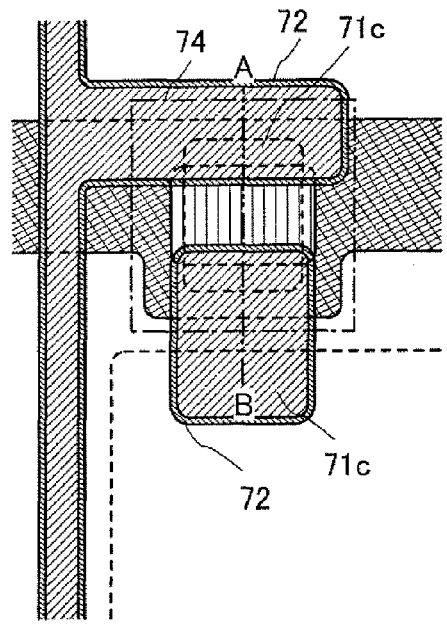
Figure 4D:
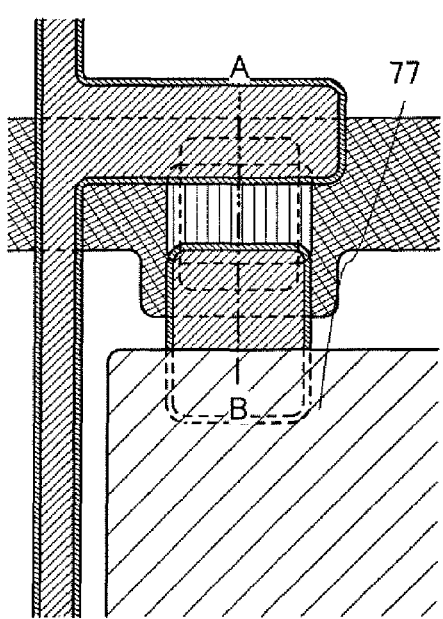

After that, the mask 66 is removed. FIG. 3C is a cross-sectional view taken along A-B in FIG. 4C. The end portions of the source and drain regions 72 are located at outer side of those of the source and drain electrodes 71c, as is shown in FIG. 4C. Further, either the source or drain electrode also functions as a source wiring or a drain wiring.

As shown in FIG. 3C, the end portions of the source and drain electrodes 71a to 71c are not aligned with those of the source and drain regions 72, whereby the distance between the end portions of the source and drain electrodes 71a to 71c can be long; thus, leakage current or short circuit between the source and drain electrodes can be prevented. Accordingly, a thin film transistor with high reliability and high dielectric strength can be manufactured.

Through the above process, the channel stop (protective) thin film transistor 74 can be formed.

In the above manner, the channel protective layer is formed and the channel doped region is formed as selected in the channel formation region, whereby a channel stop thin film transistor with high dielectric strength can be manufactured. Accordingly, the thin film transistor can favorably be used with high reliability even for a liquid crystal display device to which a voltage of 15 V is applied.

Next, the pixel electrode 77 in contact with the source or drain electrode 71c is formed. Then, the insulating film 76 is formed over the source and drain electrodes 71a to 71c, the source and drain regions 72, the channel protective layer 80, the gate insulating film 52b, and the pixel electrode 77. The insulating film 76 can be formed in a similar manner to the gate insulating films 52a and 52b. The insulating film 76 is provided to prevent contamination impurities such as organic substances, metals, or moisture included in the atmosphere from entering, and is preferably a dense film.

Subsequently, the insulating film 76 is etched to expose a part of the pixel electrode 77. A display element is formed so as to be in contact with an exposed region of the pixel electrode 77, so that the thin film transistor 74 can be electrically connected to the display element. For example, a light-emitting layer (or a liquid crystal layer) may be formed over the pixel electrode 77, and a counter electrode may be formed over the light-emitting layer (or the liquid crystal layer).

The pixel electrode 77 can be formed of a light-transmitting conductive material such as indium oxide including tungsten oxide, indium zinc oxide including tungsten oxide, indium oxide including titanium oxide, indium tin oxide including titanium oxide, indium tin oxide (hereinafter also referred to as ITO), indium zinc oxide, or indium tin oxide to which silicon oxide is added.

Further, the pixel electrode 77 can be formed of a conductive composition including a conductive high molecule (also referred to as a conductive polymer). It is preferable that a pixel electrode formed using a conductive composition have sheet resistance of less than or equal to 10000 O/square, and light transmittance of greater than or equal to 70% at a wavelength of 550 nm. Further, it is preferable that a conductive high molecule included in a conductive composition have resistance of less than or equal to 0.1 O·cm.

As a conductive high molecule, a "π electron conjugated conductive high molecule" can be used. For example, polyaniline or a derivative thereof, polypyrrole or a derivative thereof, polythiophene or a derivative thereof, or a copolymer of two or more kinds of these materials can be given.

Figure 14:
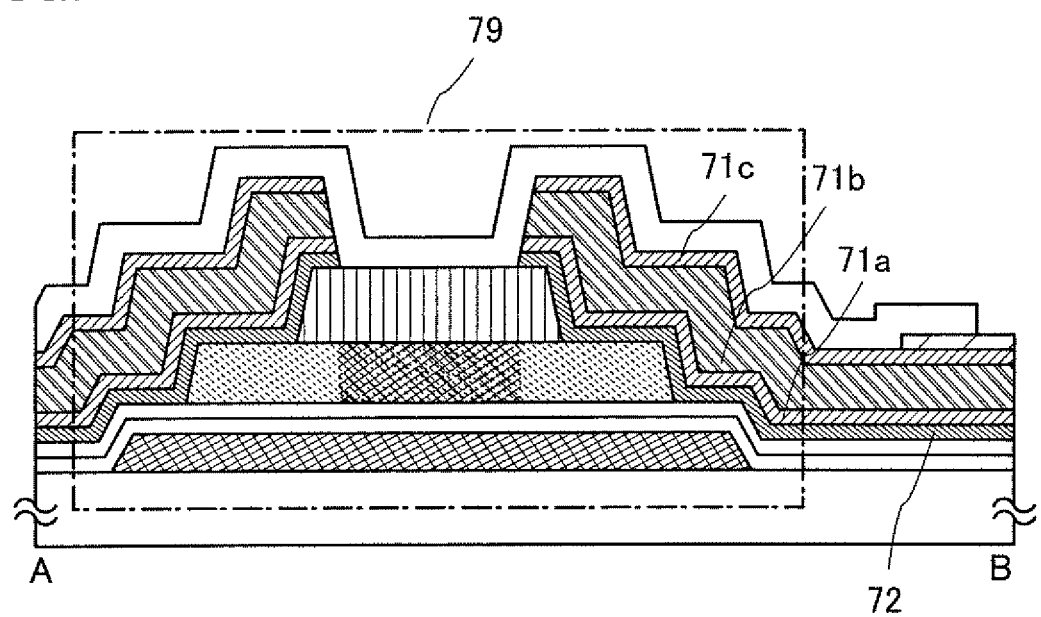
FIG. 14 is a drawing illustrating a display device of an embodiment mode of the present invention.

The end portions of the source and drain regions and those of the source and drain electrodes may be aligned. FIG. 14 shows a thin film transistor 79 of a channel stop type in which end portions of source and drain regions and those of source and drain electrodes are aligned. When the source and drain electrodes and the source and drain regions are subjected to dry etching, a shape like the thin film transistor 79 can be obtained. Alternatively, also when a semiconductor film to which an impurity element imparting one conductivity type is added is etched using source and drain electrodes as masks to form source and drain regions, a shape like the thin film transistor 79 can be obtained.

A display device includes a display element. As a display element, a liquid crystal element (also referred to as a liquid crystal display element) or a light-emitting element (also referred to as a light-emitting display element) can be used. A light-emitting element includes, in its category, an element whose luminance is controlled with current or voltage; specifically, an inorganic electroluminescence (EL) element, an organic EL element, and the like. Further, a display medium whose contrast changes by electric action, such as electronic ink, can also be used.

In addition, the display device includes a panel in which a display element is sealed, and a module in which an IC and the like including a controller are mounted on the panel. The present invention relates to one mode of an element substrate before the display element is completed in a manufacturing process of the display device, and the element substrate is provided with a means for supplying current to the display element in each of a plurality of pixels. Specifically, the element substrate may be in a state of being provided with only a pixel electrode of the display element, a state after a conductive film to be a pixel electrode is formed and before the conductive film is etched to form the pixel electrode, or any other states.

A display device in this specification means an image display device, or a light source (including a lighting device). Further, the display device includes any of the following modules in its category: a module including a connector such as a flexible printed circuit (FPC), tape automated bonding (TAB) tape, or a tape carrier package (TCP); a module having TAB tape or a TCP which is provided with a printed wiring board at the end thereof; and a module having an integrated circuit (IC) which is directly mounted on a display element by a chip on glass (COG) method.

A channel stop thin film transistor can have improved reliability. In addition, a field effect mobility of from 1 to 20 $cm^2/V \cdot sec$ can be achieved by forming a channel formation region using a microcrystalline semiconductor film. Therefore, the thin film transistor can be used as a switching element of a pixel in a pixel portion, and further as an element included in a driver circuit on a scanning line (or a gate line) side.

According to this embodiment mode, a display device having a thin film transistor with high electric characteristics and high reliability can be manufactured.

Embodiment Mode 2

This embodiment mode presents another example in which a thin film transistor has a different shape from that in Embodiment Mode 1. Therefore, parts except for a different part can be made in a similar manner to Embodiment Mode 1, and the same parts or parts having similar functions, or steps for making such parts are not repeatedly described.

Figure 5:
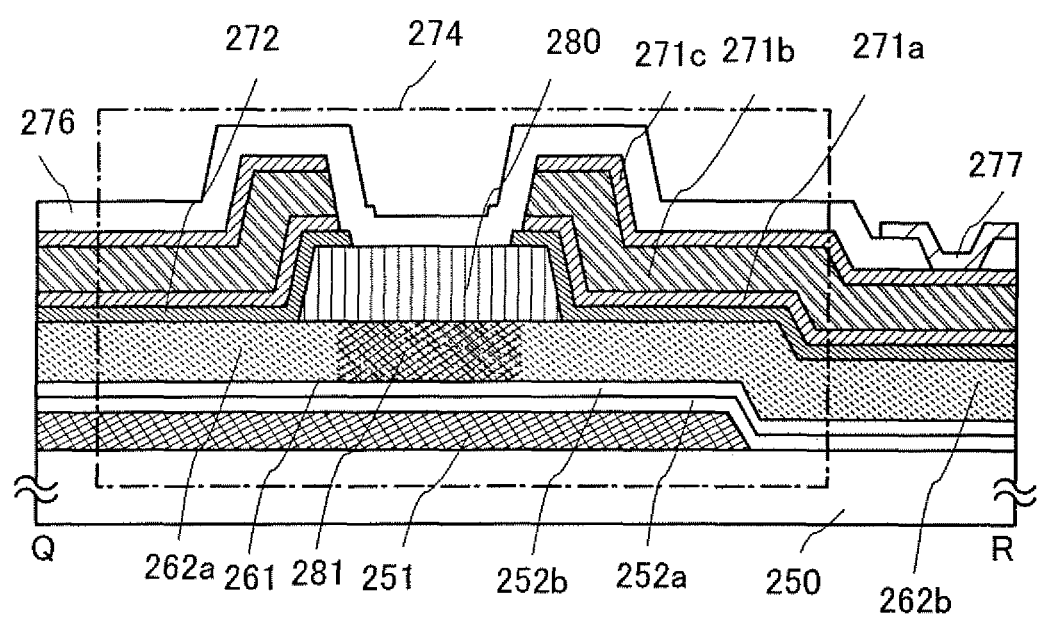
FIG. 5 is a drawing illustrating a display device of an embodiment mode of the present invention.
Figure 15:
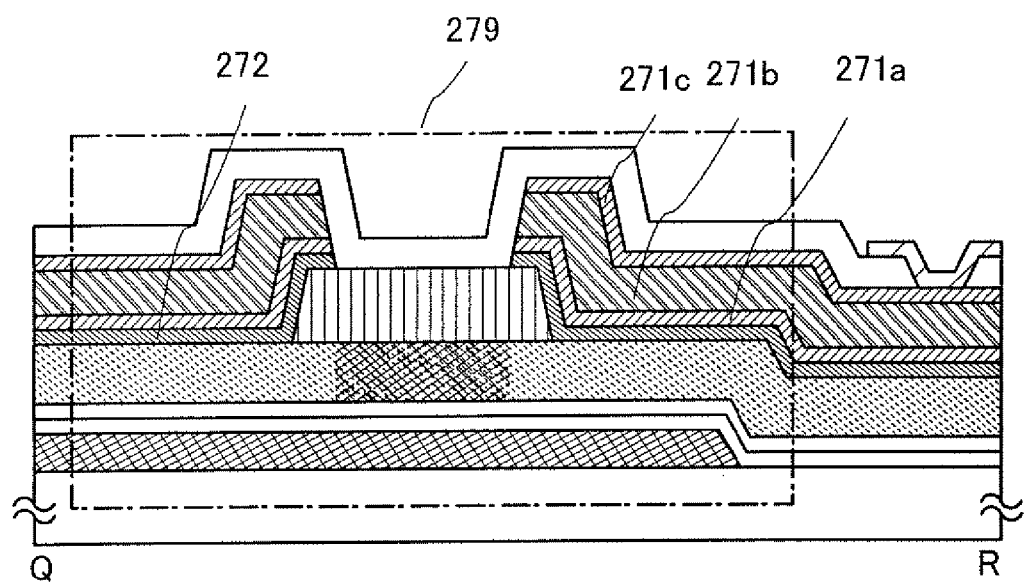
FIG. 15 is a drawing illustrating a display device of an embodiment mode of the present invention.

This embodiment mode describes a thin film transistor used in a display device and a method for manufacturing the thin film transistor, with reference to FIG. 5, FIGS. 6A to 6D, and FIG. 15. FIG. 5 and FIG. 15 are cross-sectional views of a thin film transistor and a pixel electrode, and FIGS. 6A to 6D are plan views of a region in which a thin film transistor and a pixel electrode are connected to each other in a pixel. FIG. 5 and FIG. 15 are cross-sectional views showing thin film transistors taken along a line Q-R in FIGS. 6A to 6D and manufacturing steps thereof.

A channel stop (also referred to as "channel protective") thin film transistor 274 with a bottom gate structure of this embodiment mode is shown in FIG. 5 and FIGS. 6A to 6D.

In FIG. 5, the channel stop thin film transistor 274 including a gate electrode 251, gate insulating films 252a and 252b, a microcrystalline semiconductor film 261, a channel protective layer 280, source and drain regions 272, and source and drain electrodes 271a, 271b, and 271c is formed over a substrate 250. Further, an insulating film 276 is formed so as to cover the thin film transistor 274. Furthermore, a pixel electrode 277 is formed to be in contact with the source or drain electrode 271c in a contact hole formed in the insulating film 276. FIG. 5 corresponds to FIG. 6D.

Furthermore, an impurity region 281 including an impurity element imparting one conductivity type is formed as selected in a region of a channel formation region of the microcrystalline semiconductor film 261 which does not overlap with the source and drain electrodes 271a, 271b, and 271c. Non-doped regions 262a and 262b, to which the impurity element imparting one conductivity type is not added, are formed between the impurity region 281 including the impurity element imparting one conductivity type and the source and drain regions 272.

The threshold voltage of a TFT can be moved (shifted) toward the minus side or the plus side by an indefinite factor such as an effect of a movable ion which is due to contamination or an effect of difference in work function or interface electric charge in a periphery of a gate of the TFT.

In this embodiment mode, the impurity element imparting one conductivity type (typically, P, As, B, or the like) is added to the channel formation region of the thin film transistor by a channel doping method to shift the threshold voltage intentionally, thereby controlling the threshold voltage.

In this embodiment mode, the channel formation region of the microcrystalline semiconductor film 261 is selectively (partly) doped with the impurity element. After forming the source and drain electrodes 271a, 271b, and 271c, the impurity element imparting one conductivity type is added to the microcrystalline semiconductor film 261 through the channel protective layer 280 that is exposed between the source and drain electrodes 271a, 271b, and 271c, using the source and drain electrodes 271a, 271b, and 271c (and a mask layer) as masks, whereby the impurity region 281, which is a doped region to which the impurity element imparting one conductivity type is added, and the non-doped regions 262a and 262b can be formed in a self-aligned manner in the channel formation region of the microcrystalline semiconductor film 261 that is covered with the channel protective layer 280.

In a case where interface electric charge has an influence, a threshold voltage of an n-channel transistor, in which electrons serve as carriers, tends to shift to the minus side, and a threshold voltage of a p-channel transistor, in which holes serve as carriers, tends to shift to the plus side. In such a case, the impurity element imparting one conductivity type which is added to the channel formatting region in order to control the threshold voltage of the transistor may assume a conductivity type which is opposite to that of the source and drain regions of the transistor. For example, the thin film transistor 274 of this embodiment mode is an n-channel thin film transistor, and thus an impurity element imparting p-type conductivity is used as the impurity element included in the impurity region 281. In a case of a p-channel thin film transistor, an impurity element imparting n-type conductivity can be used as an impurity element included in an impurity region which is formed in a channel formation region.

Further, in this embodiment mode, the channel formation region in the microcrystalline semiconductor film includes the non-doped region, to which the impurity element imparting one conductivity type is not added, between the source or drain region and the impurity region to which the impurity element imparting one conductivity type, which is an opposite conductivity type to that of the source and drain regions, is added.

In an abrupt junction in which an impurity region to which an impurity element imparting a conductivity type opposite to that of source and drain regions is added is in direct contact with the source or drain region, a density of carriers changes abruptly from one property to the other property in a junction portion, and thus a high electric field tends to be formed. Therefore, hot carriers are generated easily.

Consequently, when a non-doped region is formed in a junction portion in order to prevent generation of a high electric field, a change in carrier densities in the junction portion can be gradual and an electric field can be suppressed. Thus, generation of hot carriers can be reduced, thereby preventing characteristic deterioration. The formation of the non-doped region in the junction portion is more effective as the thickness of the microcrystalline semiconductor film is smaller and the channel formation region is minuter (as the channel length is shorter).

A microcrystalline semiconductor film has low n-type conductivity when an impurity element for controlling valence electrons is not added thereto intentionally. Therefore, an impurity element imparting p-type conductivity may be added to a microcrystalline semiconductor film which functions as a channel formation region of a thin film transistor, so that the threshold voltage can be controlled. A typical example of the impurity element imparting p-type conductivity is boron, and an impurity gas such as $B_2H_6$ or $BF_3$ may be mixed into silicon hydride at a concentration of from 1 to 1000 ppm, preferably from 1 to 100 ppm. A concentration of boron is preferably set to be $1 \times 10^{14}$ to $6 \times 10^{16}$ atoms/cm$^3$, for example.

Control of the threshold voltage by a channel doping method is carried out by the concentration of an impurity element. In this embodiment mode, channel doping is performed so as to form a channel doped region as selected, not on the entire channel formation region. Therefore, in the present invention, the threshold voltage can be controlled more precisely by controlling the area of the channel formation region. In the case where the impurity element is added to the microcrystalline semiconductor film through the channel protective layer, it is difficult to control the concentration of the impurity element in the microcrystalline semiconductor film which is implanted deeply in a film-thickness direction and the concentration tends to vary, and there is a fear of damage to the film because the addition of the impurity element needs to be performed with energy high enough to allow the impurity element to pass through the channel protective layer. According to the present invention, film damage to the microcrystalline semiconductor film can be prevented and the threshold value can be controlled more accurately and uniformly. Consequently, high reliability and high performance can be achieved in a thin film transistor and a display device including the thin film transistor.

The structure in which the channel protective layer 280 is provided over the channel formation region of the microcrystalline semiconductor film 261 can prevent damage to the channel formation region of the microcrystalline semiconductor film 261 (e.g., reduction in film thickness which is due to radicals caused by plasma or due to an etching agent in etching, or oxidation) which is caused in the manufacturing process. Thus, the thin film transistor 274 can have improved reliability. Further, since the channel formation region of the microcrystalline semiconductor film 261 is not etched, the microcrystalline semiconductor film 261 does not need to be formed thickly and thus film deposition time of the microcrystalline semiconductor film 261 can be shortened.

A method for manufacturing a display device including the thin film transistor 274 shown in FIG. 5 is described with reference to FIGS. 6A to 6D. The gate electrode 251 is formed over the substrate 250 (see FIG. 6A). The gate insulating films 252a and 252b are formed over the gate electrode 251, and the microcrystalline semiconductor film 261 is formed thereover. The channel protective layer 280 is formed so as to overlap with the channel formation region of the microcrystalline semiconductor film 261 (see FIG. 6B).

Embodiment Mode 1 shows an example in which the microcrystalline semiconductor film 53 is processed, by etching, into the island-shaped microcrystalline semiconductor film 61 after forming the channel protective layer 80; however, this embodiment mode shows an example in which the microcrystalline semiconductor film is also etched in the same step as etching the source and drain electrodes and the semiconductor film to which the impurity element imparting one conductivity type is added. Therefore, the microcrystalline semiconductor film, the semiconductor film to which the impurity element imparting one conductivity type is added, and the source and drain electrodes reflect the same shape. When the films are etched by one etching step in the above manner, the manufacturing process can be simplified and the number of masks used for the etching step can be reduced.

The microcrystalline semiconductor film, the semiconductor film to which the impurity element imparting one conductivity is added, and the conductive films are etched to form the microcrystalline semiconductor film 261, the source and drain regions 272, and the source and drain electrodes 271a to 271c.

The impurity element imparting one conductivity type is added to the microcrystalline semiconductor film 261 through the channel protective layer 280, using the source and drain electrodes 271a to 271c as masks. As a result, the impurity region 281 and the non-doped regions 262a and 262b are formed as selected in the channel formation region of the microcrystalline semiconductor film 261. The impurity region 281, which is a channel doped region, is formed as selected in the channel formation region because the channel formation region of the microcrystalline semiconductor film 261 is a region covered with the channel protective layer 280. The impurity element can be added (introduced) to the microcrystalline semiconductor film 261 by an ion implantation method or an ion doping method.

In this embodiment mode, the impurity element is added to the microcrystalline semiconductor film 261 through the channel protective layer 280; thus, damage (e.g., a rough surface) in a step of adding the impurity element to the microcrystalline semiconductor film 261 can be alleviated.

Figure 6A:
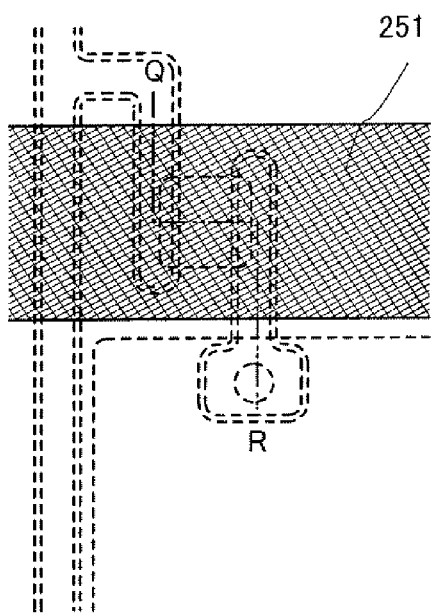
FIGS. 6A to 6D are drawings illustrating a method for manufacturing a display device of an embodiment mode of the present invention.
Figure 6B:
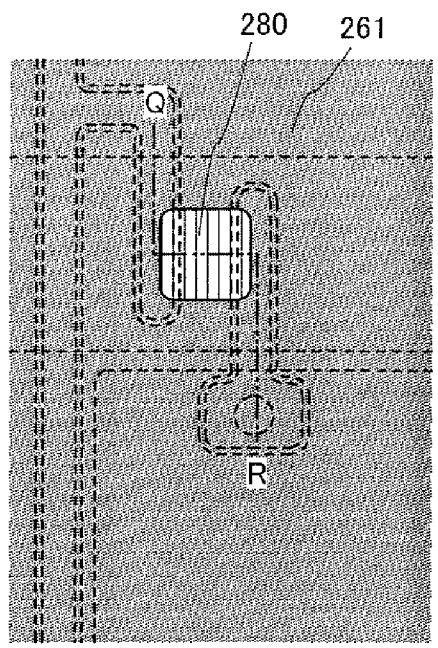
Figure 6C:
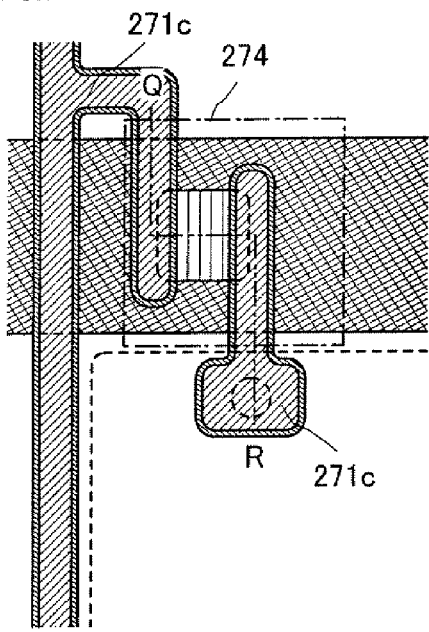
Figure 6D:
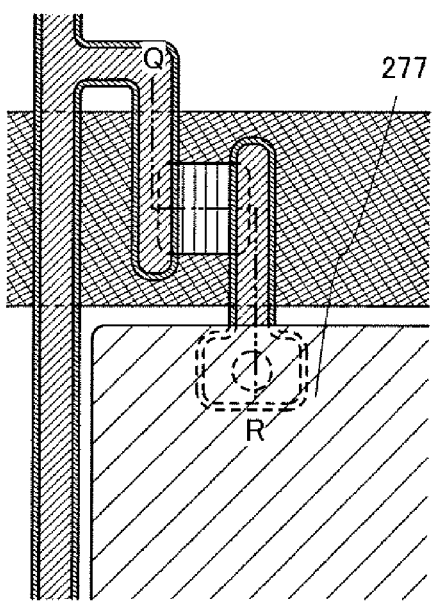

Through the above process, the channel stop thin film transistor 274 is formed (see FIG. 6C). Further, the insulating film 276 is formed to cover the thin film transistor 274 and the contact hole is formed to reach the source or drain electrode 271c. The pixel electrode 277 is formed in the contact hole to connect the thin film transistor 274 electrically to the pixel electrode 277 (see FIG. 6D).

The end portions of the source and drain regions and those of the source and drain electrodes may be aligned. FIG. 15 shows a thin film transistor 279 of a channel stop type in which end portions of source and drain regions and those of source and drain electrodes are aligned. When the source and drain electrodes and the source and drain regions are subjected to dry etching, a shape like the thin film transistor 279 can be obtained. Alternatively, also when a semiconductor film to which an impurity element imparting one conductivity type is added is etched using source and drain electrodes as masks to form source and drain regions, a shape like the thin film transistor 279 can be obtained.

A channel stop thin film transistor can have improved reliability. In addition, a field effect mobility of from 1 to 20 cm$^2$/V·sec can be achieved by forming a channel formation region using a microcrystalline semiconductor film. Therefore, the thin film transistor can be used as a switching element of a pixel in a pixel portion, and further as an element included in a driver circuit on a scanning line (or a gate line) side.

According to this embodiment mode, a display device having a thin film transistor with high electric characteristics and high reliability can be manufactured.

Embodiment Mode 3

This embodiment mode describes an example of a manufacturing process in which a microcrystalline semiconductor film is irradiated with laser light.

A gate electrode is formed over a substrate and a gate insulating film is formed so as to cover the gate electrode. Further, a microcrystalline silicon (SAS) film is deposited as a microcrystalline semiconductor film over the gate insulating film. The microcrystalline semiconductor film may have a thickness of greater than or equal to 1 nm and less than 15 nm, preferably from 2 to 10 nm inclusive. In particular, the microcrystalline semiconductor film with a thickness of 5 nm (from 4 to 8 nm) has a high absorptance with respect to laser light and improves productivity.

When a microcrystalline semiconductor film is formed over a gate insulating film by a plasma CVD method or the like, a region (referred to as an interface region here) which includes more amorphous components than the semiconductor film including crystals is formed in the vicinity of an interface between the gate insulating film and the semiconductor film, in some cases. Further, when an ultrathin microcrystalline semiconductor film with a thickness of approximately 10 nm or less is formed by a plasma CVD method or the like, it is difficult to obtain a semiconductor film including microcrystal grains with high quality uniformly throughout the film although a semiconductor film including microcrystal grains can be formed. In such cases, a laser process in which the microcrystalline semiconductor film is irradiated with laser light, which is presented below, is effective.

Subsequently, irradiation with laser light is performed from a surface of the microcrystalline silicon film side. The irradiation is performed with such energy that the laser light does not melt the microcrystalline silicon film. That is to say, a laser process (also referred to as "LP," hereinafter) according to this embodiment mode proceeds by solid phase crystal growth, in which the microcrystalline silicon film is processed by radiation heat without being melted. In other words, the laser process according to this embodiment mode utilizes a critical region where the deposited microcrystalline silicon film does not turn into a liquid phase. In that sense, the process can also be referred to as "critical growth."

The laser light can affect a region to the interface between the microcrystalline silicon film and the gate insulating film, whereby a crystal on the surface side of the microcrystalline silicon film grows in a solid phase, functioning as a nucleus, from the surface to an interface between the microcrystalline silicon film and the insulating film; thus, a crystal in a column-like shape grows. Solid phase crystal growth by an LP improves the crystallinity in a direction of a film thickness instead of increasing a crystal diameter.

In the LP, by condensing the laser light in a rectangular form with a long length (linear laser light), the microcrystalline silicon film over a glass substrate of 730 mm×920 mm, for example, can be scanned with the laser light only for one time. In such a case, an overlap rate of the linear laser light set to be from 0 to 90% (preferably from 0 to 67%). Accordingly, process time of each substrate can be shortened and productivity can be improved. The form of the laser light is not limited to a linear four, and planar light can also be used in the LP similarly. Further, the LP can be applied to substrates with various sizes without limitation to the above size of the glass substrate.

The LP has effects of improving the crystallinity of the interface region with the gate insulating film and improving the electric characteristics of a thin film transistor with a bottom gate structure like the thin film transistor of this embodiment mode.

A feature of such critical growth is that planarity is maintained on a surface of silicon which has undergone the LP, which is different from conventional low-temperature polysilicon, which has a rough surface (a convex body called a "ridge").

As in this embodiment mode, the crystalline silicon film obtained by applying the laser light directly to the deposited microcrystalline silicon film undoubtedly has a different growth mechanism and film quality from those of a conventional as-deposited microcrystalline silicon film or a microcrystalline silicon film which is changed in quality by heat conduction (in Reference 3: Toshiaki Arai et al., "SID 07 DIGEST" 2007, pp. 1370-1373). In this specification, a crystalline semiconductor film obtained by performing an LP to a deposited microcrystalline semiconductor film is called an LPSAS film.

In following steps, a channel protective layer is formed in a similar manner to Embodiment Mode 1 and a mask is formed thereover. Subsequently, the microcrystalline semiconductor film is etched using the mask to be separated. Next, a semiconductor film to which an impurity element imparting one conductivity type is added and a conductive film are formed, and a mask is formed over the conductive film. Then, the conductive film is etched using the mask to be separated, so that a source electrode and a drain electrode are formed. The semiconductor film to which the impurity element imparting one conductivity type is added is etched using the above mask, with the channel protective layer functioning as an etch stopper, so that a source region and a drain region are formed. Further, an impurity element imparting one conductivity type is added to the microcrystalline semiconductor film through the channel protective layer, using the above mask or using the source and drain electrodes as masks, so that an impurity region, which is a channel doped region, is formed as selected in a channel formation region of the microcrystalline semiconductor film.

Through the above process, a channel stop thin film transistor can be formed and a display device including the channel stop thin film transistor can be manufactured.

This embodiment mode can be combined as appropriated with Embodiment Mode 1 or 2.

Embodiment Mode 4

This embodiment mode presents an example in which a method for manufacturing a thin film transistor is partly different from that shown in Embodiment Mode 1. Therefore, the other parts can be made in a similar manner to Embodiment Mode 1, and the same parts or parts having similar functions, or steps for making such parts are not repeatedly described.

In this embodiment mode, after adding an impurity element imparting one conductivity type to a microcrystalline semiconductor film of a thin film transistor included in the display device shown in Embodiment Mode 1 to form an impurity region in order to control the threshold value, the impurity region is irradiated with laser through a channel protective layer. The laser light irradiation can activate the impurity region and improve the crystallinity, and thus effect of the channel doping process can be enhanced. Further, the microcrystalline semiconductor film can efficiently be irradiated with laser because the channel protective layer functions as an anti-reflection film against laser light.

Figure 31A:
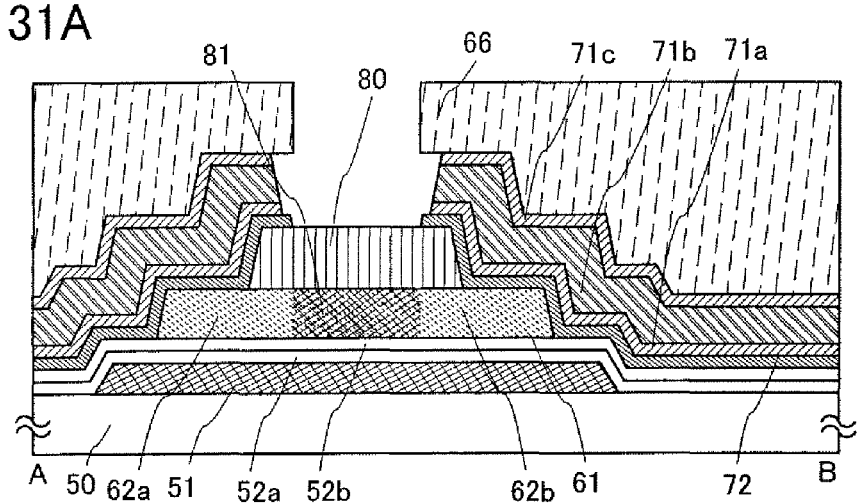
FIGS. 31A to 31C are drawings illustrating a method for manufacturing a display device of an embodiment mode of the present invention.
Figure 31B:
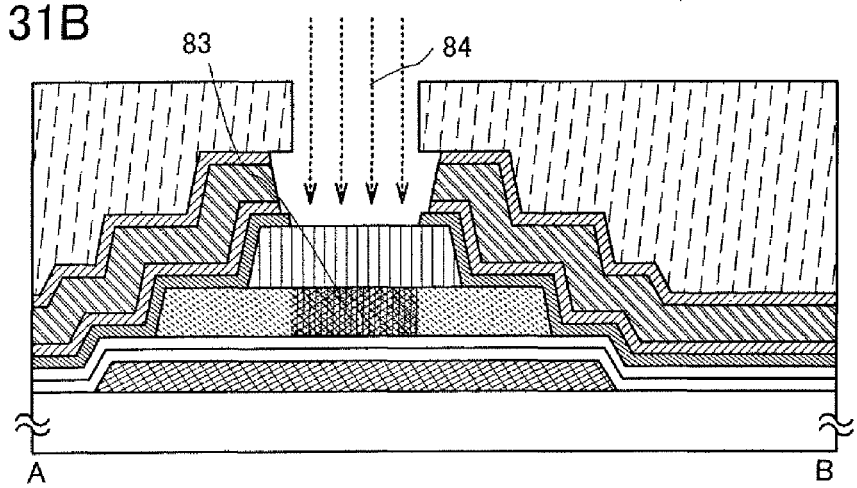
Figure 31C:
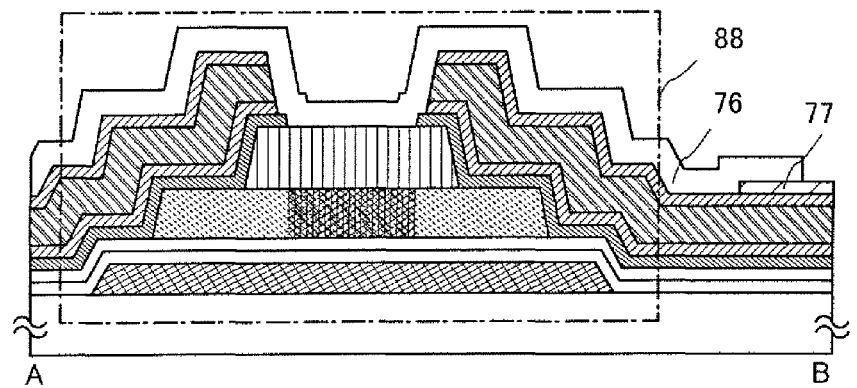

A channel stop thin film transistor 88 with a bottom gate structure and a manufacturing method thereof of this embodiment mode are shown in FIGS. 31A to 31C.

Figure 3B:
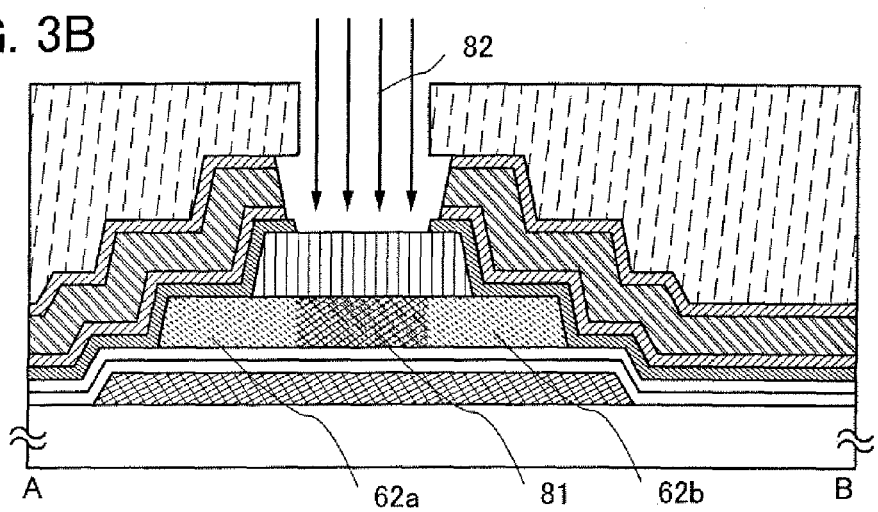

FIG. 31A shows a step of manufacturing the thin film transistor 74 shown in Embodiment Mode 1 in which the process up to the step shown in FIG. 3B has been finished. In FIG. 31A, the gate electrode 51, the gate insulating films 52a and 52b, the microcrystalline semiconductor film 61, the channel protective layer 80, the source and drain regions 72, the source and drain electrodes 71a, 71b, and 71c, and the mask 66 are formed over the substrate 50. In the channel formation region of the microcrystalline semiconductor film 61, the impurity region 81, to which the impurity element imparting one conductivity type is added, is provided as selected in a region which does not overlap with the source and drain electrodes 71a, 71b, and 71c; the non-doped regions 62a and 62b, to which the impurity element imparting one conductivity type is not added, are provided between the impurity region 81 and the source and drain regions 72.

The microcrystalline semiconductor film 61 may undergo a laser irradiation process as shown in Embodiment Mode 3.

The impurity region 81, which is formed as selected in the channel formation region of the microcrystalline semiconductor film 61, is irradiated with laser light 84 through the channel protective layer 80. The irradiation with the laser light 84 changes the impurity region 81 in quality to make an impurity region 83 (see FIG. 31B). The irradiation with the laser light 84 can activate the impurity region and improve the crystallinity, and thus effect of the channel doping process can be enhanced. Further, the microcrystalline semiconductor film 61 can efficiently be irradiated with the laser light because the channel protective layer 80 functions as an anti-reflection film against the laser light 84. Further, the channel protective layer 80 also functions as a protective layer, and can prevent damage such as a rough surface or deformation of the microcrystalline semiconductor film 61 which is caused by the laser irradiation.

Irradiation conditions (e.g., light energy, wavelength, and irradiation time) in the irradiation step for the impurity region, which is the channel doped region of the microcrystalline semiconductor film, may be set as appropriate in accordance with the material or the thickness of the channel protective layer, through which the light passes, the material or the thickness of the microcrystalline semiconductor film, or the like.

As a laser for emitting the laser light 84, a continuous wave laser, a quasi-continuous wave laser, or a pulsed laser can be used. For example, a gas laser such as an excimer laser (e.g., a KrF laser), an Ar laser, or a Kr laser can be given. Further, a solid-state laser such as a YAG laser, a $YVO_4$ laser, a YLF laser, a $YAlO_3$ laser, a $GdVO_4$ laser, a KGW laser, a KYW laser, an alexandrite laser, a Ti:sapphire laser, a $Y_2O_3$ laser, or the like can be given. An excimer laser is a pulsed laser, and some solid-state lasers such as a YAG laser can be used as any of a continuous wave laser, a quasi-continuous wave laser, and a pulsed laser. In a solid-state laser, the second to fifth harmonic is preferably used. Further alternatively, a semiconductor laser such as a GaN laser, a GaAs laser, a GaAlAs laser, or an InGaAsP laser can be used.

Further, lamp light may also be used. For example, light emitted from an ultraviolet ray lamp, a black light lamp, a halogen lamp, a metal halide lamp, a xenon arc lamp, a carbon arc lamp, a high pressure sodium lamp, or a high pressure mercury lamp may be used.

Through the above process, the channel stop thin film transistor 88 is formed. Further, the insulating film 76 is formed to cover the thin film transistor 88 and the contact hole is formed to reach the source or drain electrode 71c. The pixel electrode 77 is formed in the contact hole to connect the thin film transistor 88 electrically to the pixel electrode 77 (see FIG. 31C).

Further, the end portions of the source and drain regions may be aligned with those of the source and drain electrodes. A thin film transistor in which end portions of source and drain regions are aligned with those of source and drain electrodes can be formed as follows: a conductive film for the source and drain electrodes and a semiconductor film for the source and drain regions are dry-etched; or a semiconductor film to which an impurity element imparting one conductivity type is added is etched using the source and drain electrodes as masks to form the source and drain regions.

It is needless to say that the laser light irradiation process for the channel doped region which is shown in this embodiment mode can also be applied to the thin film transistor 274 shown in Embodiment Mode 2. Irradiating the impurity region 281 with laser light can further improve the effect of the channel doping process.

A channel stop thin film transistor can have improved reliability. In addition, a field effect mobility of from 1 to 20 cm$^2$/V·sec can be achieved by forming a channel formation region using a microcrystalline semiconductor film. Therefore, the thin film transistor can be used as a switching element of a pixel in a pixel portion, and further as an element included in a driver circuit on a scanning line (or a gate line) side.

Control of the threshold voltage by a channel doping method is carried out by the concentration of an impurity element. In this embodiment mode, channel doping is performed so as to form a channel doped region as selected, not on the entire channel formation region. Therefore, in the present invention, the threshold voltage can be controlled more precisely by controlling the area of the channel formation region. In the case where the impurity element is added to the microcrystalline semiconductor film through the channel protective layer, it is difficult to control the concentration of the impurity element in the microcrystalline semiconductor film which is implanted deeply in a film-thickness direction and the concentration tends to vary, and there is a fear of damage to the film because the addition of the impurity element needs to be performed with energy high enough to allow the impurity element to pass through the channel protective layer. According to the present invention, film damage to the microcrystalline semiconductor film can be prevented and the threshold value can be controlled more accurately and uniformly. Further, irradiating the channel doped region with laser light can further improve the effect of the channel doping process.

According to this embodiment mode, a display device having a thin film transistor with high electric characteristics and high reliability can be manufactured.

Embodiment Mode 5

This embodiment mode describes an example of the method for manufacturing a display device of Embodiment Modes 1 to 4 in detail. Therefore, the same parts as in Embodiment Modes 1 to 4 or parts having similar functions to Embodiment Modes 1 to 4, or steps for making such parts are not repeatedly described.

Before forming the microcrystalline semiconductor film in Embodiment Modes 1 to 4, a reaction chamber may be subjected to cleaning and flushing (washing) treatment (e.g., hydrogen flushing in which hydrogen is used as a flushing substance, or silane flushing in which silane is used as a flushing substance). The flushing treatment can prevent impurities such as oxygen, nitrogen, or fluorine in the reaction chamber from contaminating the film to be deposited.

The flushing treatment can remove impurities such as oxygen, nitrogen, or fluorine in the reaction chamber. For example, with the use of a plasma CVD apparatus, silane flushing treatment is performed using monosilane as a flushing substance, by introducing a gas into a chamber at a flow rate of from 8 to 10 SLM for from 5 to 20 minutes, preferably from 10 to 15 minutes. 1 SLM is equal to 1000 sccm, i.e., 0.06 m$^3$/h.

The cleaning can be performed with fluorine radicals, for example. Fluorine radicals can clean an inside of a reaction chamber by introducing carbon fluoride, nitrogen fluoride, or fluorine into a plasma generator provided for an outside of the reaction chamber, dissociating the introduced substance, and introducing the generated fluorine radicals into the reaction chamber.

The flushing treatment may be performed before forming a gate insulating film, a channel protective layer, and a semiconductor film to which an impurity element imparting one conductivity type is added. Note that the flushing treatment is effective if performed after the cleaning treatment.

Before placing a substrate in the reaction chamber and forming a film thereover, a protective film may be formed on an inner wall of each reaction chamber using the same kind of film as that to be deposited, to perform coating (also referred to as precoating treatment). In the precoating treatment, a film formation gas is fed into a reaction chamber and plasma treatment is performed, thereby coating the inside of the reaction chamber with a thin protective film. For example, before forming a microcrystalline silicon film as the microcrystalline semiconductor film, the inside of the reaction chamber may be covered with an amorphous silicon film with a thickness of from 0.2 to 0.4 µm to perform precoating treatment. Flushing treatment (e.g., hydrogen flushing or silane flushing) may also be performed after the precoating treatment. If the cleaning treatment and the precoating treatment is performed, the substrate needs to be taken out of the reaction chamber. However, if only the flushing treatment (e.g., hydrogen flushing or silane flushing) is performed, the substrate may be left in the treatment chamber because plasma treatment is not performed.

If a protective film formed of an amorphous silicon film is formed in the reaction chamber for forming the microcrystalline silicon film, and hydrogen plasma treatment is performed before forming the microcrystalline silicon film, the protective film is etched and a slight amount of silicon is deposited over the substrate, thereby serving as a nucleus of crystal growth.

The precoating treatment can prevent an impurity element such as oxygen, nitrogen, or fluorine in the reaction chamber from contaminating the film to be deposited.

The precoating treatment may also be performed before forming the gate insulating film and the semiconductor film to which the impurity element imparting one conductivity type is added.

Further, an example of a method for forming a gate insulating film and a microcrystalline semiconductor film is described in detail.

Figure 13A:
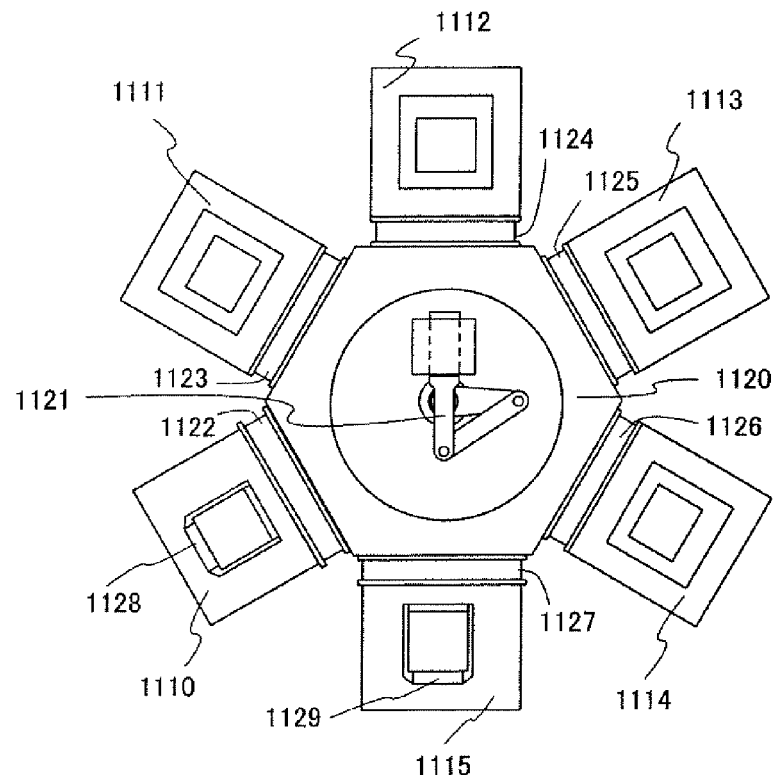
FIGS. 13A and 13B are plan views illustrating a plasma CVD apparatus of some embodiment modes of the present invention.
Figure 13B:
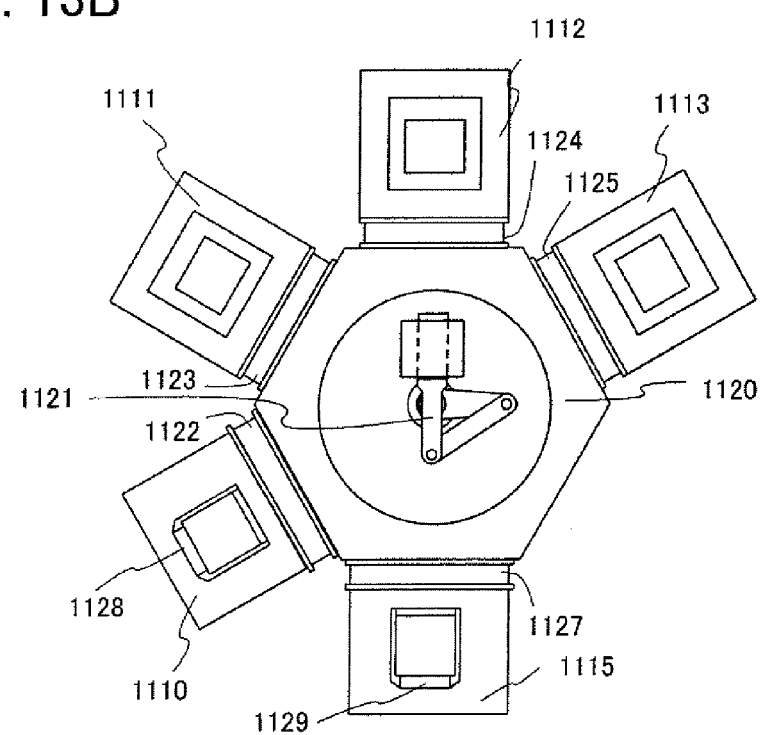

Examples of a plasma CVD apparatus which can be used in the present invention are described with reference to FIGS. 13A and 13B. FIGS. 13A and 13B each show a microwave plasma CVD apparatus capable of successive film formation. FIGS. 13A and 13B are cross-sectional views which schematically show a microwave plasma CVD apparatus from above. A common chamber 1120 is provided around with a load chamber 1110, an unload chamber 1115, and reaction chambers (1) 1111 to (4) 1114. Gate valves 1122 to 1127 are provided between the common chamber 1120 and the chambers so that treatment in each chamber does not have influence on treatment in other chambers. The number of reaction chambers is not limited to four, and may be more than or less than four. When many reaction chambers are provided, each reaction chamber can be allocated to each kind of the films to be stacked, whereby the number of cleaning a reaction chamber can be reduced. FIG. 13A shows an example of a microwave plasma CVD apparatus having four reaction chambers, and FIG. 13B shows an example of a microwave plasma CVD apparatus having three reaction chambers.

An example is described in which a gate insulating layer, a microcrystalline semiconductor film, and a channel protective layer are formed with the plasma CVD apparatus shown in FIG. 13A. Substrates are set in a cassette 1128 of the load chamber 1110 and a cassette 1129 of the unload chamber 1115, respectively, and transferred to the reaction chambers (1) 1111 to (4) 1114 by a transfer unit 1121 of the common chamber 1120. This apparatus can limit the kind of the film to be stacked to each reaction chamber, and plural kinds of films can be formed successively without being exposed to the atmosphere. Further, the reaction chamber may be used for an etching process or a laser irradiation process, as well as the film formation process. When reaction chambers in which various processes are carried out are provided, the plural different processes can be carried out without exposing the films and layers to the atmosphere.

The gate insulating film, the microcrystalline semiconductor film, and the channel protective layer are formed in each of the reaction chambers (1) to (4). At this time, plural kinds of films can be stacked successively by changing source gases. At this time, after forming the gate insulating film, silicon hydride such as silane is introduced into the reaction chamber, whereby an oxygen residue and the silicon hydride react with each other; and then a reactant is discharged to an outside of the reaction chamber; thus, the concentration of the oxygen residue in the reaction chamber can be reduced. As a result, the concentration of oxygen in the microcrystalline semiconductor film can be reduced. Further, oxidation of a crystal grain in the microcrystalline semiconductor film can be prevented.

Further, in a plasma CVD apparatus, one kind of films may be formed in a plurality of reaction chambers in order to improve productivity. When one kind of films can be formed in a plurality of reaction chambers, the films can be formed over a plurality of substrates at the same time. For example, in FIG. 13A, the reaction chambers (1) and (2) are each used for forming a microcrystalline semiconductor film; the reaction chamber (3) is used for forming an amorphous semiconductor film; and the reaction chamber (4) is used for forming a channel protective layer. When a plurality of substrates are processed at the same time in such a manner, productivity can be improved by providing a plurality of reaction chambers in each of which a film with a low deposition rate is formed.

Before taking a substrate into the reaction chamber and forming a film thereover, it is preferable that cleaning or flushing (washing) treatment (e.g., hydrogen flush or silane flush) be carried out and a protective film be formed on an inner wall of each reaction chamber using the same kind of film as that to be deposited, to perform coating (also referred to as precoating treatment). In the precoating treatment, a film formation gas is fed into a reaction chamber and plasma treatment is performed, thereby coating the inside of the reaction chamber with a thin protective film. For example, before forming a microcrystalline silicon film as the microcrystalline semiconductor film, the inside of the reaction chamber may be covered with an amorphous silicon film with a thickness of from 0.2 to 0.4 µm to perform precoating treatment. Flushing treatment (e.g., hydrogen flush or silane flush) may be performed after the precoating treatment. If the cleaning treatment and the precoating treatment is performed, the substrate needs to be taken out of the reaction chamber. However, if only the flushing treatment (e.g., hydrogen flush or silane flush) is performed, the substrate may be left in the treatment chamber because plasma treatment is not performed.

If a protective film formed of an amorphous silicon film is formed in the reaction chamber for forming the microcrystalline silicon film, and hydrogen plasma treatment is performed before forming the microcrystalline silicon film, the protective film is etched and a slight amount of silicon is deposited over the substrate, thereby serving as a nucleus of crystal growth.

In this manner, with the use of the microwave plasma CVD apparatus in which the plurality of chambers are provided, the gate insulating film, the microcrystalline semiconductor film, the channel protective layer, and the semiconductor film to which the impurity element imparting one conductivity type is added can be formed at the same time, so that the mass productivity can be enhanced. Further, also when some reaction chamber is being subjected to maintenance or cleaning, the films or the layer can be formed in other reaction chambers, and the films or the layer can be formed efficiently. In addition, the films or the layer can be formed without any contamination of the interface with atmospheric components or impurity elements included in the atmosphere; thus, variations in characteristics of the thin film transistors can be reduced.

With the use of the microwave plasma CVD apparatus having such a structure, similar kinds of films or one kind of film can be formed in their respective reaction chambers, and the films can be formed successively without being exposed to the atmosphere. Thus, the films can be formed without any contamination of each interface with a residue of another film which has already been formed or impurity elements included in the atmosphere.

Further, a microwave generator and a high frequency wave generator may be provided, and the gate insulating film, the microcrystalline semiconductor film, the channel protective layer, and the semiconductor film to which the impurity element imparting one conductivity type is added may be fat ed by a microwave plasma CVD method.

Although the microwave plasma CVD apparatus shown in FIG. 13A or 13B is provided with the load chamber and the unload chamber separately, a load chamber and an unload chamber may be combined and a load/unload chamber may be provided. In addition, the microwave plasma CVD apparatus may be provided with a spare chamber. By pre-heating the substrate in the spare chamber, it is possible to shorten heating time before formation of the film in each reaction chamber, so that the throughput can be improved. For the above film formation treatment, a gas may be selected from gases in a gas supply portion in accordance with an object of the film formation.

This embodiment mode can be carried out in combination of another structure described in another embodiment mode as appropriate.

Embodiment Mode 6

Next, a process for manufacturing a display device is described with reference to FIGS. 10A and 10B and FIGS. 11A to 11C. Here, a light-emitting element utilizing electroluminescence is shown as a display element included in the display device. Light-emitting elements utilizing electroluminescence are classified into two types according to whether the light-emitting material is an organic compound or an inorganic compound: in general, the former is referred to as an organic EL element and the latter is referred to as an inorganic EL element. Further, thin film transistors 85 and 86 used for the display device can be manufactured in a similar manner to the thin film transistor 74 shown in Embodiment Mode 1, and have high electric characteristics and high reliability. Furthermore, the thin film transistor 274 shown in Embodiment Mode 2 or the thin film transistor 88 shown in Embodiment Mode 4 can be used as the thin film transistors 85 and 86.

The thin film transistors 85 and 86 each have an impurity region (a "channel doped region") as selected in a channel formation region of a microcrystalline semiconductor film. In the thin film transistors 85 and 86, boron, which is an impurity element imparting p-type conductivity, is added as an impurity element imparting one conductivity type as selected to the microcrystalline semiconductor film to form the impurity region, thereby controlling the threshold voltages of the transistors. In such a manner, non-doped regions are provided in the microcrystalline semiconductor film. The non-doped regions are provided between the region having an opposite conductivity type to carriers and a source region and a drain region. This structure causes produces effects of alleviating an electric field in the vicinity of a drain and preventing deterioration due to injection of hot carriers.

In an organic EL element, voltage is applied to the light-emitting element, so that electrons are injected from an electrode into a layer including a light-emitting organic compound, and holes are injected from the other electrode into the layer including the light-emitting organic compound, and there flows electric current. These carriers (electrons and holes) are recombined, so that the light-emitting organic compound is placed in an excited state. The light-emitting organic compound emits light in returning to a ground state from the excited state. Because of such mechanism, such a light-emitting element is called a "light-emitting element of a current excitation type".

Inorganic EL elements are classified into dispersive inorganic EL elements and thin film inorganic EL elements. A dispersive inorganic EL element includes a light-emitting layer in which particles of a light-emitting material are dispersed in a binder, and light emission mechanism thereof is donor-acceptor recombination light emission, in which a donor level and an acceptor level are utilized. In a thin film inorganic EL element, a light-emitting layer is sandwiched between dielectric layers, and the dielectric layers are sandwiched between electrodes. Light emission mechanism of the thin film inorganic EL element is local light emission, in which inner-shell electron transition of a metal ion is utilized. Here, an organic EL element is described as a light-emitting element. In this example, further, the channel stop thin film transistor shown in FIG. 1 in Embodiment Mode 1 is shown as a thin film transistor for controlling the drive of the light-emitting element.

Through the steps shown in FIG. 1, FIGS. 2A to 2E, FIGS. 3A to 3C, and FIGS. 4A to 4D, thin film transistors 85 and 86 are formed over a substrate 100, and an insulating film 87 serving as a protective film is formed over the thin film transistors 85 and 86, as shown in FIG. 10A. Subsequently, a planarizing film 111 is formed over the insulating film 87, and a pixel electrode 112 that is connected to a source or drain electrode of the thin film transistor 86 is formed over the planarizing film 111.

It is preferable to form the planarizing film 111 using an organic resin such as acrylic, polyimide, or polyamide, or siloxane.

In FIG. 10A, it is preferable to use a cathode as the pixel electrode 112 because the thin film transistor of a pixel is an n-channel TFT; if the thin film transistor of the pixel is a p-channel TFT, it is preferable to use an anode as the pixel electrode 112. Specifically, for the cathode, a material with a low work function, such as Ca, Al, CaF, MgAg, or AlLi can be used.

Subsequently, as shown in FIG. 10B, a partition wall 113 is formed over the planarizing film 111 and an end portion of the pixel electrode 112. The partition wall 113 has an opening portion, and the pixel electrode 112 is exposed in the opening portion, The partition wall 113 is formed using an organic resin film, an inorganic insulating film, or an organic polysiloxane film. In particular, it is preferable that the partition wall 113 be formed of a photosensitive material, and the opening portion be formed over the pixel electrode, and a side wall of the opening portion form an inclined surface with a continuous curvature.

Then, a light-emitting layer 114 is formed so as to be in contact with the pixel electrode 112 in the opening portion of the partition wall 113. The light-emitting layer 114 may be formed using a single layer or by stacking a plurality of layers.

Subsequently, a common electrode 115 is formed using an anode material so as to cover the light-emitting layer 114. The common electrode 115 can be formed using a light-transmitting conductive film which is formed using a light-transmitting conductive material and is given as the pixel electrode 77 in Embodiment Mode 1. The common electrode 115 may also be formed using a titanium nitride film or a titanium film instead of the above light-transmitting conductive film. In FIG. 10B, the common electrode 115 is formed using ITO. In the opening portion of the partition wall 113, the pixel electrode 112, the light-emitting layer 114, and the common electrode 115 overlap with each other, so that a light-emitting element 117 is formed. After that, a protective film 116 is preferably formed over the common electrode 115 and the partition wall 113 so that oxygen, hydrogen, moisture, carbon dioxide, or the like does not enter the light-emitting element 117. As the protective film 116, a silicon nitride film, a silicon nitride oxide film, a DLC film, or the like can be formed.

Further, in a practical case, it is preferable that a display device completed to the state illustrated in FIG. 10B be packaged (sealed) with a protective film (e.g., an attachment film or an ultraviolet curable resin film) or a cover material with high air-tightness and little degasification so that the display device is not exposed to outside air.

Next, structures of a light-emitting element is described with reference to FIGS. 11A to 11C. Cross-sectional structures of a pixel are described by taking an n-channel driving TFT as an example. Driving TFTs 7001, 7011, and 7021 used for display devices in FIGS. 11A, 11B, and 11C, respectively, can be manufactured in a similar manner to the thin film transistor 74 shown in Embodiment Mode 1, and have high electric characteristics and high reliability. Furthermore, the thin film transistor 274 shown in Embodiment Mode 2 or the thin film transistor 88 shown in Embodiment Mode 4 can be used as the TFTs 7001, 7011, and 7021.

In order to extract light emission of the light-emitting element, at least one of an anode and a cathode may be transparent. A thin film transistor and a light-emitting element are formed over a substrate. A light-emitting element can have a top emission structure, in which light emission is extracted through the surface opposite to the substrate; a bottom emission structure, in which light emission is extracted through the surface on the substrate side; or a dual emission structure, in which light emission is extracted through the surface opposite to the substrate and the surface on the substrate side. The pixel structure of the present invention can be applied to a light-emitting element having any of these emission structures.

A light-emitting element having a top emission structure is described with reference to FIG. 11A.

Figure 11A:
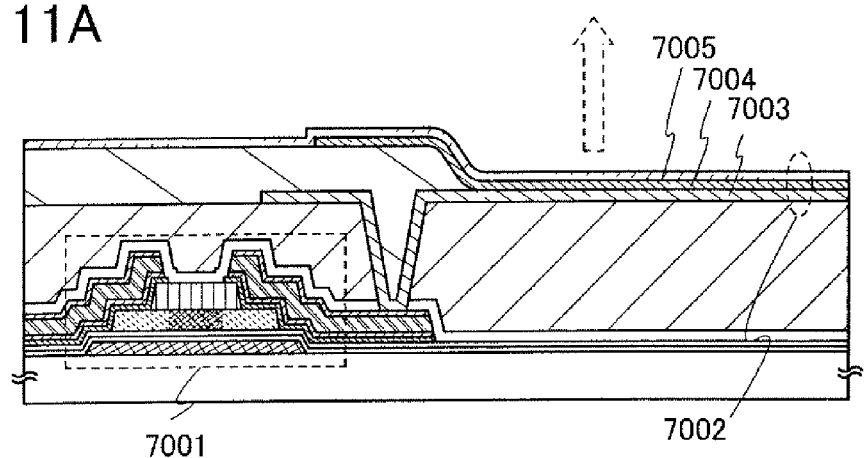
FIGS. 11A to 11C are drawings illustrating methods for manufacturing a display device of some embodiment modes of the present invention.

FIG. 11A is a cross-sectional view of a pixel in a case where the driving 11.1 7001 is an n-channel TFT, and light generated in a light-emitting element 7002 is emitted to pass through an anode 7005. In FIG. 11A, a cathode 7003 of the light-emitting element 7002 and the driving TFT 7001 are electrically connected to each other. A light-emitting layer 7004 and the anode 7005 are stacked in order over the cathode 7003. As the cathode 7003, any conductive film can be used as long as it has a low work function and reflects light. For example, Ca, Al, CaF, MgAg, AlLi, or the like is preferably used. The light-emitting layer 7004 may be formed using a single layer or by stacking a plurality of layers. If the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in this order over the cathode 7003. It is not necessary to form all of these layers. The anode 7005 is formed using a light-transmitting conductive film such as a film of indium oxide including tungsten oxide, indium zinc oxide including tungsten oxide, indium oxide including titanium oxide, indium tin oxide including titanium oxide, indium tin oxide (also referred to as ITO), indium zinc oxide, or indium tin oxide to which silicon oxide is added.

The light-emitting element 7002 corresponds to a region where the cathode 7003 and the anode 7005 sandwich the light-emitting layer 7004. In the pixel illustrated in FIG. 11A, light generated in the light-emitting element 7002 is emitted to pass through the anode 7005 as shown with an arrow.

Next, a light-emitting element having a bottom emission structure is described with reference to FIG. 11B. FIG. 11B is a cross-sectional view of a pixel in a case where the driving TFT 7011 is an n-channel TFT, and light generated in a light-emitting element 7012 is emitted to pass through a cathode 7013. In FIG. 11B, the cathode 7013 of the light-emitting element 7012 is formed over a light-transmitting conductive film 7017 that is electrically connected to the driving TFT 7011, and a light-emitting layer 7014 and an anode 7015 are stacked in order over the cathode 7013. A blocking film 7016 for reflecting or blocking light may be formed so as to cover the anode 7015 when the anode 7015 has a light-transmitting property. As the cathode 7013, any conductive material can be used as in the case of FIG. 11A as long as it has a low work function. The cathode 7013 has a thickness that can transmit light (preferably from 5 to 30 nm approximately). For example, an Al film having a thickness of 20 nm can be used as the cathode 7013. The light-emitting layer 7014 may be formed of a single layer or by stacking a plurality of layers as in the case of FIG. 11A. The anode 7015 is not required to transmit light, but can be formed using a light-transmitting conductive material as in the case of FIG. 11A. For the blocking film 7016, a metal or the like that reflects light can be used; however, it is not limited to a metal film. For example, a resin or the like to which black pigments are added can be used.

The light-emitting element 7012 corresponds to a region where the cathode 7013 and the anode 7015 sandwich the light-emitting layer 7014. In the pixel illustrated in FIG. 11B, light generated in the light-emitting element 7012 is emitted to pass through the cathode 7013 as shown with an arrow.

Next, a light-emitting element having a dual emission structure is described with reference to FIG. 11C. In FIG. 11C, a cathode 7023 of a light-emitting element 7022 is formed over a light-transmitting conductive film 7027 that is electrically connected to the driving TFT 7021, and a light-emitting layer 7024 and an anode 7025 are stacked in order over the cathode 7023. As the cathode 7023, any conductive material can be used as long as it has a low work function as in the case of FIG. 11A. The cathode 7023 has a thickness that can transmit light. For example, an Al film having a thickness of 20 nm can be used as the cathode 7023. The light-emitting layer 7024 may be formed using a single layer or by stacking a plurality of layers as in the case of FIG. 11A. The anode 7025 can be formed using a light-transmitting conductive material as in the case of FIG. 11A.

The light-emitting element 7022 corresponds to a portion where the cathode 7023 and the anode 7025 sandwich the light-emitting layer 7024. In the pixel illustrated in FIG. 11C, light generated in the light-emitting element 7022 is emitted to pass through both the anode 7025 and the cathode 7023 as shown with arrows.

Although an organic EL element is described as a light-emitting element here, it is also possible to provide an inorganic EL element as a light-emitting element.

This embodiment mode describes an example in which a thin film transistor for controlling the drive of a light-emitting element (the driving TFT) is electrically connected to the light-emitting element. However, a current control TFT may be formed between the driving TFT and the light-emitting element to be connected to them.

Figure 11B:
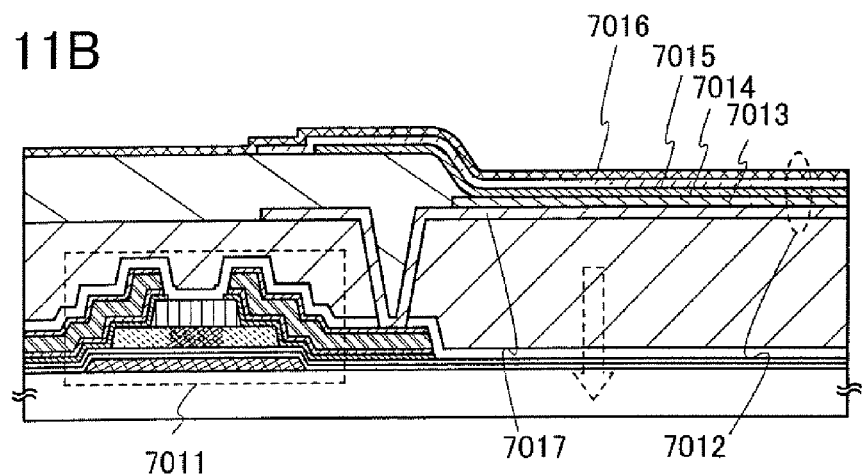
Figure 11C:
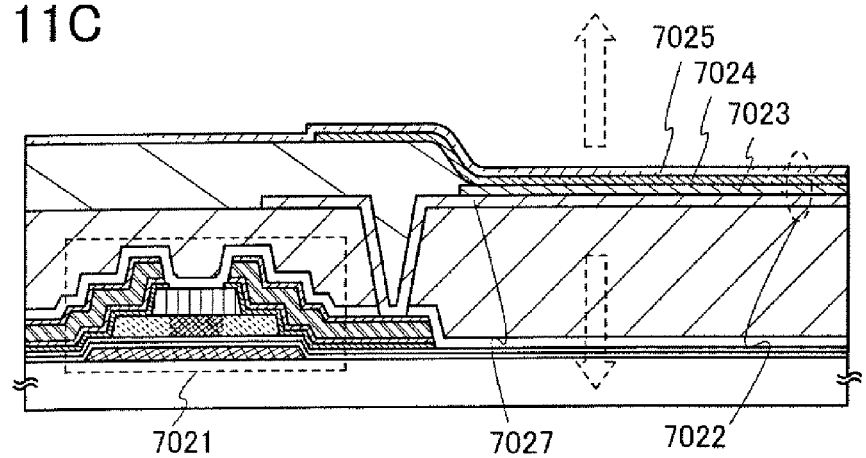

Display devices described in this embodiment mode are not limited to the structures illustrated in FIGS. 11A to 11C, and can be changed in various ways based on the spirit of techniques according to the present invention.

Through the above process, a light-emitting device can be manufactured as a display device. The light-emitting device in this embodiment mode has high contrast and high visibility because a thin film transistor with high electric characteristics and high reliability is used in the light-emitting device.

This embodiment mode can be carried out in combination of another structure described in another embodiment mode as appropriate.

Embodiment Mode 7

This embodiment mode describes examples of a display device including the thin film transistor presented in any of Embodiment Modes 1 to 5, with reference to FIG. 17 to FIG. 30. This embodiment mode describes examples of a liquid crystal display device, in which a liquid crystal element is used as a display element, with reference to FIG. 17 to FIG. 30. The thin film transistor presented in Embodiment 1, 2, or 4 can be used for TFTs 628 and 629, which are used for the liquid crystal display device shown in FIG. 17 to FIG. 30. Further, the TFTs 628 and 629 can be manufactured in a similar manner through the process presented in any of Embodiment Mode 1 to 5, and have high electric characteristics and high reliability. The TFT 628 and the TFT 629 include a channel protective layer 608 and a channel protective layer 611, respectively, and are inverted-staggered thin film transistors in which a microcrystalline semiconductor film functions as a channel formation region.

The TFTs 628 and 629 each have an impurity region (a "channel doped region") as selected in a channel formation region of a microcrystalline semiconductor film. In the Ms 628 and 629, boron, which is an impurity element imparting p-type conductivity, is added as an impurity element imparting one conductivity type as appropriate to the microcrystalline semiconductor film to form the impurity region, thereby controlling the threshold voltages of the TFTs. In such a manner, non-doped regions are provided in the microcrystalline semiconductor film. The non-doped regions are provided between the region having an opposite conductivity type to carriers and a source region and a drain region. This structure produces effects of alleviating an electric field in the vicinity of a drain and preventing deterioration due to injection of hot carriers.

First, a vertical alignment (VA) liquid crystal display device is shown. The VA liquid crystal display device employs a method of controlling alignment of liquid crystal molecules of a liquid crystal display panel. In the VA liquid crystal display device, liquid crystal molecules are aligned in a vertical direction with respect to a panel surface when no voltage is applied. In this embodiment mode, in particular, a pixel is divided into some regions (subpixels), and molecules are aligned in different directions in their respective regions. This is referred to as multi-domain or multi-domain design. Hereinafter, a liquid crystal display device of multi-domain design is described.

Figure 17:
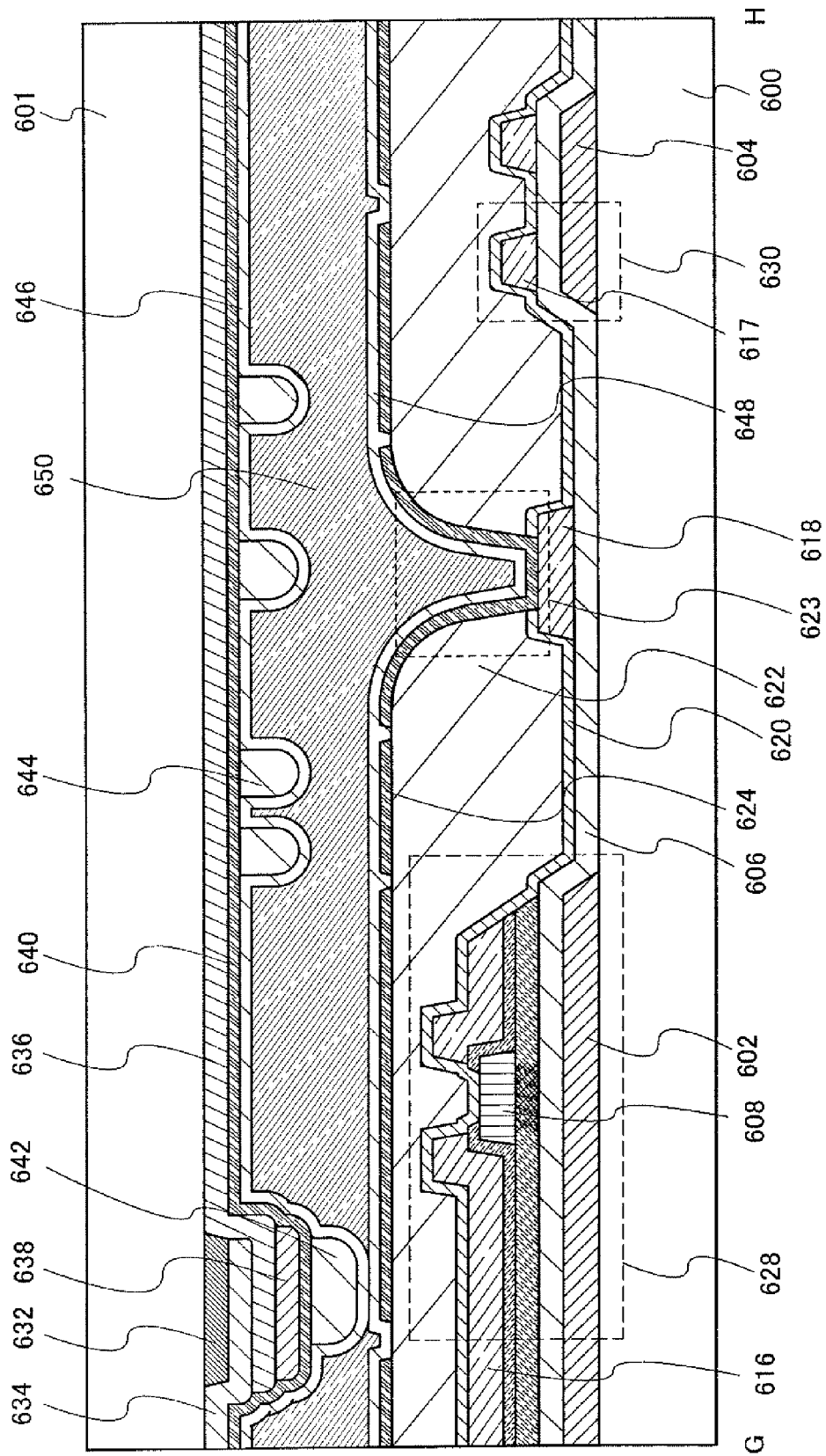
FIG. 17 is a drawing illustrating a display device of an embodiment mode of the present invention.
Figure 18:
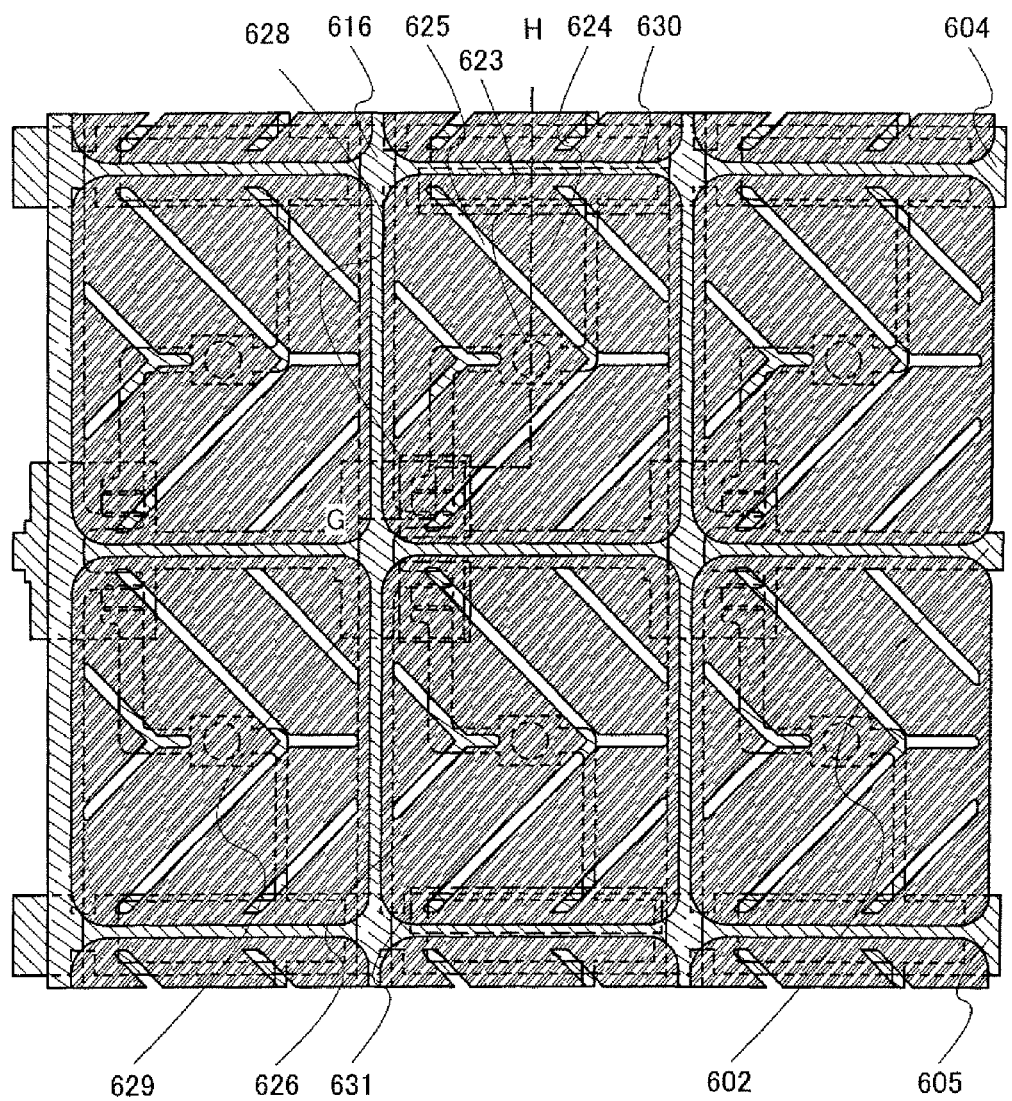
FIG. 18 is a drawing illustrating a display device of an embodiment mode of the present invention.
Figure 19:
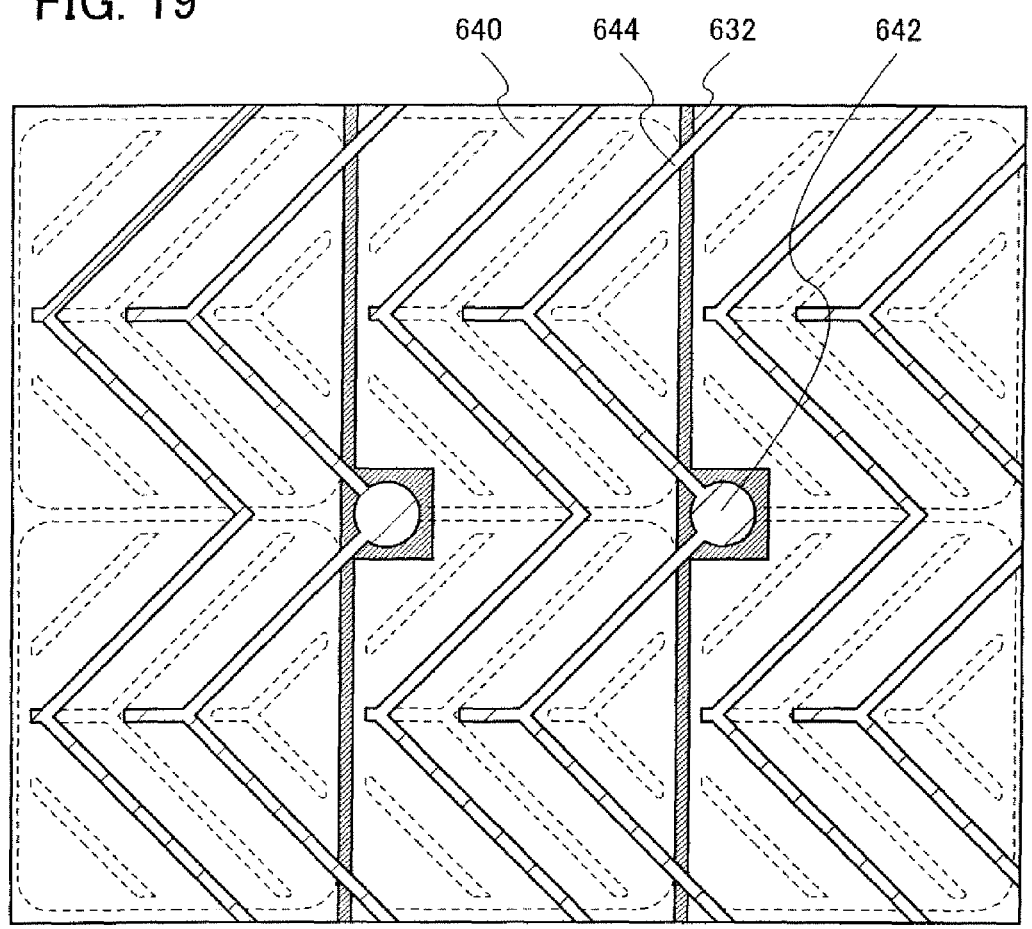
FIG. 19 is a drawing illustrating a display device of an embodiment mode of the present invention.

FIGS. 18 and 19 show a pixel electrode and a counter electrode, respectively. FIG. 18 is a plan view on a substrate side over which the pixel electrode is formed. FIG. 17 shows a cross-sectional structure taken along a line G-H in FIG. 18. FIG. 19 is a plan view on a substrate side over which the counter electrode is formed. Hereinafter, description is made with reference to these drawings.

In FIG. 17, a substrate 600 over which the TFT 628, a pixel electrode 624 connected to the TFT 628, and a holding capacitor portion 630 are formed and a counter substrate 601 for which a counter electrode 640 and the like are provided are overlapped with each other, and liquid crystals are injected between the substrate 600 and the counter substrate 601.

A light blocking film 632, a first colored film 634, a second colored film 636, a third colored film 638, and the counter electrode 640 are formed in a position where a spacer 642 is formed on the counter substrate 601. This configuration makes the height of projections 644 for controlling alignment of liquid crystals different from that of the spacer 642. An alignment film 648 is formed over the pixel electrode 624, and the counter electrode 640 is similarly provided with an alignment film 646. A liquid crystal layer 650 is formed between the alignment films 646 and 648.

Although columnar spacers are used as the spacer 642 here, bead spacers may be dispersed instead. Further, the spacer 642 may be formed over the pixel electrode 624 formed over the substrate 600.

The TFT 628, the pixel electrode 624 connected to the TFT 628, and the holding capacitor portion 630 are formed over the substrate 600. The pixel electrode 624 is connected to a wiring 618 in a contact hole 623 that passes through an insulating film 620 covering the TFT 628, the wiring 618, and the holding capacitor portion 630, and through a third insulating film 622 covering the insulating film 620. The thin film transistor shown in Embodiment Mode 1 can be used as appropriate for the TFT 628. Further, the holding capacitor portion 630 includes a first capacitor wiring 604 that is formed at the same time as a gate wiring 602 of the TFT 628; a gate insulating film 606; and a second capacitor wiring 617 that is formed at the same time as a wiring 616 and the wiring 618. Furthermore, FIG. 17 to FIG. 20 show an example in which a microcrystalline semiconductor film, a semiconductor film to which an impurity element imparting one conductivity type is added and which functions as source and drain regions, and a wiring which also functions as source and drain electrodes are processed in the same etching process and are stacked in almost the same shape.

The pixel electrode 624, the liquid crystal layer 650, and the counter electrode 640 overlap with each other, so that a liquid crystal element is formed.

FIG. 18 illustrates a structure over the substrate 600. The pixel electrode 624 is formed using a material shown in Embodiment Mode 1. Slits 625 are formed in the pixel electrode 624. The slits 625 are formed to control the alignment of the liquid crystals.

A TFT 629, a pixel electrode 626 connected to the TFT 629, and a holding capacitor portion 631, which are shown in FIG. 18, can be formed in a similar manner to the TFT 628, the pixel electrode 624, and the holding capacitor portion 630, respectively. Both the TFTs 628 and 629 are connected to the wiring 616. A pixel of this liquid crystal display panel includes the pixel electrodes 624 and 626. The pixel electrodes 624 and 626 are subpixels.

FIG. 19 illustrates a structure on the counter substrate side. The counter electrode 640 is formed over the light blocking film 632. It is preferable to use a similar material to the pixel electrode 624 to form the counter electrode 640. The projections 644 that control the alignment of the liquid crystals are formed over the counter electrode 640. Moreover, the spacer 642 is formed in accordance with the position of the light blocking film 632.

Figure 20:
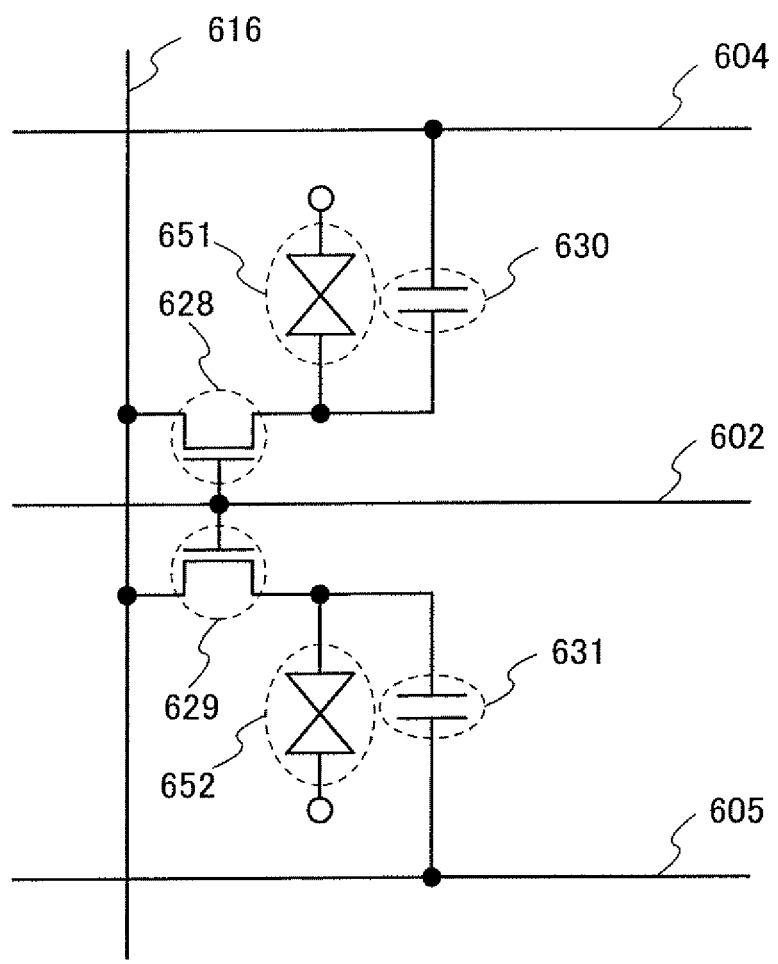
FIG. 20 is a drawing illustrating a display device of an embodiment mode of the present invention.

FIG. 20 illustrates an equivalent circuit of this pixel configuration. Both the TFTs is 628 and 629 are connected to the gate wiring 602 and the wiring 616. In this case, by making the potential of the first capacitor wiring 604 different from that of a capacitor wiring 605, operation of a liquid crystal element 651 can be different from that of a liquid crystal element 652. Specifically, potentials of the first capacitor wirings 604 and 605 are controlled individually, thereby precisely controlling the alignment of liquid crystals to increase a viewing angle.

When a voltage is applied to the pixel electrode 624 provided with the slits 625, a distorted electric field (an oblique electric field) is generated in the vicinity of the slits 625. The slits 625 and the projections 644 on the counter substrate 601 side are disposed so as not to overlap with each other, thereby effectively generating an oblique electric field to control the alignment of the liquid crystals, and thus the direction in which liquid crystals are aligned is different depending on the location. That is to say, the viewing angle of a liquid crystal display panel is increased by employing multi-domain.

Next, a different VA liquid crystal display device from the above is described with reference to FIGS. 21 to 24.

Figure 21:
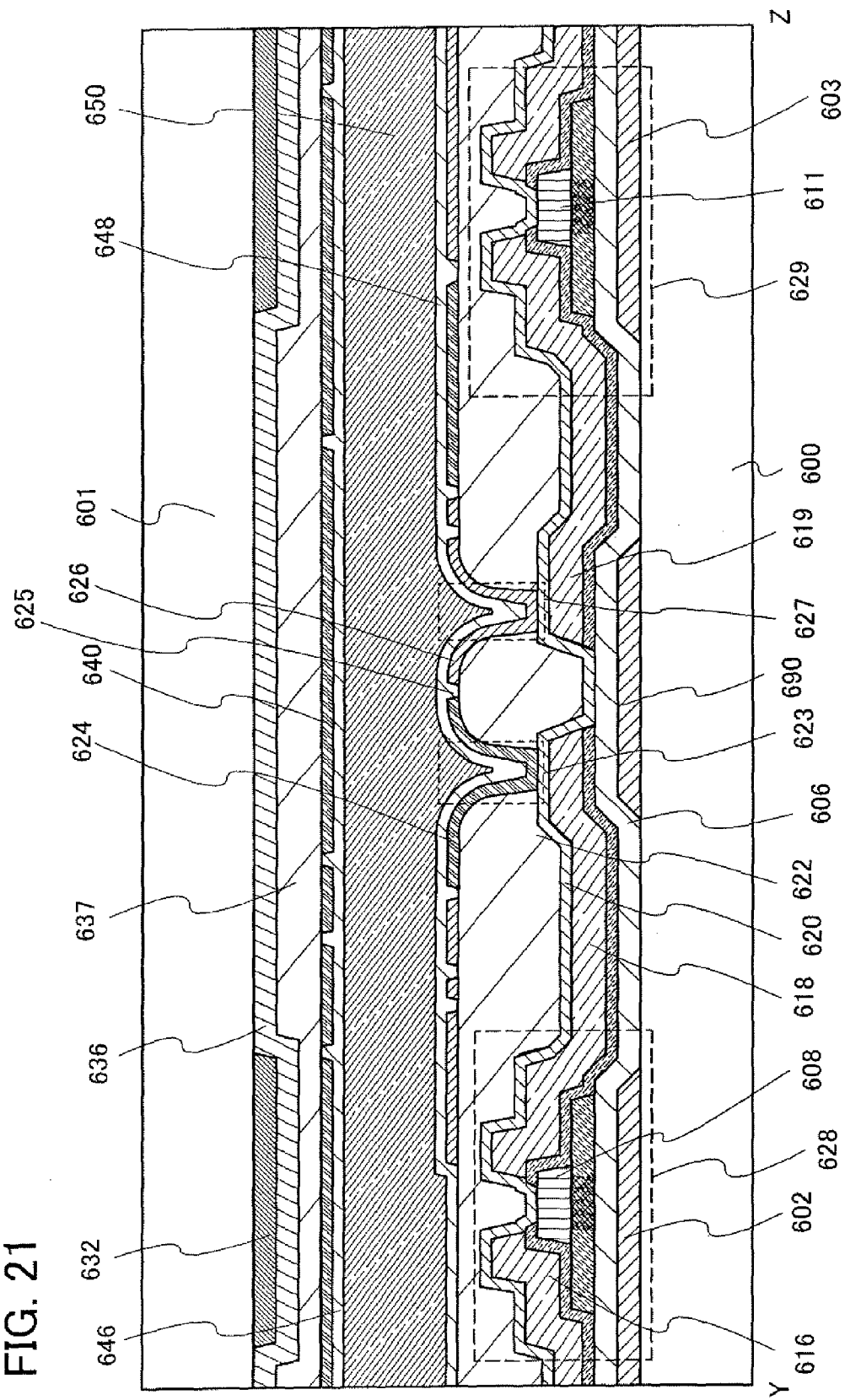
FIG. 21 is a drawing illustrating a display device of an embodiment mode of the present invention.
Figure 22:
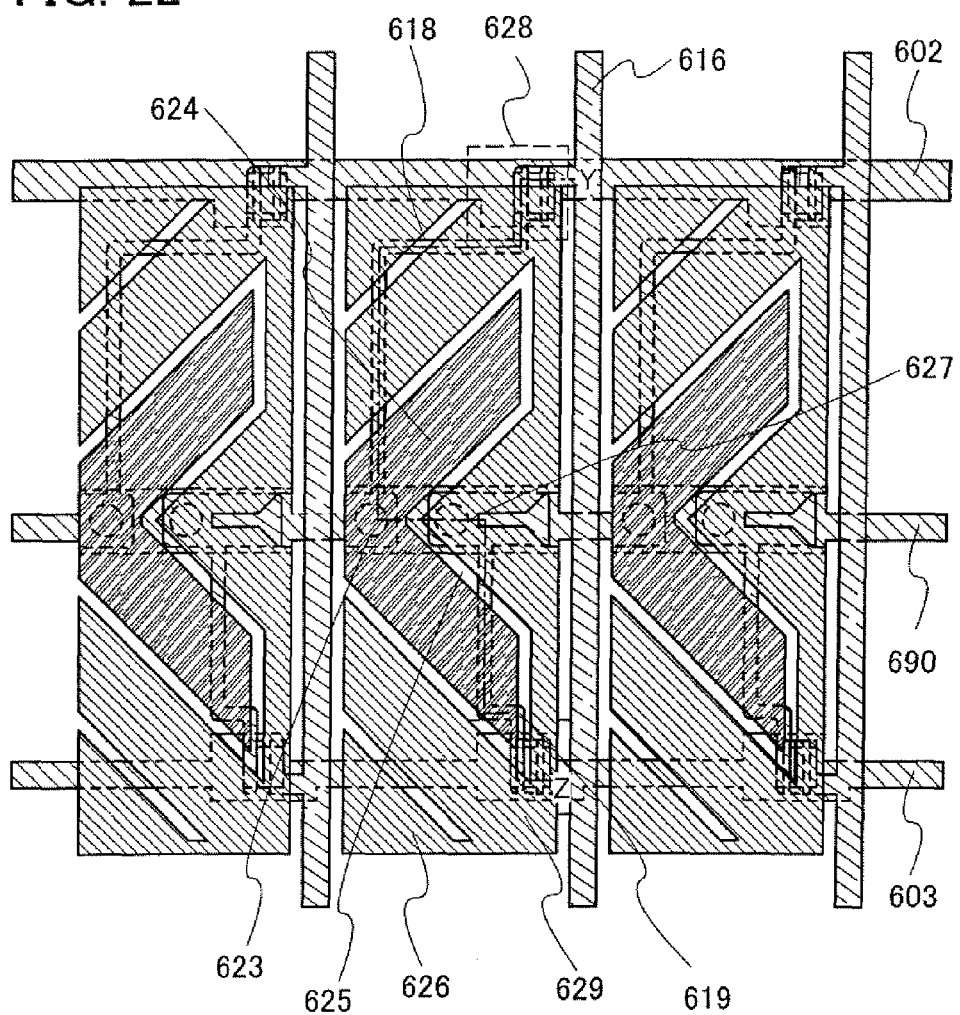
FIG. 22 is a drawing illustrating a display device of an embodiment mode of the present invention.

FIGS. 21 and 22 show a pixel structure of a VA liquid crystal display panel. FIG. 22 is a plan view over a substrate 600. FIG. 21 shows a cross-sectional structure taken along a line Y-Z in FIG. 22. The following description is made with reference to both the drawings.

In this pixel structure, one pixel has a plurality of pixel electrodes, and TFTs are connected to each pixel electrode. Each TFT is driven with a different gate signal from each other. Specifically, in the pixel of multi-domain design, a signal applied to each pixel electrode is controlled independently.

A pixel electrode 624 is connected to a TFT 628 through a wiring 618 in a contact hole 623. In addition, a pixel electrode 626 is connected to a TFT 629 through a wiring 619 in a contact hole 627. A gate wiring 602 of the TFT 628 is separated from a gate wiring 603 of the TFT 629 so that different gate signals can be supplied thereto. On the other hand, a wiring 616 serving as a data line is shared by the TFTs 628 and 629. The thin film transistors shown in Embodiment Mode 1 can be used as appropriate for the TFTs 628 and 629. Further, a capacitor wiring 690 is provided. Furthermore, FIG. 21 to FIG. 30 show an example in which a semiconductor film to which an impurity element imparting one conductivity type is added and which functions as source and drain regions, and a wiring which also functions as source and drain electrodes are processed in the same etching process and are stacked in almost the same shape.

Figure 24:
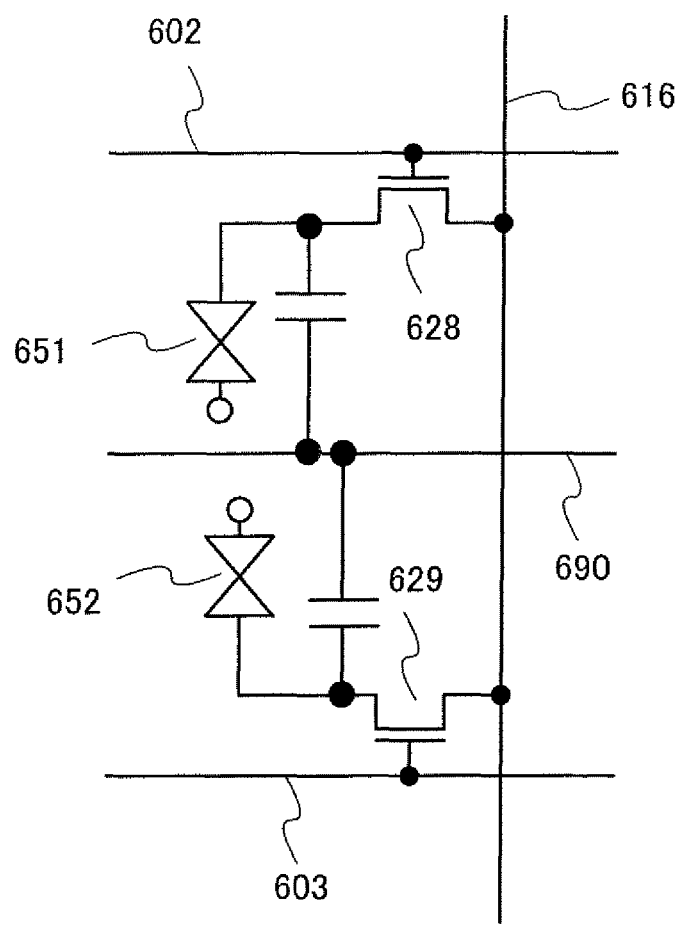
FIG. 24 is a drawing illustrating a display device of an embodiment mode of the present invention.

The shape of the pixel electrode 624 is different from that of the pixel electrode 626, and the pixel electrodes are separated by slits 625. The pixel electrode 626 surrounds the pixel electrode 624, which has a V-shape. The TFTs 628 and 629 make the timing of applying voltages to the pixel electrodes 624 and 626 different from each other, thereby controlling the alignment of liquid crystals. FIG. 24 shows an equivalent circuit of this pixel structure. The a 1 628 is connected to the gate wiring 602, and the TFT 629 is connected to the gate wiring 603. When different gate signals are supplied to the gate wirings 602 and 603, operation timing of the TFTs 628 and 629 can be different.

Figure 23:
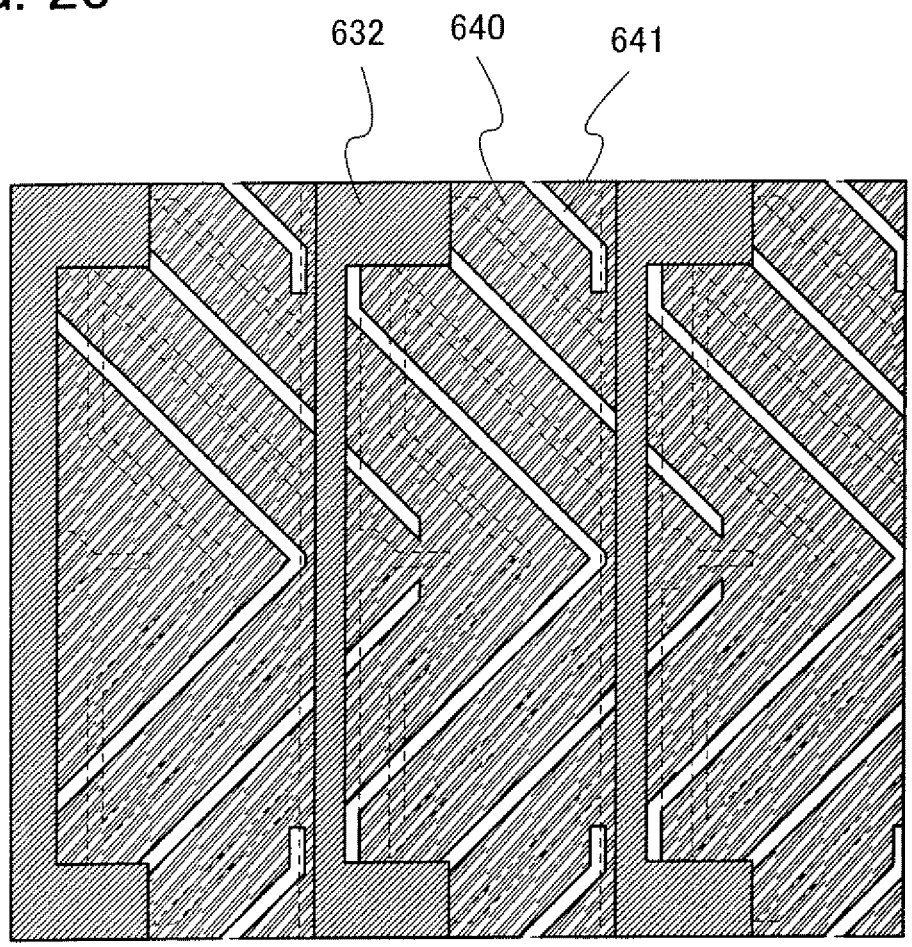
FIG. 23 is a drawing illustrating a display device of an embodiment mode of the present invention.

A counter substrate 601 is provided with a light blocking film 632, a second colored film 636, and a counter electrode 640. In addition, a planarizing film 637 is formed between the second colored film 636 and the counter electrode 640, thereby preventing alignment disorder of liquid crystals. FIG. 23 shows a structure of the counter substrate side. The counter electrode 640 is shared by plural pixels, and slits 641 are formed in the counter electrode 640. The slits 641 and the slits 625 on the pixel electrodes 624 and 626 side are disposed so as not to overlap with each other, thereby effectively generating an oblique electric field to control the alignment of the liquid crystals. Accordingly, the direction in which the liquid crystals are aligned can be different depending on the location, and thus a viewing angle of the liquid crystal display panel is increased.

The pixel electrode 624, the liquid crystal layer 650, and the counter electrode 640 overlap with each other, so that a first liquid crystal element is formed. Further, the pixel electrode 626, the liquid crystal layer 650, and the counter electrode 640 overlap with each other, so that a second liquid crystal element is formed. Furthermore, the multi-domain structure is made in which the first liquid crystal element and the second liquid crystal element are provided for one pixel.

Next, a liquid crystal display device in a horizontal electric field mode is shown. In a horizontal field effect mode, an electric field is applied in a horizontal direction with respect to liquid crystal molecules in a cell, whereby liquid crystals are driven to express gray scales. In accordance with this method, a viewing angle can be expanded to approximately 180°. Hereinafter, a liquid crystal display device in the horizontal electric field mode is described.

Figure 25:
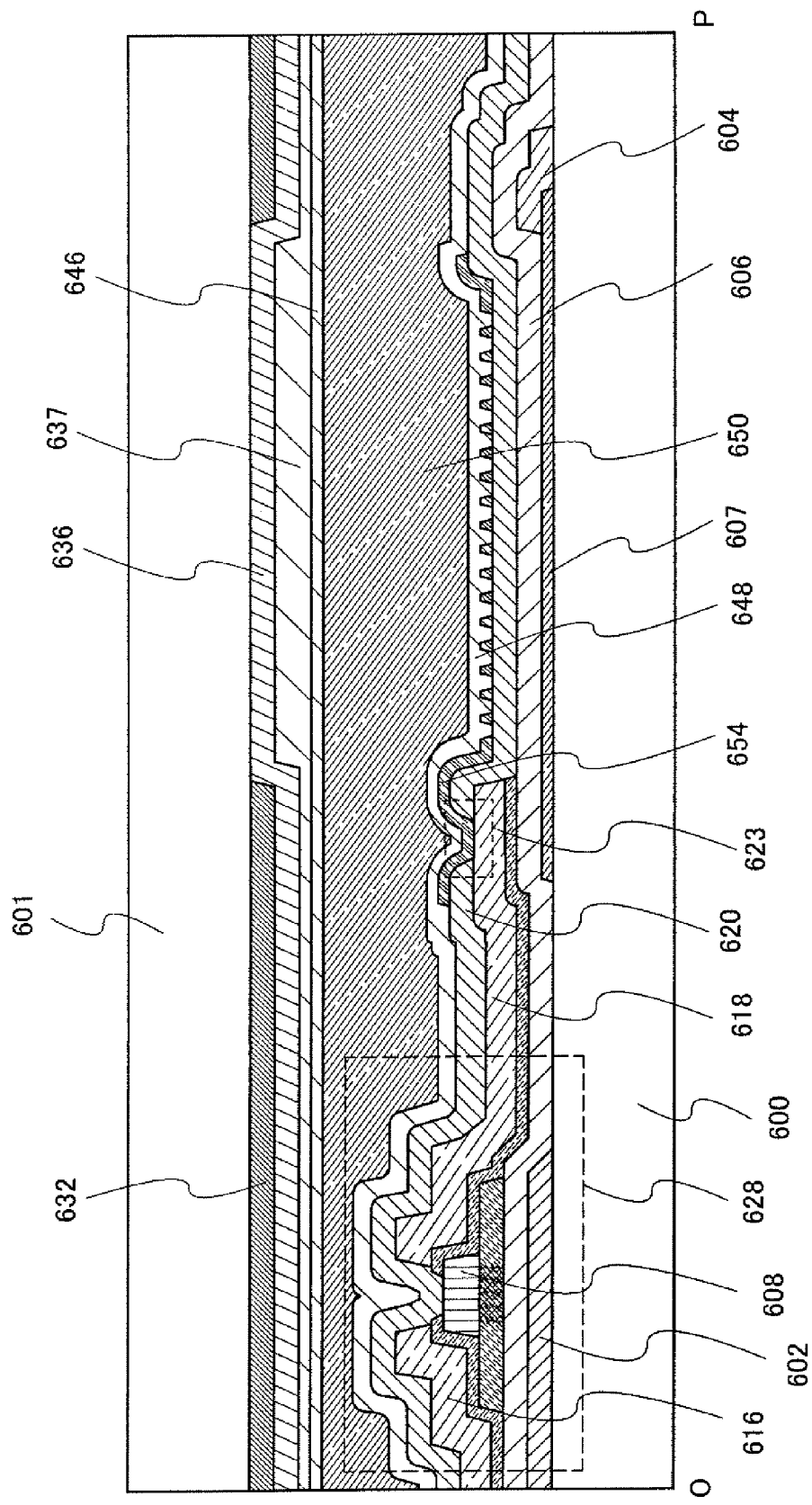
FIG. 25 is a drawing illustrating a display device of an embodiment mode of the present invention.

In FIG. 25, a counter substrate 601 is superposed on a substrate 600, over which a TFT 628 and a pixel electrode 624 connected to the TFT 628 are formed, and liquid crystals are injected therebetween. The counter substrate 601 is provided with a light blocking film 632, a second colored film 636, a planarizing film 637, and the like. The pixel electrode is provided for the substrate 600, and not for the counter substrate 601. A liquid crystal layer 650 is formed between the substrate 600 and the counter substrate 601.

A first pixel electrode 607, a capacitor wiring 604 connected to the first pixel electrode 607, and the TFT 628 shown in Embodiment Mode 1 are formed over the substrate 600. The first pixel electrode 607 can be foamed using a similar material to the pixel electrode 77 shown in Embodiment Mode 1. The first pixel electrode 607 is formed to be compartmentalized almost in a pixel form. A gate insulating film 606 is formed over the first pixel electrode 607 and the capacitor wiring 604.

Wirings 616 and 618 of the TFT 628 are formed over the gate insulating film 606. The wiring 616 is a data line through which a video signal travels, extends in one direction in a liquid crystal display panel, is connected to a source or drain region of the TFT 628, and functions as one of source and drain electrodes. The wiring 618 functions as the other of the source and drain electrodes and is connected to the second pixel electrode 654.

A second insulating film 620 is formed over the wirings 616 and 618. Further, the second pixel electrode 654 that is connected to the wiring 618 in a contact hole formed in the insulating film 620 is formed over the insulating film 620. The pixel electrode 624 is formed using a similar material to the pixel electrode 77 shown in Embodiment Mode 1.

In the above manner, the H. 628 and the second pixel electrode 654 connected to the TFT 628 are formed over the substrate 600. A holding capacitor is formed between the first pixel electrode 607 and the second pixel electrode 654.

Figure 26:
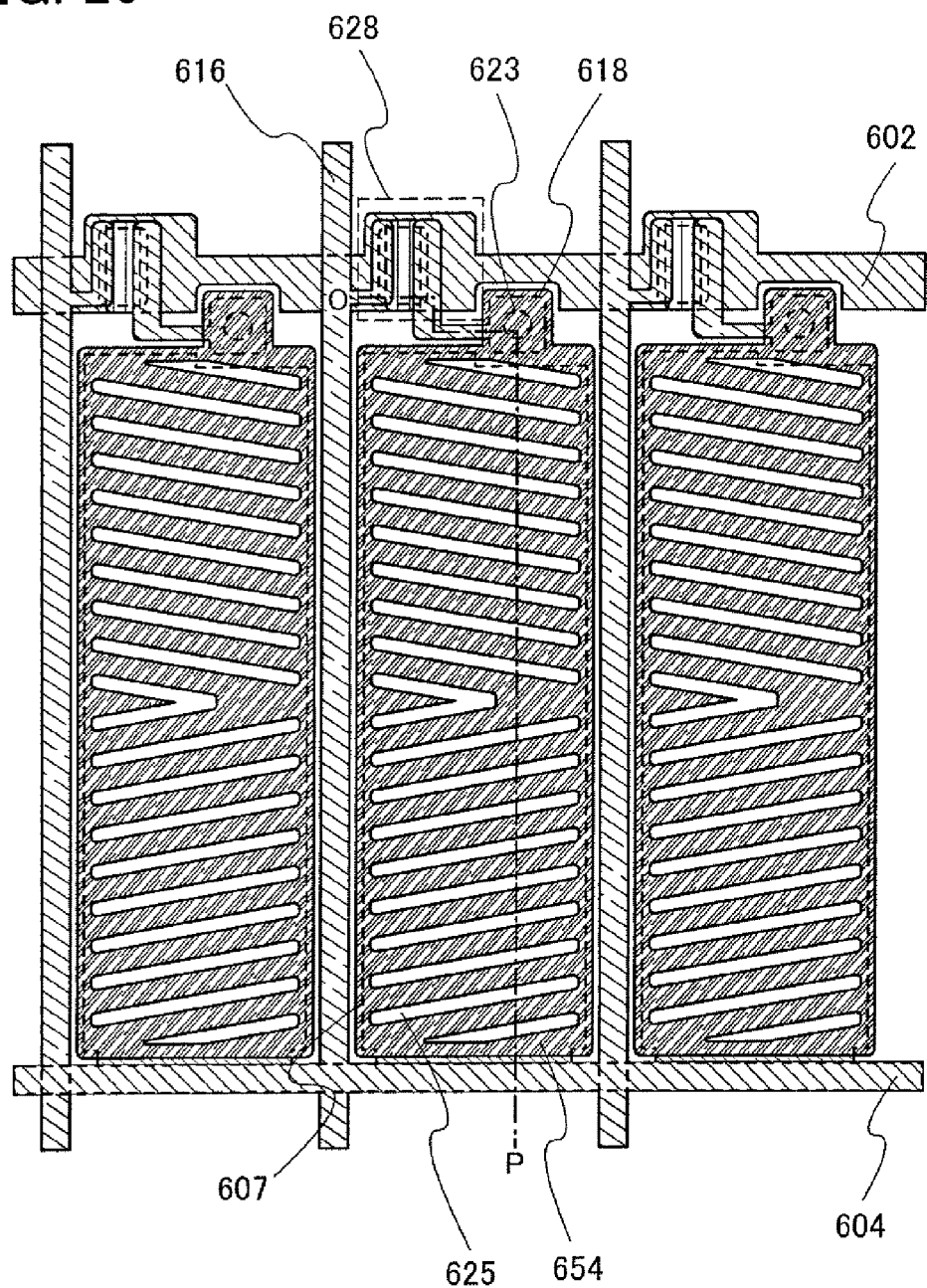
FIG. 26 is a drawing illustrating a display device of an embodiment mode of the present invention.

FIG. 26 is a plan view illustrating a structure of the pixel electrode. FIG. 25 shows a cross-sectional structure taken along a line O-P in FIG. 26. The pixel electrode 624 is provided with slits 625. The slits 625 are provided to control the alignment of the liquid crystals. In this case, an electric field is generated between the first pixel electrode 607 and the second pixel electrode 654. Although the gate insulating film 606 is formed between the first pixel electrode 607 and the second pixel electrode 654, the gate insulating film 606 has a thickness of from 50 to 200 nm, which is thin enough as compared with that of the liquid crystal layer with a thickness of from 2 to 10 µm. Therefore, the electric field is generated in a direction which is substantially parallel to the substrate 600 (a horizontal direction). The alignment of the liquid crystals is controlled with this electric field. Liquid crystal molecules are horizontally rotated with the use of the electric field in the direction almost parallel to the substrate. In this case, since the liquid crystal molecules are horizontally aligned in any state, contrast or the like is less influenced by the viewing angle; thus, the viewing angle is increased. In addition, the aperture ratio can be improved since both the first pixel electrode 607 and the second pixel electrode 654 are light-transmitting electrodes.

Next, a different example of a liquid crystal display device in a horizontal electric field mode is shown.

Figure 27:
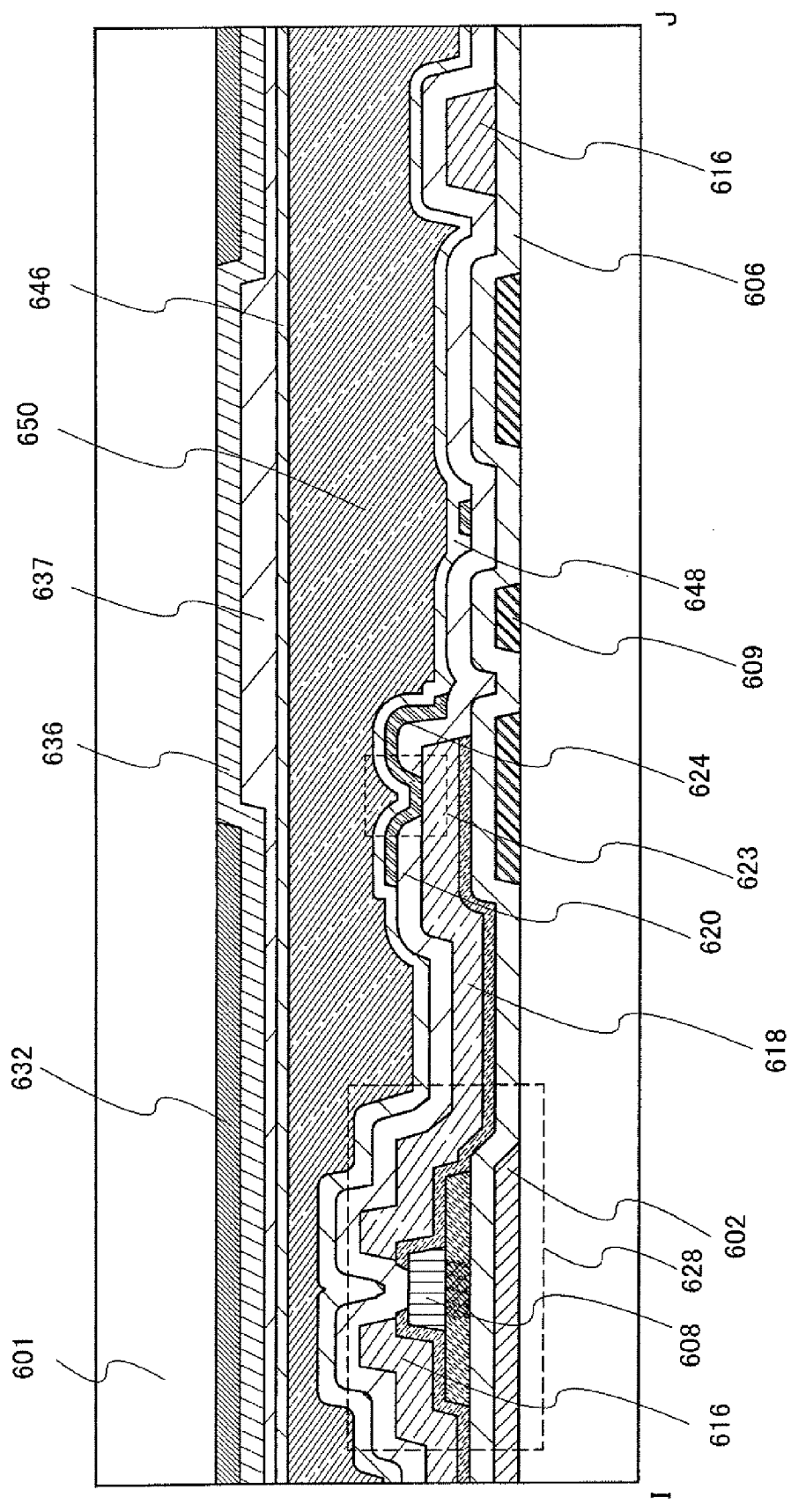
FIG. 27 is a drawing illustrating a display device of an embodiment mode of the present invention.
Figure 28:
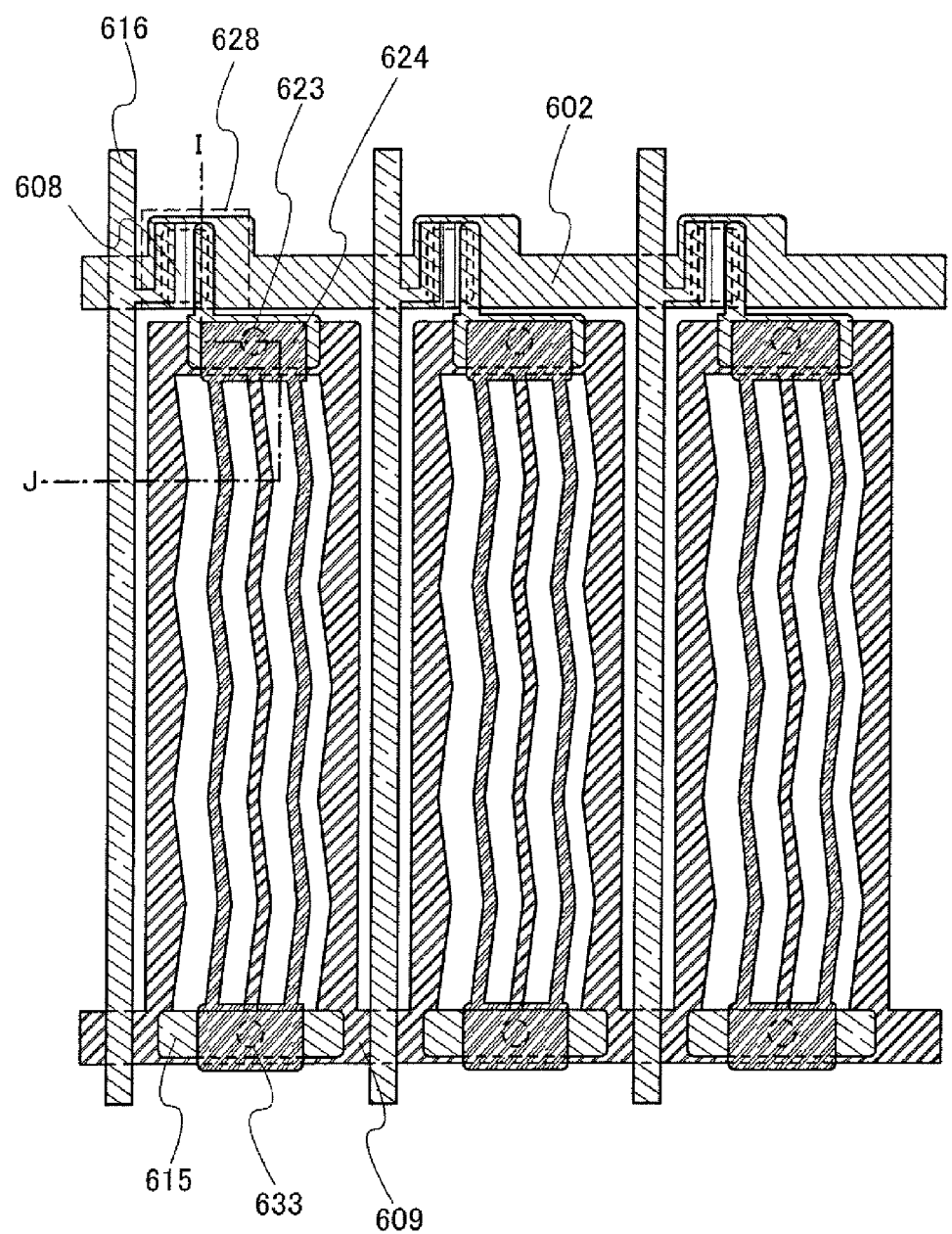
FIG. 28 is a drawing illustrating a display device of an embodiment mode of the present invention.

FIGS. 27 and 28 illustrate a pixel structure of a liquid crystal display device in an IPS mode. FIG. 28 is a plan view, and FIG. 27 shows a cross-sectional structure taken along a line I-J in FIG. 28. Hereinafter, description is made with reference to both the drawings.

In FIG. 27, a counter substrate 601 is superposed on a substrate 600, over which a TFT 628 and a pixel electrode 624 connected to the TFT 628 are formed, and liquid crystals are injected between the substrate 600 and the counter substrate 601. The counter substrate 601 is provided with a light blocking film 632, a second colored film 636, a planarizing film 637, and the like. The pixel electrode is provided for the substrate 600, and not for the counter substrate 601. A liquid crystal layer 650 is formed between the substrate 600 and the counter substrate 601.

A common potential line 609 and the TFT 628 shown in Embodiment Mode 1 are formed over the substrate 600. The common potential line 609 can be formed at the same time as forming a gate wiring 602 of the TFT 628.

Wirings 616 and 618 of the TFT 628 are formed over a gate insulating film 606. The wiring 616 is a data line through which a video signal travels, extends in one direction in a liquid crystal display panel, is connected to a source or drain region of the TFT 628, and functions as one of source and drain electrodes. The wiring 618 functions as the other of the source and drain electrodes and is connected to the second pixel electrode 654.

A second insulating film 620 is fanned over the wirings 616 and 618. Further, the second pixel electrode 654 that is connected to the wiring 618 in a contact hole 623 formed in the insulating film 620 is formed over the insulating film 620. The pixel electrode 624 is formed using a similar material to the pixel electrode 77 shown in Embodiment Mode 1. As shown in FIG. 28, the pixel electrode 624 is formed such that the pixel electrode 624 and a comb-like electrode that is formed at the same time as the common potential line 609 can generate a horizontal electric field. Further, a comb-like portion of the pixel electrode 624 and the comb-like electrode that is formed at the same time as the common potential line 609 and corresponds to the comb-like portion of the pixel electrode 624 are formed so as to be placed in an alternate manner.

When an electric field is generated between the potential applied to the pixel electrode 624 and that of the common potential line 609, the alignment of liquid crystals is controlled with this electric field. Liquid crystal molecules are horizontally rotated with the use of the electric field in the direction almost parallel to the substrate. In this case, since the liquid crystal molecules are horizontally aligned in any state, the contrast or the like is less influenced by the viewing angle; thus, the viewing angle is increased.

In the above manner, the TFT 628 and the pixel electrode 624 connected to the TFT 628 are formed over the substrate 600. A holding capacitor is formed by providing the gate insulating film 606 between the common potential line 609 and a capacitor electrode 615. The capacitor electrode 615 is connected to the pixel electrode 624 through a contact hole 633.

Next, a mode of a liquid crystal display device in a TN mode is shown.

Figure 29:
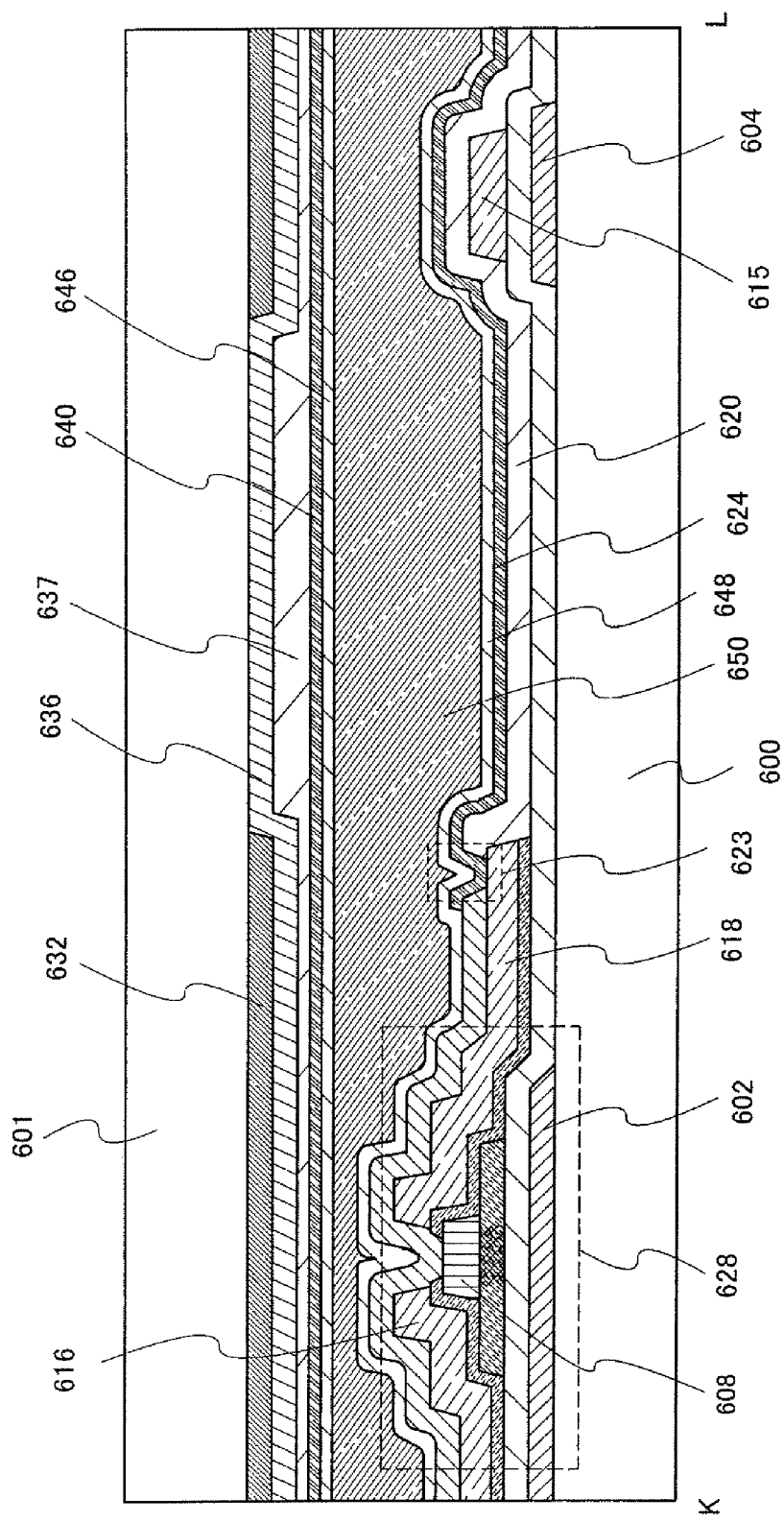
FIG. 29 is a drawing illustrating a display device of an embodiment mode of the present invention.
Figure 30:
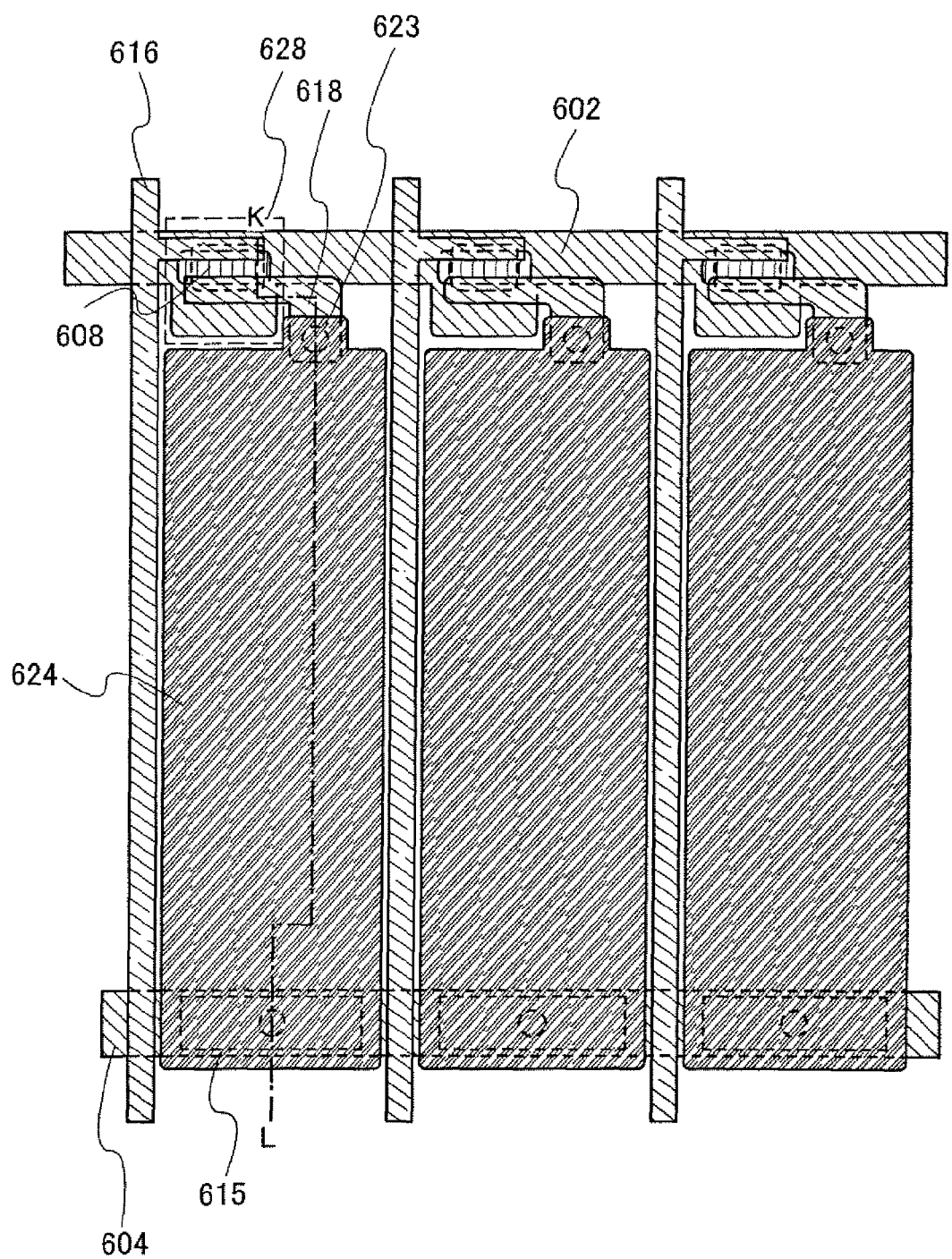
FIG. 30 is a drawing illustrating a display device of an embodiment mode of the present invention.

FIGS. 29 and 30 illustrate a pixel structure of a liquid crystal display device in a TN mode. FIG. 30 is a plan view, and FIG. 29 shows a cross-sectional structure taken along a line K-L in FIG. 30. Hereinafter, description is made with reference to both the drawings.

A pixel electrode 624 is connected to a TFT 628 through a wiring 618 in a contact hole 623. A wiring 616 functioning as a data line is also connected to the IFT 628. Any TFT shown in Embodiment Mode 1 can be used for the TFT 628.

The pixel electrode 624 is formed using the pixel electrode 77 shown in Embodiment Mode 1.

A counter substrate 601 is provided with a light blocking film 632, a second colored film 636, and a counter electrode 640. In addition, a planarizing film 637 is formed between the second colored film 636 and the counter electrode 640 to prevent alignment disorder of liquid crystals. A liquid crystal layer 650 is formed between the pixel electrode 624 and the counter electrode 640 with an alignment film 648 interposed between the pixel electrode 624 and the liquid crystal layer 650, and with an alignment film 646 interposed between the counter electrode 640 and the liquid crystal layer 650.

The pixel electrode 624, the liquid crystal layer 650, and the counter electrode 640 overlap with each other, so that a liquid crystal element is formed.

A color filter, a blocking film for preventing disclination (a black matrix), or the like may also be provided for a substrate 600 or the counter substrate 601. Further, a polarizing plate is attached to a surface of the substrate 600 which is opposite to the surface provided with the thin film transistor, and another polarizing plate is attached to a surface of the counter substrate 601 which is opposite to the surface provided with the counter electrode 640.

Through the above process, a liquid crystal display device can be manufactured as a display device. The liquid crystal display device in this embodiment mode has high contrast and high visibility because a thin film transistor with little off current, high electric characteristics, and high reliability is used in the liquid crystal display device.

Embodiment Mode 8

Next, a structure of a display panel, which is one mode of a display device of the present invention, is described below.

This embodiment mode describes a liquid crystal display panel (also referred to as a liquid crystal panel), which is one mode of a liquid crystal display device having a liquid crystal element as a display element, and a light-emitting display panel (also referred to as a light-emitting panel), which is one mode of a display device having a light-emitting element as a display element.

Figure 9A:
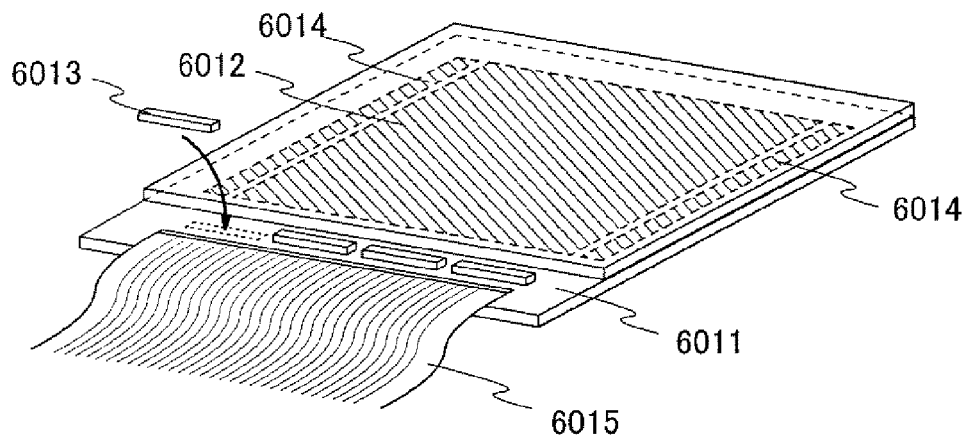
FIGS. 9A to 9C are drawings illustrating display devices of some embodiment modes of the present invention.

FIG. 9A illustrates a mode of a display panel in which a pixel portion 6012 formed over a substrate 6011 is connected to a signal line driver circuit 6013 that is formed separately. The pixel portion 6012 and a scanning line driver circuit 6014 are formed using thin film transistors including microcrystalline semiconductor films. By forming the signal line driver circuit with a thin film transistor by which higher mobility can be obtained compared to the thin film transistor including the microcrystalline semiconductor film, operation of the signal line driver circuit, which demands a higher driving frequency than that of the scanning line driver circuit, can be stabilized. The signal line driver circuit 6013 may be formed using a thin film transistor including a single-crystalline semiconductor, a thin film transistor including a polycrystalline semiconductor, or a thin film transistor including an SOL The pixel portion 6012, the signal line driver circuit 6013, and the scanning line driver circuit 6014 are each supplied with potential of a power source, a variety of signals, and the like through an FPC 6015.

Both the signal driver circuit and the scanning line driver circuit may be formed over the same substrate as that of the pixel portion.

Figure 9B:
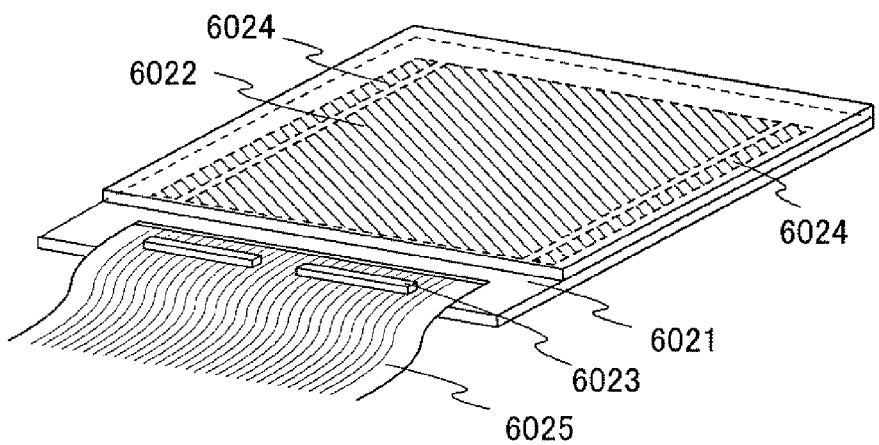

Further, when the driver circuit is formed separately, a substrate provided with the driver circuit is not always required to be attached to a substrate provided with the pixel portion, and may be attached to, for example, the FPC. FIG. 9B illustrates a mode of a panel of a display device in which a signal line driver circuit 6023 is formed separately and is connected to a pixel portion 6022 and a scanning line driver circuit 6024 that are formed over a substrate 6021. The pixel portion 6022 and the scanning line driver circuit 6024 are formed using thin film transistors including microcrystalline semiconductor films. The signal line driver circuit 6023 is connected to the pixel portion 6022 through an FPC 6025. The pixel portion 6022, the signal line driver circuit 6023, and the scanning line driver circuit 6024 are each supplied with potential of a power source, a variety of signals, and the like through the FPC 6025.

Figure 9C:
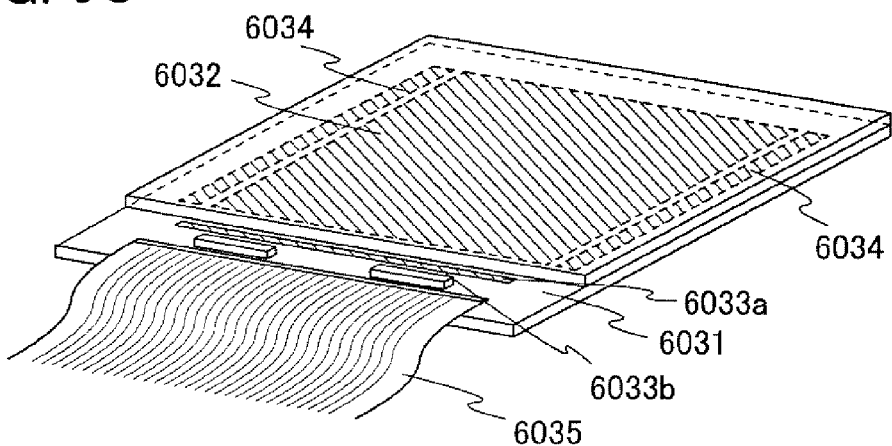

Furthermore, only a part of the signal line driver circuit or only a part of the scanning line driver circuit may be formed over the same substrate as that of the pixel portion with the use of a thin film transistor including a microcrystalline semiconductor film, and the rest may be formed separately and electrically connected to the pixel portion. FIG. 9C illustrates a mode of a panel of a display device in which an analog switch 6033a included in the signal line driver circuit is formed over a substrate 6031, over which a pixel portion 6032 and a scanning line driver circuit 6034 are formed, and a shift register 6033b included in the signal line driver circuit is formed separately over a different substrate and then attached to the substrate 6031. The pixel portion 6032 and the scanning line driver circuit 6034 are foamed using thin film transistors including microcrystalline semiconductor films. The shift register 6033b included in the signal line driver circuit is connected to the pixel portion 6032 through an FPC 6035. The pixel portion 6032, the signal line driver circuit, and the scanning line driver circuit 6034 are each supplied with potential of a power source, a variety of signals, and the like through the FPC 6035.

As illustrated in FIGS. 9A to 9C, in the display device of the present invention, an entire driver circuit or a part thereof can be formed over the same substrate as that of a pixel portion, using a thin film transistor including a microcrystalline semiconductor film.

Note that there are no particular limitations on a connection method of a substrate formed separately, and a COG method, a wire bonding method, a TAB method, or the like can be used. Further, a connection position is not limited to the position illustrated in FIGS. 9A to 9C as long as electrical connection is possible. Further, a controller, a CPU, a memory, or the like may be formed separately and connected.

The signal line driver circuit used in the present invention is not limited to a mode having only a shift register and an analog switch. In addition to the shift register and the analog switch, another circuit such as a buffer, a level shifter, or a source follower may be included. Further, the shift register and the analog switch are not always required to be provided, and for example, a different circuit such as a decoder circuit by which selection of signal lines is possible may be used instead of the shift register, or a latch or the like may be used instead of the analog switch.

Figure 12A:
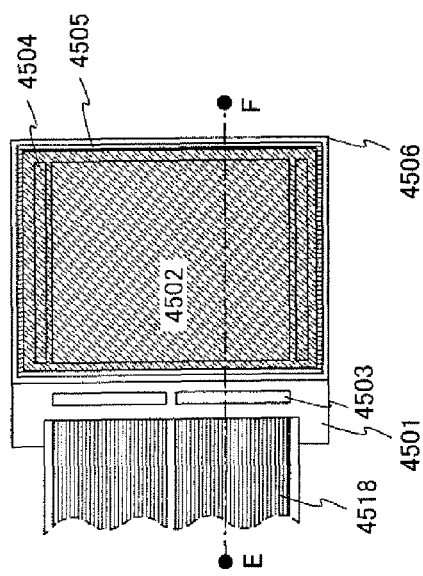
FIGS. 12A and 12B are drawings illustrating a display device of an embodiment mode of the present invention.
Figure 12B:
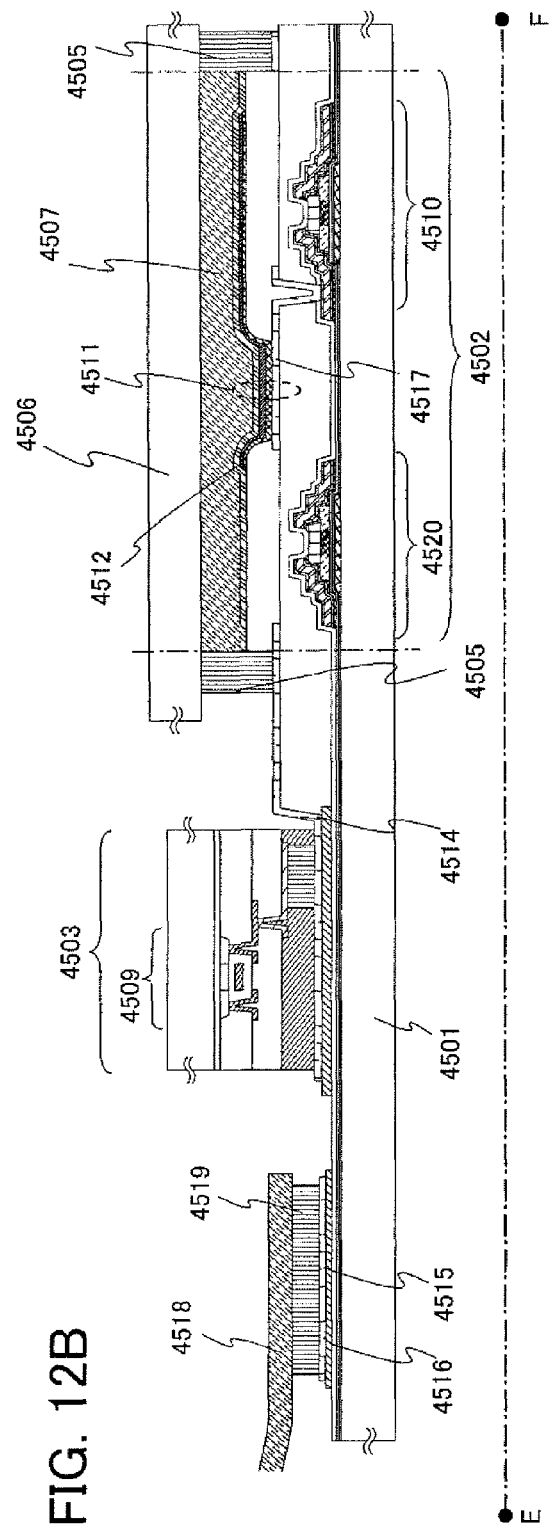

Next, an external view and a cross section of a light-emitting display panel, which is one mode of a display device of the present invention, is described with reference to FIGS. 12A and 12B. FIG. 12A is a top view of a panel in which a thin film transistor including a microcrystalline semiconductor film and a light-emitting element that are formed over a first substrate are sealed with a sealant between the first substrate and a second substrate. FIG. 12B is a cross-sectional view taken along E-F of FIG. 12A.

A sealant 4505 is provided so as to surround a pixel portion 4502 and a scanning line driver circuit 4504 that are provided over a first substrate 4501. Further, a second substrate 4506 is provided over the pixel portion 4502 and the scanning line driver circuit 4504. Thus, the pixel portion 4502 and the scanning line driver circuit 4504, together with a filler 4507, are sealed with the sealant 4505 between the first substrate 4501 and the second substrate 4506. Furthermore, a signal line driver circuit 4503 that is formed using a polycrystalline semiconductor film over a substrate which is prepared separately is mounted in a region that is different from the region surrounded by the sealant 4505 over the first substrate 4501. This embodiment mode describes an example in which the signal line driver circuit including a thin film transistor including a polycrystalline semiconductor film is attached to the first substrate 4501. Alternatively, a signal line driver circuit may be formed using a transistor including a single-crystalline semiconductor and attached to the first substrate 4501. FIG. 12B shows a thin film transistor 4509 that is formed using a polycrystalline semiconductor film and included in the signal line driver circuit 4503 as an example.

The pixel portion 4502 and the scanning line driver circuit 4504 that are formed over the first substrate 4501 each include a plurality of thin film transistors, and thin film transistors 4510 and 4520 included in the pixel portion 4502 are illustrated as an example in FIG. 12B. In this embodiment mode, the thin film transistor 4510 is illustrated as a driving TFT but may also be a current control TFT or an erasing TFT. The thin film transistors 4510 and 4520 correspond to thin film transistors including microcrystalline semiconductor films, can employ thin film transistors shown in Embodiment Mode 1, 2, or 4, and can be manufactured in a similar manner through a process shown in any of Embodiment Mode 1 to 5. In this embodiment mode, the thin film transistor 4510 is an n-channel thin film transistor in which a semiconductor film doped with an impurity element imparting n-type conductivity is used for a source region and a drain region, and the thin film transistor 4520 is a p-channel thin film transistor in which a semiconductor film doped with an impurity element imparting p-type conductivity is used for a source region and a drain region. The thin film transistor in the present invention can be either an n-channel type or a p-channel type, and it is also possible to provide a complementary metal oxide semiconductor (CMOS), which includes an n-channel thin film transistor and a p-channel thin film transistor, for a display device.

A portion designated by a reference numeral 4511 is a light-emitting element, and a pixel electrode of the light-emitting element 4511 is electrically connected to a source or drain electrode of the thin film transistor 4510 through a wiring 4517. Further in this embodiment mode, a common electrode of the light-emitting element 4511 is electrically connected a light-transmitting conductive film 4512. The structure of the light-emitting element 4511 is not limited to the structure described in this embodiment mode. The structure of the light-emitting element 4511 can be changed as appropriate in accordance with a direction of light taken from the light-emitting element 4511, polarity of the thin film transistor 4510, or the like.

A variety of signals and potential which are applied to the signal line driver circuit 4503 that is formed separately, the scanning line driver circuit 4504, or the pixel portion 4502 are supplied from an FPC 4518 through wirings 4514 and 4515, although not illustrated in the cross-sectional view of FIG. 12B.

In this embodiment mode, a connecting terminal 4516 is formed of the same conductive film as that of the pixel electrode included in the light-emitting element 4511. In addition, the wirings 4514 and 4515 are formed of the same conductive film as that of the wiring 4517.

The connecting terminal 4516 is electrically connected to a terminal included in the FPC 4518 through an anisotropic conductive film 4519.

A substrate located in a direction of extracting light from the light-emitting element 4511 needs to be transparent. In that case, a light-transmitting material such as a glass plate, a plastic plate, a polyester film, or an acrylic film is used.

As the filler 4507, an ultraviolet curable resin or a thermosetting resin can be used as well as an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. In this embodiment mode, nitrogen is used as the filler.

If necessary, an optical film such as a polarizing plate, a circularly polarizing plate (including an elliptically polarizing plate), a retardation plate (a quarter-wave plate or a half-wave plate), or a color filter may be provided as appropriate for a light-emitting surface of the light-emitting element. Further, a polarizing plate or a circularly polarizing plate may be provided with an anti-reflection film. For example, anti-glare treatment may be carried out, by which reflected light can be diffused by projections and depressions on a surface, thereby reducing reflection.

FIGS. 12A and 12B illustrate an example in which the signal line driver circuit 4503 is formed separately and mounted on the first substrate 4501, but this embodiment mode is not limited to this structure. The scanning line driver circuit may be formed separately and then mounted, or only a part of the signal line driver circuit or a part of the scanning line driver circuit may be formed separately and then mounted.

Figure 16A:
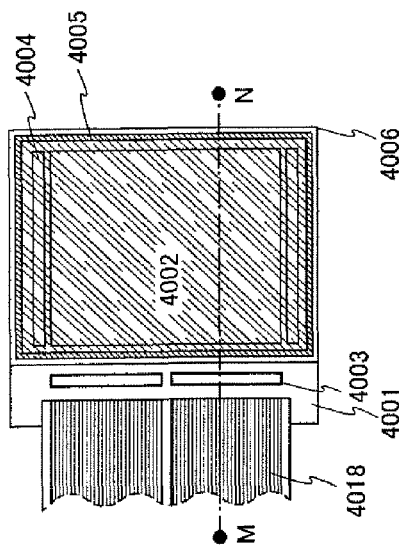
FIGS. 16A and 16B are drawings illustrating a display device of an embodiment mode of the present invention.
Figure 16B:
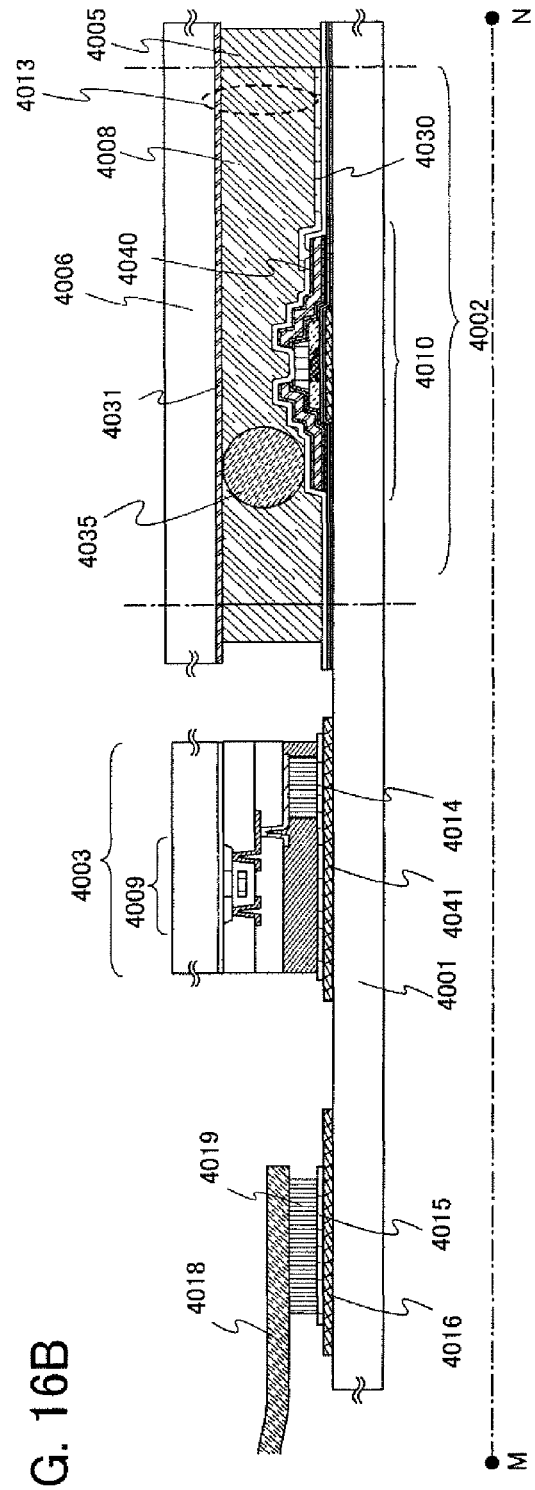

Next, an external view and a cross section of a liquid crystal display panel, which is one mode of a display device of the present invention, is described with reference to FIGS. 16A and 16B. FIG. 16A is a top view of a panel in which a thin film transistor 4010 including a microcrystalline semiconductor film and a liquid crystal element 4013 that are formed over a first substrate 4001 are sealed with a sealant 4005 between the first substrate 4001 and a second substrate 4006. FIG. 16B is a cross-sectional view taken along a line M-N of FIG. 16A.

The sealant 4005 is provided so as to surround a pixel portion 4002 and a scanning line driver circuit 4004 that are provided over the first substrate 4001. The second substrate 4006 is provided over the pixel portion 4002 and the scanning line driver circuit 4004. Thus, the pixel portion 4002 and the scanning line driver circuit 4004, together with liquid crystals 4008, are sealed with the sealant 4005 between the first substrate 4001 and the second substrate 4006. A signal line driver circuit 4003 that is formed using a polycrystalline semiconductor film over a substrate which is prepared separately is mounted in a region that is different from the region surrounded by the sealant 4005 over the first substrate 4001. This embodiment mode describes an example in which the signal line driver circuit including a thin film transistor including a polycrystalline semiconductor film is attached to the first substrate 4001. Alternatively, a signal line driver circuit may be formed using a thin film transistor including a single-crystalline semiconductor and may be attached to the first substrate 4001. FIG. 16B shows a thin film transistor 4009 that is formed using a polycrystalline semiconductor film and included in the signal line driver circuit 4003 as an example.

The pixel portion 4002 and the scanning line driver circuit 4004 that are formed over the first substrate 4001 each include a plurality of thin film transistors, and the thin film transistor 4010 included in the pixel portion 4002 is illustrated as an example in FIG. 16B. The thin film transistor 4010 corresponds to a thin film transistor including a microcrystalline semiconductor film, can employ a thin film transistor shown in Embodiment Mode 1, 2, or 4, and can be manufactured in a similar manner through a process shown in any of Embodiment Mode 1 to 5.

In addition, a portion designated by a reference numeral 4013 is a liquid crystal element, and a pixel electrode 4030 of the liquid crystal element 4013 is electrically connected to the thin film transistor 4010 through a wiring 4040. A counter electrode 4031 of the liquid crystal element 4013 is formed on the second substrate 4006. The liquid crystal element 4013 corresponds to a portion where the pixel electrode 4030 and the counter electrode 4031 sandwich the liquid crystals 4008.

The first substrate 4001 and the second substrate 4006 can be formed using glass, metal (a typical example is stainless steel), ceramics, or plastics. As plastics, a fiberglass-reinforced plastics (FRP) plate, a polyvinyl fluoride (PVF) film, a polyester film, or an acrylic resin film can be used. Further, sheet in which aluminum foil is sandwiched by PVF films or polyester films can also be used.

A spherical spacer 4035 is provided to control a distance (a cell gap) between the pixel electrode 4030 and the counter electrode 4031. A spacer which is obtained by selectively etching an insulating film may also be used.

A variety of signals and potential are supplied to the signal line driver circuit 4003 that is formed separately, the scanning line driver circuit 4004, or the pixel portion 4002 through wirings 4014 and 4015 from an FPC 4018.

In this embodiment mode, a connecting terminal 4016 is formed of the same conductive film as that of a wiring 4041. In addition, the wirings 4014 and 4015 are formed of the same conductive film as that of the pixel electrode 4030 included in the liquid crystal element 4013.

The connecting terminal 4016 is electrically connected to a terminal included in the FPC 4018 through an anisotropic conductive film 4019.

Although not illustrated, the liquid crystal display device shown in this embodiment mode includes an alignment film, a polarizing plate, and further, may include a color filter and a blocking film.

FIGS. 16A and 16B illustrate an example in which the signal line driver circuit 4003 is formed separately and mounted on the first substrate 4001, but this embodiment mode is not limited to this structure. The scanning line driver circuit may be formed separately and then mounted, or only a part of the signal line driver circuit or a part of the scanning line driver circuit may be formed separately and then mounted.

This embodiment mode can be carried out in combination with a structure of another embodiment mode as appropriate.

Embodiment Mode 9

Display devices or the like that are obtained according to the present invention can be used for display modules (e.g., active matrix EL modules or active matrix liquid crystal modules). That is to say, the present invention can be carried out in all electronic devices in which these modules are incorporated into display portions.

As such electronic devices, cameras such as video cameras and digital cameras; displays that can be mounted on a person's head (goggle-type displays); car navigation systems; projectors; car stereos; personal computers; portable information terminals (e.g., mobile computers, mobile phones, and electronic books); and the like can be given. Examples of these devices are illustrated in FIGS. 7A to 7D.

Figure 7A:
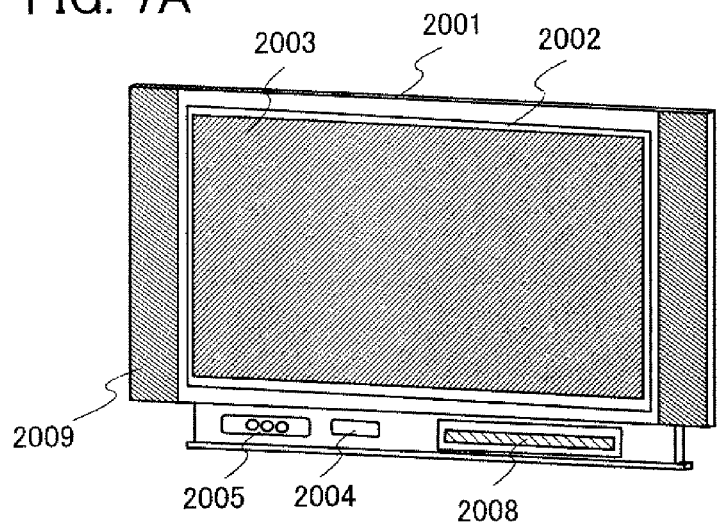
FIGS. 7A to 7D are drawings showing electronic devices to which the present invention is applied.

FIG. 7A illustrates a television device. A television device can be completed by incorporating a display module into a chassis as illustrated in FIG. 7A. A display panel including components up to an FPC is also referred to as a display module. A main screen 2003 is formed with a display module. In addition, a speaker unit 2009, operation switches, and the like are provided as accessory equipment. In this manner, a television device can be completed.

As illustrated in FIG. 7A, a display panel 2002 including display elements is incorporated into a chassis 2001. In addition to reception of general television broadcast by a receiver 2005, communication of information in one direction (from a transmitter to a receiver) or in two directions (between a transmitter and a receiver or between receivers) can be performed by connection to a wired or wireless communication network through a modem 2004. The television device can be operated using switches that are incorporated in the chassis or with a remote control device 2006 that is provided separately, and a display portion 2007 that displays output information may be provided for the remote control device.

Further, in the television device, a sub-screen 2008 may be formed using a second display panel and may be used to display channel number, volume, and the like, in addition to the main screen 2003. In this structure, the main screen 2003 may be formed with a light-emitting display panel which has an excellent viewing angle, and the sub-screen 2008 may be formed with a liquid crystal display panel by which display is possible with low power consumption. Furthermore, in order to give priority to a shift toward lower power consumption, the main screen 2003 may be formed with a liquid crystal display panel, and the sub-screen 2008 may be formed with a light-emitting display panel, and the sub-screen 2008 may be configured to be capable of being turned on and off.

Figure 8:
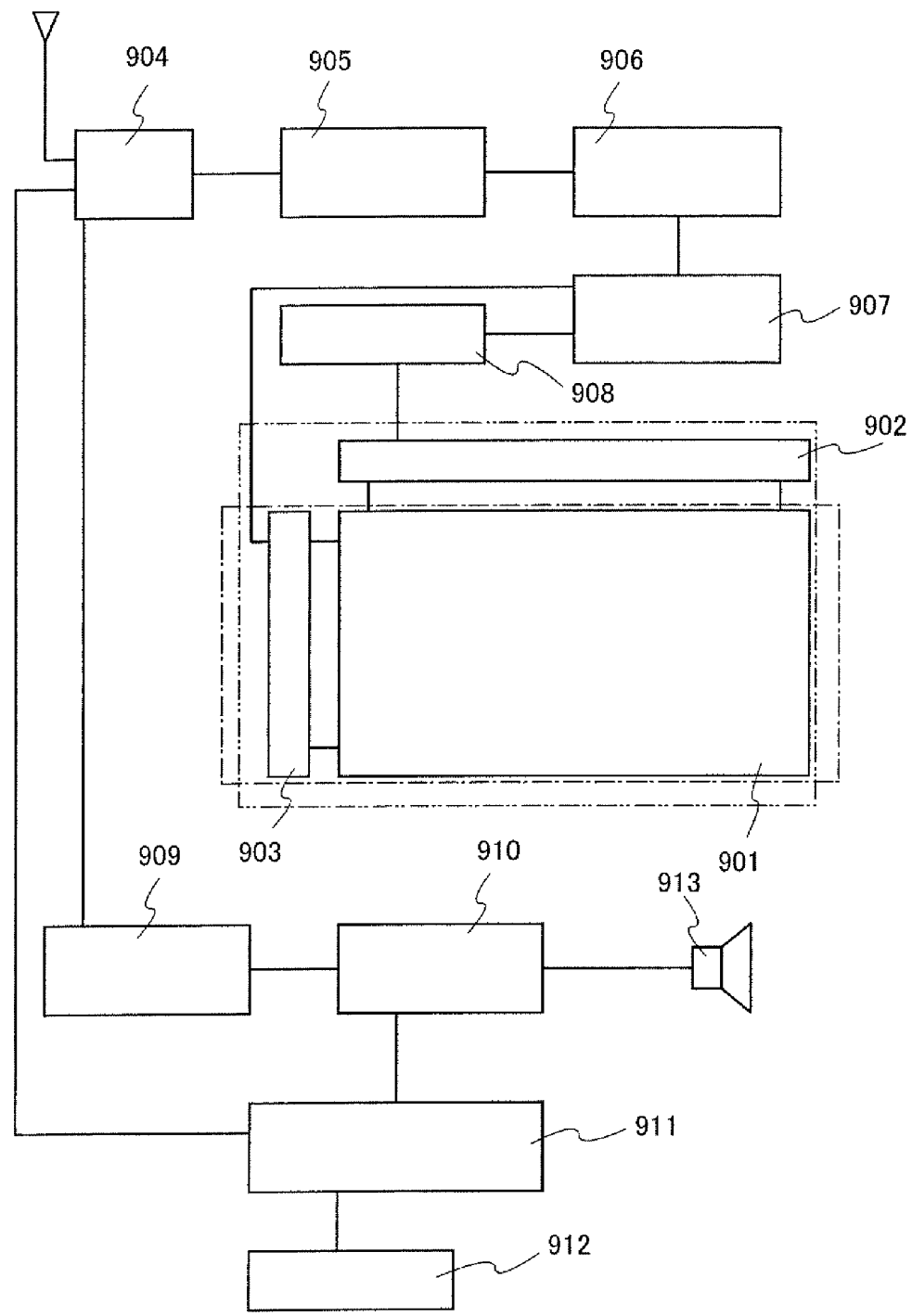
FIG. 8 is a block diagram showing a main structure of an electronic device to which the present invention is applied.

FIG. 8 is a block diagram showing a main structure of the television device. A pixel portion 901 is formed in a display panel. A signal line driver circuit 902 and a scanning line driver circuit 903 may be mounted on the display panel by a COG method.

As other external circuits, a video signal amplifier circuit 905 that amplifies a video signal among signals received by a tuner 904, a video signal process circuit 906 that converts the signals output from the video signal amplifier circuit 905 into color signals corresponding to their respective colors of red, green, and blue, a control circuit 907 that converts the video signal so that the video signal can match input specification of the driver IC, and the like are provided on an input side of the video signal. The control circuit 907 outputs signals to both a scanning line side and a signal line side. In a case of digital driving, a signal divide circuit 908 may be provided on the signal line side and an input digital signal may be divided into m pieces and supplied.

Among signals received by the tuner 904, an audio signal is sent to an audio signal amplifier circuit 909 and is supplied to a speaker 913 through an audio signal process circuit 910. A control circuit 911 receives control information of a receiving station (reception frequency) or sound volume from an input portion 912 and transmits signals to the tuner 904 and the audio signal process circuit 910.

Needless to say, the present invention is not limited to a use for television devices, and can be applied to a variety of applications such as monitors of personal computers, or display media that have a large area, such as information display boards in railway stations, airports, and the like, or street-side advertisement display boards.

Figure 7B:
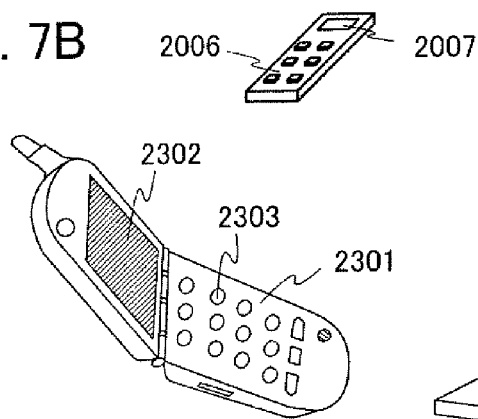

FIG. 7B illustrates one mode of a mobile phone 2301. The mobile phone 2301 includes a display portion 2302, an operation portion 2303, and the like. The display device described in the preceding embodiment modes is applied to the display portion 2302, so that reliability and mass productivity can be improved.

Figure 7C:
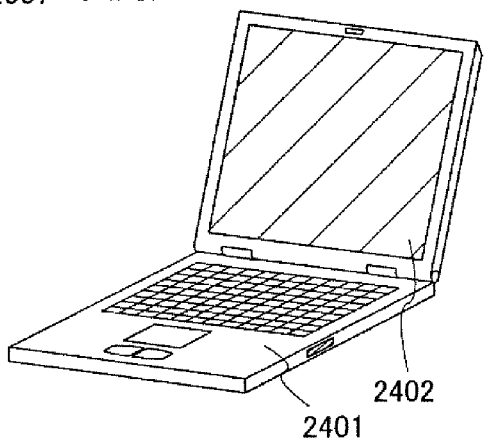

A portable computer illustrated in FIG. 7C includes a main body 2401, a display portion 2402, and the like. The display device described in the preceding embodiment modes is applied to the display portion 2402, so that reliability and mass productivity can be improved.

Figure 7D:
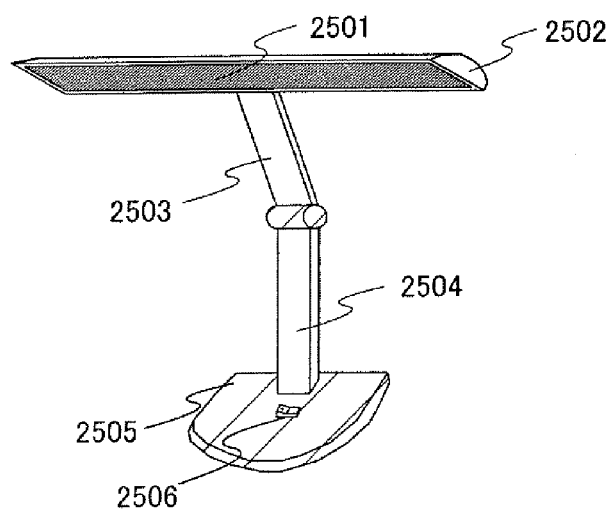

FIG. 7D illustrates a desk lamp including a lighting portion 2501, a lampshade 2502, an adjustable arm 2503, a support 2504, a base 2505, and a power supply 2506. The desk lamp is manufactured with the use of a light-emitting device of the present invention for the lighting portion 2501. The lighting equipment includes a ceiling light, a wall light, and the like in its category. The use of the light-emitting device shown in the preceding embodiment modes can improve reliability and mass productivity.

This application is based on Japanese Patent Application serial No. 2007-232667 filed with Japan Patent Office on Sep. 7, 2007, the entire contents of which are hereby incorporated by reference.

What is claimed is:

1. A method for manufacturing a display device comprising the steps of:
    forming a gate electrode;
    forming a gate insulating film over the gate electrode;
    forming a microcrystalline semiconductor film;
    forming a channel protective layer over and in contact with a channel formation region of the microcrystalline semiconductor film;
    forming a doped semiconductor film over the microcrystalline semiconductor film and over the channel protective layer;
    forming a conductive film over the doped semiconductor film;
    forming a source electrode and a drain electrode, by etching the conductive film;
    forming a source region and a drain region, by etching the doped semiconductor film; and
    forming a doped region by adding an impurity element to the channel formation region through the channel protective layer, using the source electrode and the drain electrode as masks,
    wherein the impurity element imparts either p-type conductivity or n-type conductivity to the microcrystalline semiconductor film.

2. The method for manufacturing a display device according to claim 1,
    wherein the p-type conductivity and the n-type conductivity imparted by the impurity element is an opposite conductivity type of the source region and the drain region.

3. The method for manufacturing a display device according to claim 1, further comprising the steps of:
    forming a pixel electrode electrically connected to any one of the source electrode and the drain electrode; and
    forming an insulating film to cover a part of the pixel electrode.

4. The method for manufacturing a display device according to claim 1, further comprising the steps of:
    forming an insulating film over the source electrode and the drain electrode;
    forming a contact hole in the insulating film; and
    forming a pixel electrode electrically connected to any one of the source electrode and the drain electrode, through the contact hole.

5. The method for manufacturing a display device according to claim 1, further comprising the step of:
    etching the microcrystalline semiconductor film into an island-shape, after the step of forming the channel protective layer, before the step of forming the doped semiconductor film.

6. A method for manufacturing a display device comprising the steps of:
    forming a gate electrode;
    forming a gate insulating film over the gate electrode;
    forming a microcrystalline semiconductor film;
    forming a channel protective layer over and in contact with a channel formation region of the microcrystalline semiconductor film;
    forming a doped semiconductor film over the microcrystalline semiconductor film and over the channel protective layer;
    forming a conductive film over the doped semiconductor film;
    forming a source electrode and a drain electrode, by etching the conductive film;
    forming a source region and a drain region, by etching the doped semiconductor film;
    forming a doped region by adding an impurity element to the channel formation region through the channel protective layer, using the source electrode and the drain electrode as masks; and
    irradiating the doped region with laser light through the channel protective layer, using the source electrode and the drain electrode as masks,
    wherein the impurity element imparts either p-type conductivity or n-type conductivity to the microcrystalline semiconductor film.

7. The method for manufacturing a display device according to claim 6,
wherein the p-type conductivity and the n-type conductivity imparted by the impurity element is an opposite conductivity type of the source region and the drain region.

8. The method for manufacturing a display device according to claim 6, further comprising the steps of:
forming a pixel electrode electrically connected to any one of the source electrode and the drain electrode; and
forming an insulating film to cover a part of the pixel electrode.

9. The method for manufacturing a display device according to claim 6, further comprising the steps of:
forming an insulating film over the source electrode and the drain electrode;
forming a contact hole in the insulating film; and
forming a pixel electrode electrically connected to any one of the source electrode and the drain electrode, through the contact hole.

10. The method for manufacturing a display device according to claim 6, further comprising the step of:
etching the microcrystalline semiconductor film into an island-shape, after the step of forming the channel protective layer, before the step of forming the doped semiconductor film.

11. A method for manufacturing a display device comprising the steps of:
forming a gate electrode;
forming a gate insulating film over the gate electrode;
forming a microcrystalline semiconductor film;
forming a channel protective layer over and in contact with a channel formation region of the microcrystalline semiconductor film;
forming a doped semiconductor film over the microcrystalline semiconductor film and over the channel protective layer;
forming a conductive film over the doped semiconductor film;
forming a source electrode and a drain electrode, by etching the conductive film;
forming a source region and a drain region, by etching the doped semiconductor film;
forming a doped region by adding an impurity element to the channel formation region through the channel protective layer, using the source electrode and the drain electrode as masks,
wherein the impurity element imparts either p-type conductivity or n-type conductivity to the microcrystalline semiconductor film, and
wherein dry etching is used in the step of etching the conductive film and in the step of etching the doped semiconductor film.

12. The method for manufacturing a display device according to claim 11,
wherein the p-type conductivity or the n-type conductivity imparted by the impurity element is an opposite conductivity type of the source region and the drain region.

13. The method for manufacturing a display device according to claim 11, further comprising the steps of:
forming a pixel electrode electrically connected to any one of the source electrode and the drain electrode; and
forming an insulating film to cover a part of the pixel electrode.

14. The method for manufacturing a display device according to claim 11, further comprising the steps of:
forming an insulating film over the source electrode and the drain electrode;
forming a contact hole in the insulating film; and
forming a pixel electrode electrically connected to any one of the source electrode and the drain electrode, through the contact hole.

15. The method for manufacturing a display device according to claim 11, further comprising the step of:
etching the microcrystalline semiconductor film into an island-shape, after the step of forming the channel protective layer, before the step of forming the doped semiconductor film.

* * * * *

UNITED STATES PATENT AND TRADEMARK OFFICE
CERTIFICATE OF CORRECTION

PATENT NO. : 8,420,462 B2
APPLICATION NO. : 12/842067
DATED : April 16, 2013
INVENTOR(S) : Satoshi Kobayashi et al.

It is certified that error appears in the above-identified patent and that said Letters Patent is hereby corrected as shown below:

In the Specification:

Column 1, line 11, "fanning" should read "forming"

Column 1, line 46, "fanning" should read "forming"

Column 5, line 63, "7k." should read "71c."

Column 6, line 8, "TH may" should read "TFT may"

Column 8, line 26, "(TFT)" should read "(TFTs)"

Column 9, line 67, "fanned" should read "formed"

Column 13, line 3, "fanned" should read "formed"

Column 15, line 15, "O/square" should read "Ω/square"

Column 15, line 19, "0.1 O·cm." should read "0.1 Ω·cm."

Column 20, line 48, "linear four" should read "linear form"

Column 23, line 63, "1000 seem" should read "1000 sccm"

Column 26, line 34, "fat ed" should read "formed"

Column 28, line 67, "driving 11.1 7001" should read "driving TFT 7001"

Column 30, line 55, "In the Ms" should read "In the TFTs"

Column 32, line 18, "TFTs is" should read "TFTs"

Signed and Sealed this
Sixteenth Day of July, 2013

Teresa Stanek Rea
*Acting Director of the United States Patent and Trademark Office*